United States Patent
Oda

(10) Patent No.: US 8,816,380 B2
(45) Date of Patent: *Aug. 26, 2014

(54) LIGHT EMITTING DEVICE, DISPLAY APPARATUS, AND ELECTRONIC APPARATUS

(71) Applicant: Seiko Epson Corporation, Tokyo (JP)

(72) Inventor: Toshihiro Oda, Fujimi-machi (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/032,962

(22) Filed: Sep. 20, 2013

(65) Prior Publication Data

US 2014/0021455 A1 Jan. 23, 2014

Related U.S. Application Data

(62) Division of application No. 13/300,014, filed on Nov. 18, 2011, now Pat. No. 8,598,610.

(30) Foreign Application Priority Data

Dec. 9, 2010 (JP) ................................ 2010-274314

(51) Int. Cl.
*H01L 33/00* (2010.01)
(52) U.S. Cl.
USPC ................................ 257/98; 257/40; 257/88
(58) Field of Classification Search
USPC ................................................. 257/98, 40, 88
See application file for complete search history.

(56) References Cited

U.S. PATENT DOCUMENTS

| 7,829,205 | B2 | 11/2010 | Lee et al. |
| 7,952,273 | B2 | 5/2011 | Do et al. |
| 8,598,610 | B2 * | 12/2013 | Oda ................................ 257/98 |
| 2009/0140645 | A1 | 6/2009 | Lin et al. |
| 2009/0160319 | A1 | 6/2009 | Song et al. |

FOREIGN PATENT DOCUMENTS

| JP | A-2006-191040 | 7/2006 |
| JP | A-2008-147630 | 6/2008 |
| JP | A-2009-152178 | 7/2009 |

OTHER PUBLICATIONS

Jul. 24, 2013 Notice of Allowance issued in U.S. Appl. No. 13/300,014.
Apr. 23, 2013 Notice of Allowance issued in U.S. Appl. No. 13/300,014.
Miyaguchi et al., "A study on degradation of OLEDs high temperature storage," Pioneer R&D, 2007, pp. 8-12, vol. 17—No. 2 (with translation).

* cited by examiner

*Primary Examiner* — Tan N Tran
(74) *Attorney, Agent, or Firm* — Oliff PLC

(57) ABSTRACT

In a display panel, a first electron injection layer is formed between an anode and a light-emitting functional layer, and a hole injection layer is formed between the anode and the first electron injection layer. In other words, the hole injection layer, the first electron injection layer, and the light-emitting functional layer are configured to be laminated on the anode in this order. An electron injection material used for the first electron injection layer is diffused into the hole injection layer, and the diffused electron injection material inhibits or promotes hole transportation of the hole injection layer, so that the amount of holes transported to a light-emitting functional layer is adjusted. As a result, the carrier balance is improved.

14 Claims, 14 Drawing Sheets

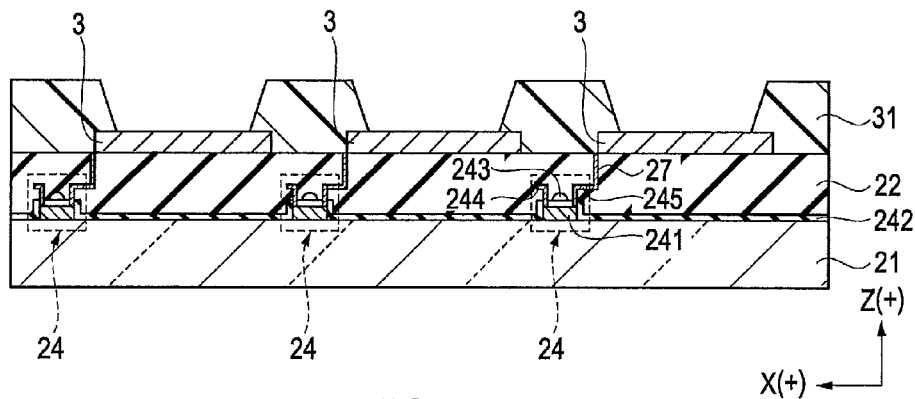
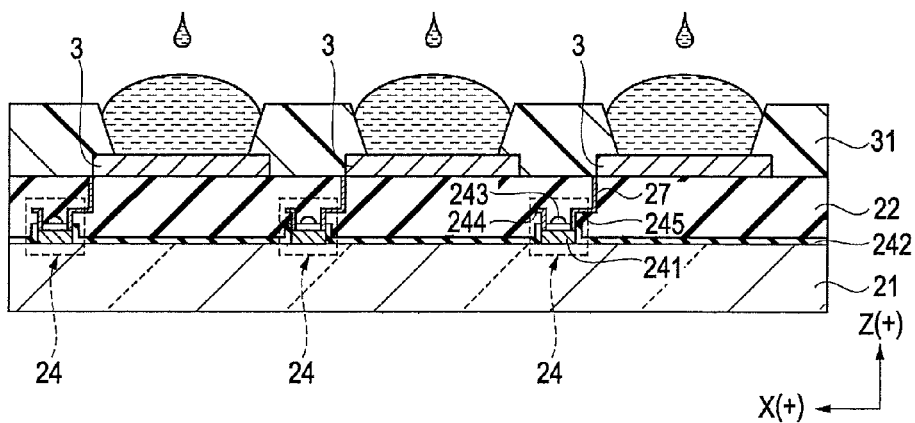
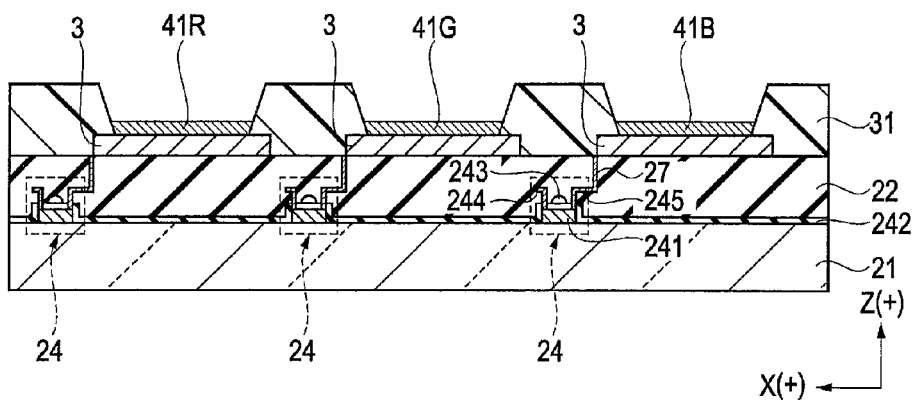

EXAMPLE 1

EXAMPLES 2 AND 3

COMPARATIVE EXAMPLE 21

COMPARATIVE EXAMPLE 22

COMPARATIVE EXAMPLE 23

COMPARATIVE EXAMPLES 24R AND 27R

COMPARATIVE EXAMPLES 24G AND 27G

COMPARATIVE EXAMPLES 24B AND 27B

COMPARATIVE EXAMPLE 25B

COMPARATIVE EXAMPLE 26B

LIGHT EMITTING DEVICE, DISPLAY APPARATUS, AND ELECTRONIC APPARATUS

This is a Divisional of application Ser. No. 13/300,014 filed Nov. 18, 2011. The prior application, including the specification, drawings and abstract are incorporated herein by reference in their entirety.

BACKGROUND

1. Technical Field

The present invention relates to a light-emitting device, a display apparatus, and an electronic apparatus.

2. Related Art

In an organic electric field light-emitting device (so-called organic EL device) as a light-emitting device, in order to improve a light-emitting efficiency (current efficiency or external quantum efficiency), it is important that holes from an anode side and electrons from a cathode side are injected with good balance into a light-emitting layer disposed between an anode and a cathode.

Therefore, disclosed is an organic EL device where an anode formed on a substrate, a first organic thin film layer formed on the anode, an organic light-emitting layer formed on the first organic thin film layer, a second organic thin film layer formed on the organic light-emitting layer, a cathode formed on the second organic thin film layer are included, each of the first organic thin film layer and the second organic thin film layer is configured as a single layer or multi-layers, and an insulating material is doped or laminated on at least a portion of the first organic thin film layer and the second organic thin film layer (for example, refer to JP-A-2008-147630).

In addition, disclosed in an organic light-emitting device where a hole injection layer, which contains a first compound including an element selected from a group consisting of Mo, Li, Na, K, Rb, Cs, Be, Mg, Ca, Sr, Ba, and B and an element selected from a group consisting of O, F, S, Cl, Se, Br, and I and a hole injection material which is a hole injection layer formation organic compound, is disposed between a light-emitting layer and an anode (for example, refer to JP-A-2009-152178).

However, for example, among the elements listed above, Li, Cs, or the like is easily diffused into an organic layer (for example, refer to PIONEER Corporation Technology Information Magazine "PIONEER R&D", Vol. 17, No. 2, 2007, pp. 8-12). According to a material which is doped, inserted, or laminated in the organic layer between the light-emitting layer and the anode, the material is diffused into the organic layer and finally approaches the light-emitting layer, so that there is a problem in that the light emission of the light-emitting layer is prevented. In other words, in the light-emitting device of the related art, there is a problem in that it is difficult to obtain a desired light-emitting efficiency.

In addition, since disturbance of the carrier balance causes deterioration in an organic functional layer including a light-emitting layer, there is a problem in that the light-emitting life time is shortened. In other words, in the light-emitting device of the related art, there is a problem in that it is difficult to secure a desired life time.

SUMMARY

An advantage of some aspects of the invention is to solve at least some of the aforementioned problems. The advantage may be obtained by the following forms or application examples.

Application Example 1

According to an application example, there is provided a light-emitting device including: an anode, a cathode, a light-emitting layer disposed between the anode and the cathode, an electron injection layer disposed between the anode and the light-emitting layer, and a hole injection layer disposed between the anode and the electron injection layer.

According to the application example, the electron injection material used for the electron injection layer is diffused into the hole injection layer, the diffused electron injection material inhibits or promotes hole transportation of the hole injection layer, so that the amount of holes transported to the light-emitting layer is adjusted. As a result, the carrier balance is improved.

Therefore, in comparison with a light-emitting device of the related art where the carrier balance is broken due to the influence of a material added to an organic layer between the light-emitting layer and the anode so that light emission is prevented, it is possible to improve the light-emitting efficiency. Therefore, it is possible to provide a light-emitting device capable of obtaining a desired light-emitting efficiency.

In addition, in order to make the carrier balance good, it is possible to suppress deterioration of an organic functional layer including a light-emitting layer. Therefore, it is possible to provide a light-emitting device capable of obtaining a desired life time.

Application Example 2

In the light-emitting device disclosed in the application example, it is preferable that the electron injection layer be made of an alkali metal, an alkaline earth metal, or a compound thereof.

According to the application example, the electron injection material made of an alkali metal, an alkaline earth metal, or a compound thereof is easily diffused into the hole injection layer, so that the electron injection material may effectively prevent the transportation of holes into the hole injection layer.

Application Example 3

In the light-emitting device disclosed in the application example, the hole transporting layer may be disposed between the electron injection layer and the light-emitting layer.

According to the application example, since the hole transporting layer is disposed between the electron injection layer and the light-emitting layer, it is possible to prevent the electron injection layer from being in direct contact with the light-emitting layer. Therefore, it is possible to suppress deterioration in the light-emitting efficiency caused by the diffusion of the electron injection material used for the electron injection layer into the light-emitting layer.

Application Example 4

In the light-emitting device disclosed in the application example, the electron injection layer and the hole injection layer may be in direct contact with each other.

According to the application example, the electron injection layer and the hole injection layer are in direct contact with each other, so that the electron injection material used for the electron injection layer is more easily diffused into the hole injection layer. As a result, the electron injection material used for the electron injection layer is not easily diffused into the light-emitting layer, so that it is possible to prevent deterioration in the light-emitting efficiency caused by the diffusion of the electron injection material used for the electron injection layer into the light-emitting layer.

Application Example 5

In the light-emitting device disclosed in the application example, it is preferable that the hole injection layer have ion conductivity.

According to the application example, since the hole injection layer has ion conductivity, the electron injection material used for the electron injection layer is more easily diffused into the hole injection layer. As a result, since the electron injection material used for the electron injection layer may not be easily diffused into the light-emitting layer, it is possible to prevent deterioration in the light-emitting efficiency caused by the diffusion of the electron injection material used for the electron injection layer into the light-emitting layer.

Application Example 6

In the light-emitting device disclosed in the application example, it is preferable that the hole injection layer be formed by using a liquid phase process.

According to the application example, the display apparatus including the light-emitting device having the hole injection layer formed through a liquid phase process may be easily manufactured to have a large size.

Application Example 7

According to another application example, there is provided a display apparatus including the light-emitting device according to the aforementioned application example.

Accordingly, it is possible to obtain a highly reliable display apparatus.

Application Example 8

According to another application example, there is provided an electronic apparatus including the display apparatus according to the aforementioned application example.

Accordingly, it is possible to obtain a highly reliable electronic apparatus.

BRIEF DESCRIPTION OF THE DRAWINGS

The invention will be described with reference to the accompanying drawings, wherein like numbers reference like elements.

FIGS. 6A to 6C are diagrams illustrating an aspect of manufacturing processes.

DESCRIPTION OF EXEMPLARY EMBODIMENTS

Figure 1:
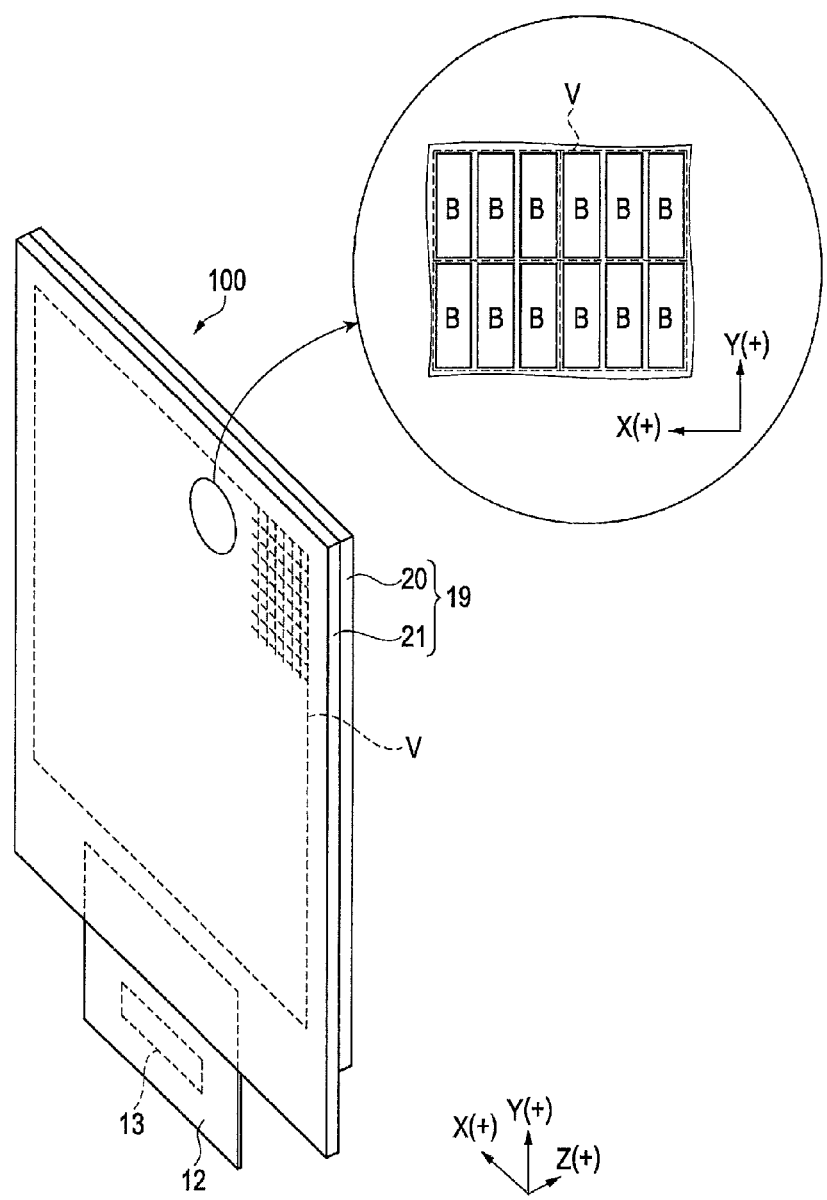
FIG. 1 is a perspective diagram illustrating a display apparatus according to a first embodiment.

Hereinafter, light-emitting devices, display apparatuses, and electronic apparatuses according to embodiments of the invention will be described with reference to the attached drawings. In addition, in order for layers or members to be illustrated with recognizable sizes in the drawings described hereinafter, the scales of the layer or members are different from the actual scales thereof.

In addition, in embodiments, Examples, and Comparative Examples, a light-emitting efficiency denotes a current efficiency or an external quantum efficiency.

First Embodiment

Overview of Display Apparatus

FIG. 1 is a perspective diagram illustrating an aspect of a display apparatus according to an embodiment.

First, overview of a display apparatus as the display apparatus according to the first embodiment of the invention is described.

The display apparatus 100 is an organic EL display apparatus and includes a display panel 19, a flexible board 12, and the like. The display panel 19 is a bottom emission type organic EL display panel where a functional layer including a light-emitting layer is interposed between a substrate 21 and a sealing substrate 20 and emits display light from the substrate 21 side.

The display panel 19 has a display area V where a plurality of pixels are disposed in a matrix shape. As enlarged and illustrated in the upper right portion of FIG. 1, in the display area V, blue (B) pixels are arranged, so that a blue monochromic image is displayed by display light emitted from the pixels. In addition, each of the pixels is a light-emitting pixel, which is referred to as a pixel.

The display area V has an elongated rectangular shape. In each of the figures including FIG. 1, the vertical direction is defined as the Y axis direction; and the horizontal direction of which the length is shorter than that of the vertical direction is defined as the X axis direction. In addition, the thickness direction of the display panel 19 is defined as the Z axis direction.

In the display panel 19, the flexible board 12 is connected to a projected area where the substrate 21 is projected from the sealing substrate 20. Flexible board is an abbreviation for a flexible printed circuit board having flexibility where iron foil wire lines and the like are formed on a base of, for example, a polyimide film.

In addition, a driving IC (Integrated Circuit) 13 is mounted on the flexible board 12, and in the end portion thereof, a plurality of terminals for connecting a dedicated controller or an external apparatus (not shown) are formed.

The display panel 19 is supplied with power or control signals including an image signal from the external apparatus through the flexible board 12, so that an image, a character, or the like is displayed on the display area V. In addition, the display panel 19 also functions as a blue surface illumination apparatus.

Pixel Circuit

Figure 2:
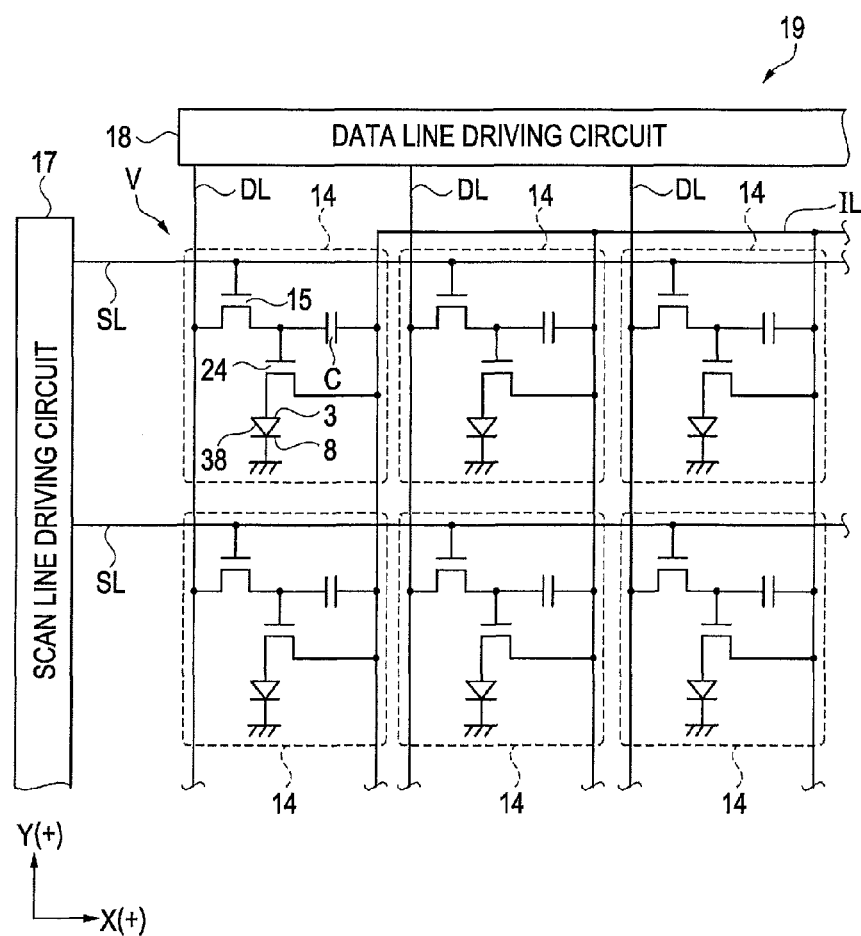
FIG. 2 is a diagram illustrating an aspect of a pixel circuit.

FIG. 2 is a diagram illustrating an aspect of a pixel circuit.

Herein, overview of the pixel circuit of the pixel of the display panel 19 and the scan driving of a plurality of the pixels will be described with reference to FIG. 2.

The pixel circuit 14 illustrated in FIG. 2 is formed in each of the pixels which are arranged in a matrix shape on the display area V in FIG. 1.

The pixel circuit 14 is configured to include a selection transistor (Thin Film Transistor) 15 for selecting a pixel, a driving transistor 24 for flowing current to a functional layer 38 constructed in a lamination structure including a light-emitting layer, and a storage capacitor C, and the like.

A scan line SL from a scan line driving circuit 17 is connected to the gate terminal of the selection transistor 15, and a data line DL from a data line driving circuit 18 is connected to the source terminal thereof.

In addition, the scan line driving circuit 17 and the data line driving circuit 18 are formed in the peripheral portion (frame area) of the display area V in FIG. 1. In addition, the scan line driving circuit 17 and the data line driving circuit 18 may also be formed within the driving IC 13.

Returning to FIG. 2, description is made.

The gate terminal of the driving transistor 24 and the one end of the storage capacitor C are connected to the drain terminal of the selection transistor 15.

The source terminal the driving transistor 24 and the other end of the storage capacitor C are connected to an interconnection line IL through which a driving current is supplied from a driving current output circuit (not shown). In addition, the drain terminal of the driving transistor 24 is connected to the anode 3.

A functional layer 38 is disposed between the anode 3 and the cathode 8. In addition, the cathode 8 is connected to a ground line.

The scan line driving circuit 17 is configured to include a shift register or an output buffer (not shown) to sequentially supply scan signals to a plurality of scan lines SL based on a timing signal from the driving IC 13.

The data line driving circuit 18 is configured to include a shift register or a latch circuit (not shown) to supply data signals to a plurality of data lines DL based on the timing signal from the driving IC 13 and the data signals.

The selection transistor 15 selected by the scan signal is turned on, so that the data signal is supplied to the driving transistor 24. Accordingly, the driving transistor 24 is turned on, so that the driving current is flowed into the functional layer 38 and light emits. In addition, while the driving transistor 24 is turned, the data signal is retained in the storage capacitor C, so that light emission is sustained for the time (time length corresponding to one frame) according to the capacitance.

In addition, the invention is not limited to the pixel circuit illustrated in FIG. 2. A pixel circuit capable of lighting and driving the functional layer 38 by using a driving current, which has a different circuit configuration, may be used.

Overview of Cross-Sectional Structure

Figure 3:
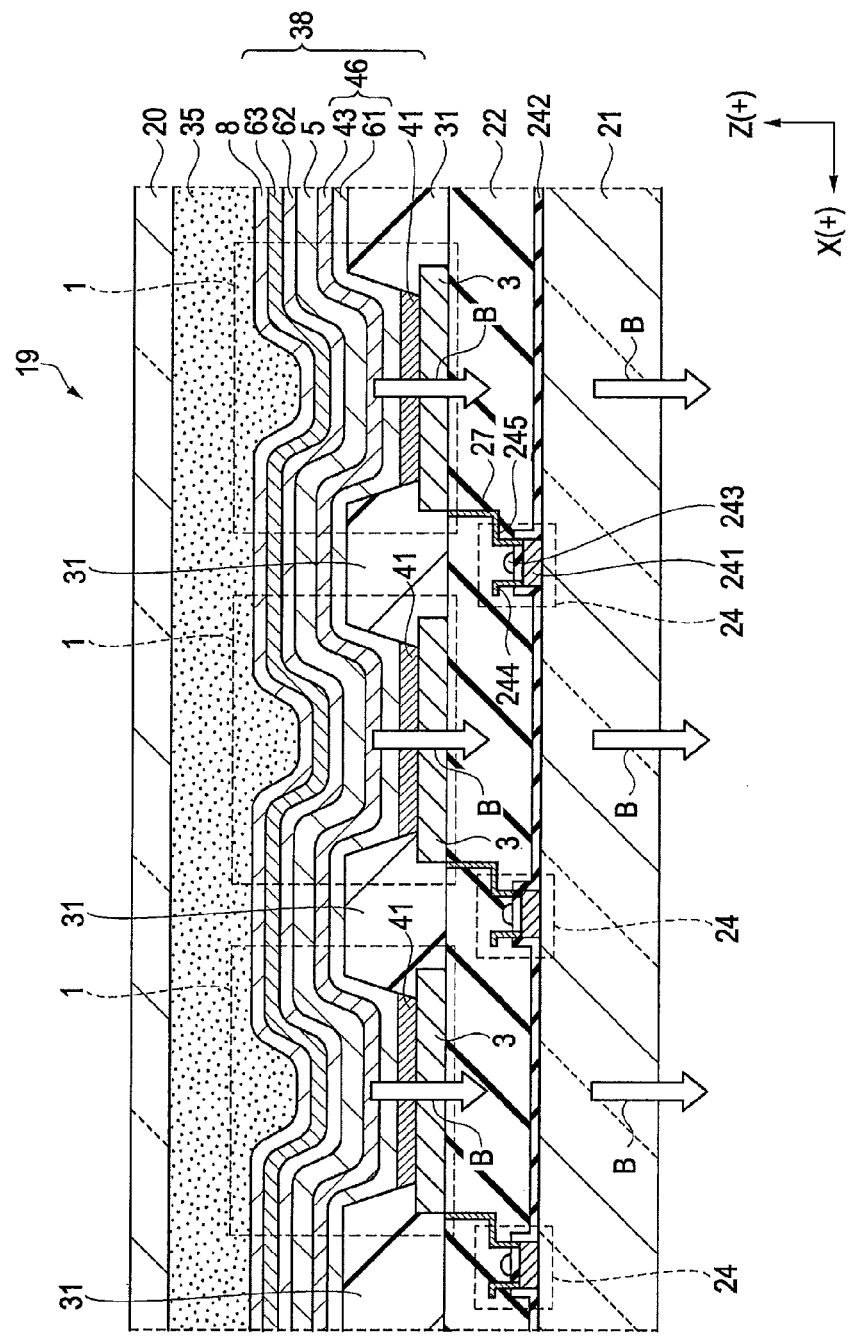
FIG. 3 is a side cross-sectional diagram illustrating a display panel.

FIG. 3 is a side cross-sectional diagram taken along line of FIG. 1 and illustrates an overview of a cross-sectional configuration of the display panel (pixel).

As illustrated in FIG. 3, the display panel 19 is configured by sequentially laminating a planarization layer 22, a plurality of light-emitting devices 1, an epoxy layer 35, and a sealing substrate 20 on the substrate 21.

A plurality of the driving transistors 24 are disposed on the substrate 21, and a planarization layer 22 made of an insulating material is formed so as to cover the driving transistors 24.

Each of the driving transistors 24 includes a semiconductor layer 241 made of a semiconductor material such as silicon, a gate insulating layer 242 formed on the semiconductor layer 241, a gate electrode 243 formed on the gate insulating layer 242, a source electrode 244, and a drain electrode 245.

In addition, the light-emitting devices 1 corresponding to the driving transistors 24 are installed on the planarization layer 22.

Each of the light-emitting devices 1 is constructed in a lamination structure including the anode 3, the functional layer 38, and the cathode 8 formed on the planarization layer 22. In addition, the functional layer 38 is constructed in a lamination structure including a hole injection layer 41, a first electron injection layer 61, a hole transporting layer 43, a light-emitting functional layer 5 as a light-emitting layer, an electron transporting layer 62, and a second electron injection layer 63.

In other words, the light-emitting device 1 is constructed in a lamination structure including the anode 3, the hole injection layer 41, the first electron injection layer 61, the hole transporting layer 43, the light-emitting functional layer 5, the electron transporting layer 62, and the second electron injection layer 63.

In addition, the lamination structure including the first electron injection layer 61 and the hole transporting layer 43 is also referred to as a carrier selection layer 46.

Partition walls 31 are disposed between the adjacent light-emitting devices 1 having the configuration, so that the light-emitting devices 1 are individually installed.

In the embodiment, in each of the light-emitting devices 1, the anode 3 and the hole injection layer 41 are separately installed through the partition of the partition walls 31; and the first electron injection layer 61, the hole transporting layer 43, the blue light-emitting functional layer 5B, the electron transporting layer 62, the second electron injection layer 63, and the cathode 8 are integrally installed. According to the configuration, the anodes 3 of the light-emitting devices 1 constitute pixel electrodes (individual electrodes), and the cathodes 8 of the light-emitting devices 1 constitute a common electrode. In addition, the anode 3 of each light-emitting device 1 is electrically connected through a conductive portion (interconnection line) 27 to the drain electrode 24S of each driving transistor 24.

In this manner, in the display panel 19 including the light-emitting devices 1, by controlling luminance of the light-emitting devices 1 by using the driving transistors 24, that is, by controlling voltages applied to the light-emitting devices 1, mono-color display of the display panel 19 may be performed.

The light-emitting device according to the invention is applied to the light-emitting device 1 having the configuration, and details of the light-emitting device 1 will be described later.

In addition, in the embodiment, the epoxy layer 35 made of an epoxy resin is formed on the light-emitting devices 1 so as to cover the light-emitting devices 1.

In addition, the sealing substrate 20 is disposed on the epoxy layer 35 so as to cover the epoxy layer 35. Accordingly, hermeticity of the light-emitting device 1 is secured, so that it is possible to prevent oxygen or moisture from infiltrating. Therefore, it is possible to improve reliability of the light-emitting device 1.

In the display apparatus 100 described hereinbefore, monochromatic blue display may be performed by allowing the light-emitting devices 1 to simultaneously emit light.

Details of Light-Emitting Device

As described above, the light-emitting device 1 is configured by allowing a laminated structure, where the hole injection layer 41, the first electron injection layer 61, the hole transporting layer 43, the light-emitting functional layer 5, the electron transporting layer 62, and the second electron injection layer 63 are laminated in this order from the anode 3 side, to be interposed between the anode 3 and the cathode 8.

In the light-emitting device 1, electrons from the cathode 8 side are supplied (injected) to the light-emitting functional layer 5, and at the same time, holes from the anode 3 side are supplied (injected) to the light-emitting functional layer 5. Next, in the light-emitting functional layer 5, the holes and the electrons are recombined, and excitons are generated through the recombination. When the excitons return to the ground state, energy is fluoresced as light emission, so that the light-emitting functional layer 5 emits light.

In addition, in the embodiment, since all the light-emitting functional layers 5 are blue light-emitting functional layers, the light-emitting devices 1 of the pixels emit blue light.

Hereinafter, components constituting the light-emitting device 1 are sequentially described.

Anode 3

The anode 3 is an electrode which injects the holes into the hole injection layer 41.

Although the constituent material of the anode 3 is not particularly limited, a material having a large work function and an excellent conductivity is very appropriately used.

The constituent material of the anode 3 may include, for example, metal oxides such as ITO (Indium Tin Oxide), IZO (Indium Zinc Oxide), $In_2O_3$, $SnO_2$, fluoride-added $SnO_2$, Sb-added $SnO_2$, ZnO, Al-added ZnO, and Ga-added ZnO, Au, Pt, Ag, Cu, alloys thereof, and the like. One thereof or a combination of two or more may be used.

Although the average thickness of the anode 3 is not particularly limited, the average thickness is preferably equal to or larger than about 10 nm and equal to or smaller than about 200 nm, more preferably equal to or larger than about 30 nm and equal to or smaller than about 150 nm.

In addition, in the case where the display panel 19 is configured as a bottom emission structure display panel, since the anode 3R necessarily has optical transparency, among the aforementioned constituent materials, a metal oxide having optical transparency is very appropriately used.

Hole Injection Layer 41

The hole injection layer 41 has a function of facilitating hole injection from the anode 3.

Although the constituent material (hole injection material) of the hole injection layer 41 is not particularly limited, an ion conductive hole injection material which is obtained by adding electron-accepting dopants to a conductive high-molecular-weight material (or a conductive oligomer material is very appropriately used so that the hole injection layer 41 may be formed by using a liquid phase process in the hole injection layer 41 formation process described later.

The ion conductive hole injection material may include, for example, a polythiophene-based hole injection material such as poly (3,4-ethylene dioxythiophene)-poly (styrene sulfonate) (PEDOT/PSS), a polyaniline-based hole injection material such as polyaniline-poly (styrene sulfonate) (PANI/PSS), and an oligo-aniline-based hole injection material which is formed as a salt of an oligo-aniline derivative expressed by the following general formula (1) and electron-accepting dopants expressed by the following general formula (4).

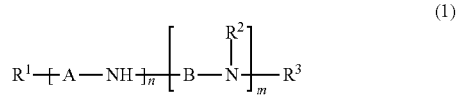

(1)

[In the chemical formula, $R^1$, $R^2$, and $R^3$ independently represent unsubstituted or substituted monovalent hydrocarbon radicals or organo-oxy radicals; A and B independently represent bivalent radicals expressed by the following general formula (2) or (3); $R^4$ to $R^{11}$ independently represent a hydrogen atom, a hydroxyl radical, unsubstituted or substituted monovalent hydrocarbon radicals or organo-oxy radicals, an acyl radical, or a sulfonic acid radical; and m and n independently represent integers of one or more, which stratify $m+n \leq 20$.]

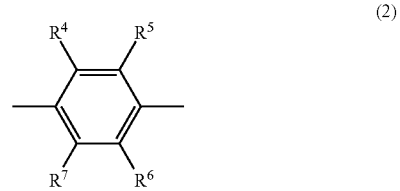

(2)

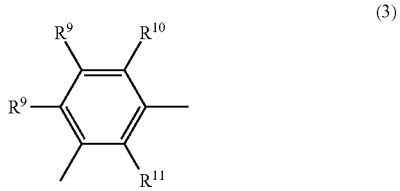

(3)

(4)

[In the chemical formula, D represents a benzene ring, a naphthalene ring, an anthracene ring, a phenanthrene ring, or a heterocyclic ring; and $R^{12}$ and $R^{13}$ independently represent a carboxyl radical or a hydroxyl radical.]

Although the average thickness of the hole injection layer is not particularly limited, the average thickness is preferably equal to or larger than about 5 nm and equal to or smaller than about 150 nm, more preferably equal to or larger than about 10 nm and equal to or smaller than about 100 nm.

First Electron Injection Layer 61

In the first electron injection layer 61, the electron injection material used for the electron injection layer is diffused into the hole injection layer, and the diffused electron injection material inhibits or promotes hole transportation of the hole injection layer. Accordingly, the amount of holes transported to the light-emitting functional layer 5 is adjusted. As a result, the carrier balance is improved, so that the light-emitting efficiency is improved. In other words, the first electron injection layer 61 has a function of adjusting the hole transporting amount of the hole injection layer 41.

The constituent material of the first electron injection layer 61 may include, for example, an electron injection material such as an alkali metal, an alkaline earth metal, a rare earth metal, an alkali metal salt (an oxide, a fluoride, a chloride, or the like), an alkaline earth metal salt (an oxide, a fluoride, a chloride, or the like), a rare earth metal salt (an oxide, a fluoride, a chloride, or the like), and a metal complex. One thereof or a combination of two or more may be used.

The first electron injection layer 61 is configured by using the electron injection material as a main constituent, so that it is possible to adjust the amount of holes transported to the light-emitting functional layer 5.

The alkali metal may include, for example, Li, Na, K, Rb, and Cs. In addition, the alkaline earth metal may include, for example, Mg, Ca, Sr, and Ba. In addition, the rare earth metal may include, for example, Nd, Sm, Y, Tb, and Eu.

The alkali metal salt may include, for example, LiF, $Li_2CO_3$, LiCl, NaF, $Na_2CO_3$, NaCl, CsF, $Cs_2CO_3$, and CsCl. In addition, the alkaline earth metal salt may include, for example, $CaF_2$, $CaCO_3$, $SrF_2$, $SrCO_3$, $BaF_2$, and $BaCO_3$. In addition, the rare earth metal salt may include, for example, $SmF_3$, and $ErF_3$.

The metal complex may include, for example, an organic metal complex using 8-quinolinol such as 8-quinolinolato lithium (Liq) or tris(8-quinolinolato) aluminum (Alq3) or a derivative thereof as a ligand.

In addition, the first electron injection layer 61 formation process may be performed by using a gas phase process such as a vacuum deposition method (vapor deposition method) or a sputtering method or by using a liquid phase process such as an ink jet method or a slit coating method.

In addition, the first electron injection layer 61 may be formed in a configuration where two or more types of electron injection layers are laminated. Accordingly, the amount of holes transported to the light-emitting functional layer 5 is accurately adjusted.

Although the average thickness of the first electron injection layer 61 is not particularly limited, the average thickness is preferably equal to or larger than about 0.01 nm and equal to or smaller than about 10 nm, more preferably equal to or larger than about 0.1 nm and equal to or smaller than about 5 nm. The average thickness of the first electron injection layer 61 is set to be in this range, so that the amount of holes transported to the light-emitting functional layer 5 is accurately adjusted.

Hole Transporting Layer 43

The hole transporting layer 43 has a function of transporting the holes, which are injected from the anode 3 side interface of the hole transporting layer 43, to the light-emitting functional layer 5. In addition, the hole transporting layer 43 has a function of blocking the electrons flowed from the light-emitting functional layer 5 to the hole transporting layer 43. Therefore, the electrons are retained in the light-emitting functional layer 5, so that it is possible to further increase the light-emitting efficiency. In addition, the hole transporting layer 43 has a function of preventing the first electron injection layer 61 from being in direct contact with the light-emitting functional layer 5 or reducing the diffusion of the electron injection material, which is used for the first electron injection layer 61, into the light-emitting functional layer 5.

Although the constituent material of the hole transporting layer 43 is not particularly limited, the constituent material may include, for example, an amine-based compound such as N,N'-diphenyl-N,N'-di(m-tolyl)-benzidine (TPD), bis[N-(1-naphthyl)-N-phenyl]benzidine (α-NPD) expressed by the following formula (5), and a benzidine derivative such as a compound expressed by the following formula (6) so that the hole transporting layer 43 may be formed by using a gas phase process such as a vacuum deposition method in the hole transporting layer 43 formation process described later. One thereof or a combination of two or more may be used.

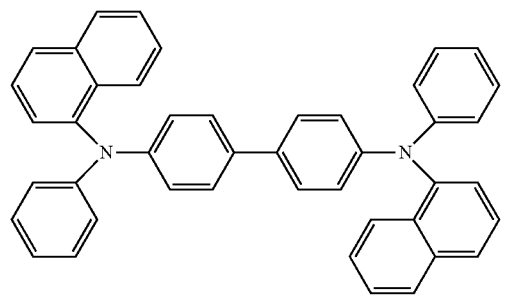

(5)

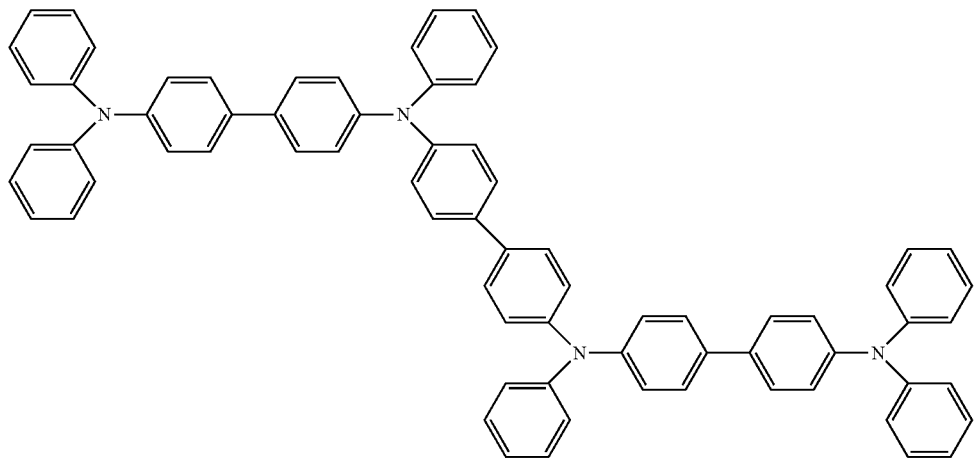

(6)

Although the average thickness of the hole transporting layer 43 is not particularly limited, the average thickness is preferably equal to or larger than about 1 nm and equal to or smaller than about 50 nm, more preferably equal to or larger than about 5 nm and equal to or smaller than about 30 nm. The average thickness of the hole transporting layer 43 is set to be in this range, so that the holes injected from the hole injection layer 41 through the first electron injection layer 61 may be accurately transported to the light-emitting functional layer 5.

Light Emitting Functional Layer 5

The light-emitting functional layer 5 is configured to include a light-emitting material which emits predetermined color light. In the embodiment, since the light-emitting functional layer 5 is set as the blue light-emitting functional layer, the light-emitting functional layer 5 emits blue light.

In the light-emitting functional layer 5, the holes from the anode 3 side are supplied (injected), and at the same time, the electrons from the cathode 8 side are supplied (injected). In the light-emitting functional layer 5, the holes and the electrons are recombined, and the excitons are generated through the recombination. When the excitons return to the ground state in a blue light-emitting material included in the light-emitting functional layer 5, energy is emitted as blue light.

Although the blue light-emitting material is not particularly limited, a material which may be formed by using a gas phase process in the light-emitting functional layer 5 formation process is very appropriately used. More specifically, the blue light-emitting material may include a styryl derivative such as a compound expressed by the following formula (7).

In addition to the above material, the blue light-emitting material may include a material containing an anthracene derivative as a host material and a styryl derivative as a guest material in the host material.

The host material has a function of generating the excitons by recombining the holes and the electrons and exciting the blue light-emitting material by transferring the energy of the excitons to the blue light-emitting material (Forster transfer or Dexter transfer). In the case of using the host material, for example, a guest material may be used as dopants to be doped into the host material.

In this case, the anthracene derivative may include compounds expressed by the following formulas (8), (9), and (10), and the styryl derivative may include compounds expressed by the following formulas (11), (12), and (13). One thereof or a combination of two or more may be used.

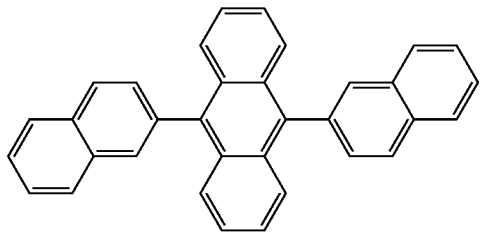

(8)

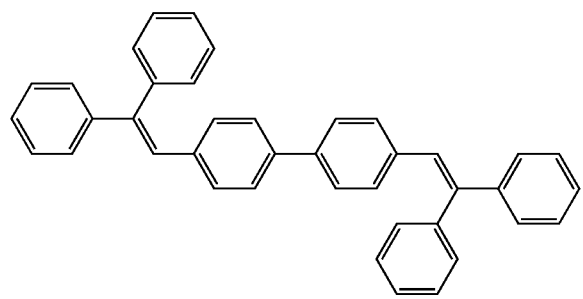

(7)

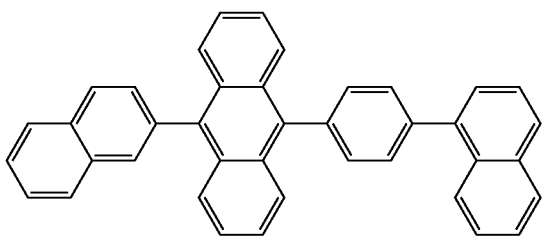

(9)

-continued

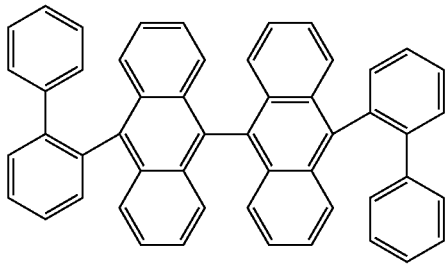
(10)

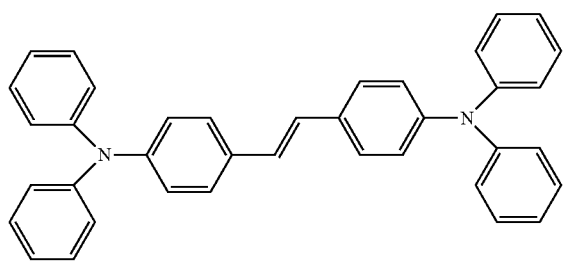
(11)

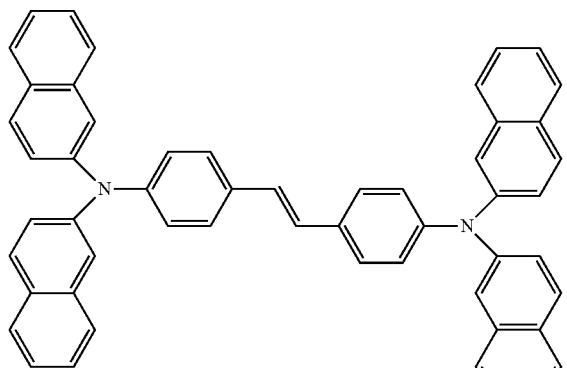
(12)

(13)

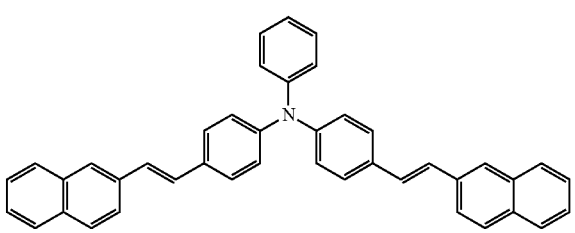

In addition, the light-emitting device 1 including the light-emitting functional layer 5 formed through a gas phase process has a light-emitting life time characteristic which is sufficient to a practical level.

In addition, in the case of using the guest material and the host material, the containing amount (doping amount) of the guest material in the light-emitting functional layer 5 is preferably equal to or larger than about 0.1% by weight ratio to the host material and equal to or smaller than about 20%, more preferably equal to or larger than about 0.5% and equal to or smaller than about 10%. The containing amount of the guest material is set to be in this range, so that it is possible to optimize the light-emitting efficiency.

Although the average thickness of the light-emitting functional layer 5 is not particularly limited, the average thickness is preferably equal to or larger than about 5 nm and equal to or smaller than about 100 nm, more preferably equal to or larger than about 10 nm and equal to or smaller than about 50 nm.

Electron Transporting Layer 62

The electron transporting layer 62 has a function of transporting the electrons, which are injected from the cathode 8 through the second electron injection layer 63 into the electron transporting layer 62, to the light-emitting functional layer 5. In addition, in some cases, the electron transporting layer 62 may have a function of blocking the holes which are to be transmitted from the light-emitting functional layer 5 to the electron transporting layer 62.

Although the constituent material (electron transporting material) of the electron transporting layer 62 is not particularly limited, for example, a quinoline derivative such as an organic metal complex using 8-quinolinol such as tris(8-quinolinolato) aluminum (Alq3) or 8-quinolinolato lithium (Liq) or a derivative thereof as a ligand, an oxadiazole derivative such as 2-(4-tert-butylphenyl)-5-(4-biphenyl)-1,3,4-oxadiazole (tBu-PBD), 2,5-bis(1-naphthyl)-1,3,4-oxadiazole (BND), a triazole derivative such as 3-(4-biphenyl)-4-phenyl-5-(4-tert-butylphenyl)-1,2,4-triazole (TAZ), a silole derivative expressed by the following formula (14), a pyridine derivative, a pyrimidine derivative, a quinoxaline derivative, a nitrogen-containing heterocyclic derivative such as a compound expressed by the following formula (15), or the like may be very appropriately used so that the electron transporting layer 62 may be formed by using a gas phase process in the electron transporting layer 62 formation process. One thereof or a combination of two or more may be used.

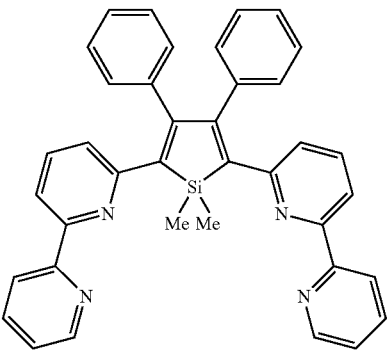
(14)

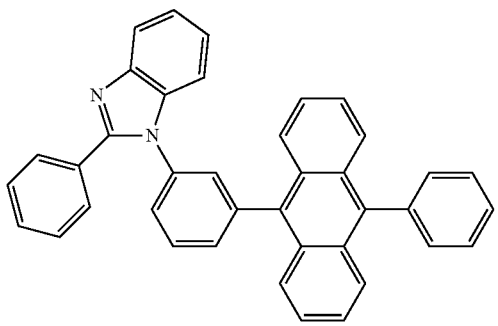
(15)

Although the average thickness of the electron transporting layer 62 is not particularly limited, the average thickness is preferably equal to or larger than about 1 nm and equal to or smaller than about 100 nm, more preferably equal to or larger than about 5 nm and equal to or smaller than about 50 nm. Accordingly, it is possible to appropriately transport the electrons, which are injected from the second electron injection layer 63, to the light-emitting functional layer 5.

In addition, the electron transporting layer 62 may be omitted according to a combination of a constituent material type, thickness, and the like of the hole injection layer 41, the first electron injection layer 61, the hole transporting layer 43, the light-emitting functional layer 5, the second electron injection layer 63, and the cathode 8 included in the light-emitting device 1.

Second Electron Injection Layer 63

The second electron injection layer 63 has a function of improving the electron injection efficiency, that is, the efficiency of injection of electrons from the cathode 8 to the electron transporting layer 62.

Although the constituent material (electron injection material) of the second electron injection layer 63 is not particularly limited, for example, the aforementioned constituent materials of the first electron injection layer 61 may be used.

In addition, since each of the constituent materials (electron injection materials) of the second electron injection layer 63 and the first electron injection layer 61 is selected so as to obtain the optimal injection efficiency according to a combination of the constituent materials of two layers interposing each of the electron injection layers, the constituent material of the second electron injection layer 63 and the constituent material of the first electron injection layer 61 may be the same or different.

Although the average thickness of the second electron injection layer 63 is not particularly limited, the average thickness is preferably equal to or larger than about 0.01 nm and equal to or smaller than about 100 nm, more preferably equal to or larger than about 0.1 nm and equal to or smaller than about 10 nm.

In addition, the second electron injection layer 63 may be omitted according to a combination of a constituent material type, thickness, and the like of the electron transporting layer 62 and the cathode 8.

Cathode 8

The cathode 8 is an electrode of injecting the electrons through the second electron injection layer 63 into the electron transporting layer 62. It is preferable that a material having a small work function be used as the constituent material of the cathode 8. As the constituent material of the cathode 8, for example, Li, Mg, Ca, Sr, La, Ce, Er, Eu, Sc, Y, Yb, Ag, Cu, Al, Cs, Rb, Au, or an alloy thereof may be used so that the cathode 8 may be formed by using a gas phase process in the cathode 8 formation process described later. One thereof or a combination of two or more (for example, a laminated structure of multiple layers or the like) may be used.

Particularly, similarly to the embodiment, in the case of using the bottom emission structure display panel 19, the cathode 8 does not necessarily have the optical transparency, and it is preferable that for example, a metal such as Al, Ag, AlAg, and AlNd or an alloy thereof be used as the constituent material of the cathode 8. The metal or the alloy listed above is used as the constituent material of the cathode 8, so that it is possible to improve the electron injection efficiency and the stability of the cathode 8.

Although the average thickness of the cathode 8 is not particularly limited, the average thickness is preferably equal to or larger than about 50 nm and equal to or smaller than about 1000 nm, more preferably equal to or larger than about 100 nm and equal to or smaller than about 500 nm.

In addition, in the case where the display panel 19 is a top emission structure display apparatus, it is preferable that a metal such as MgAg, MgAl, MgAu, and AlAg or an alloy be used as the constituent material of the cathode 8. The metal or the alloy listed above is used as the constituent material of the cathode 8, so that it is possible to improve the electron injection efficiency and the stability of the cathode 8 while maintaining the optical transparency of the cathode 8.

Although the average thickness of the cathode 8 is not particularly limited, the average thickness is preferably equal to or larger than about 1 nm and equal to or smaller than about 50 nm, more preferably equal to or larger than about 5 nm and equal to or smaller than about 20 nm.

In addition, in the light-emitting device 1 according to this configuration, arbitrary layers may also be disposed between the anode 3, the hole injection layer 41, the first electron injection layer 61, the hole transporting layer 43, the light-emitting functional layer 5, the electron transporting layer 62, the second electron injection layer 63, and the cathode 8.

In addition, a method of manufacturing a display panel 19 including a light-emitting device 1 will be described as a second embodiment.

As described hereinbefore, according to the display apparatus 100 (display panel 19) according to the embodiment, it is possible to obtain the following effects.

In the display panel 19, the first electron injection layer 61 is formed between the anode 3 and the light-emitting functional layer 5, and the hole injection layer 41 is formed between the anode 3 and the first electron injection layer 61. In other words, the hole injection layer 41, the first electron injection layer 61, and the light-emitting functional layer 5 are configured to be laminated on the anode 3 in this order.

According to this configuration, the electron injection material used for the first electron injection layer 61 is diffused into the hole injection layer 41, and the diffused electron injection material inhibits or promotes hole transportation of the hole injection layer 41, so that the amount of holes transported to the light-emitting functional layer 5 is adjusted. As a result, the carrier balance is improved.

Therefore, in comparison with a light-emitting device of the related art where the carrier balance is broken due to the influence of a material added to an organic layer between the light-emitting functional layer and the anode so that light emission is prevented, it is possible to improve the light-emitting efficiency.

Therefore, it is possible to provide the light-emitting device 1 capable of obtaining a desired light-emitting efficiency and the display apparatus 100 (display panel 19) including the light-emitting device 1.

In addition, since the carrier balance is good, it is possible to suppress deterioration of the functional layer 38 including the light-emitting functional layer 5.

Therefore, is possible to provide the light-emitting device 1 capable of obtaining a desired life time.

In addition, since the first electron injection layer 61 is made of an alkali metal, an alkaline earth metal, or a compound thereof, the electron injection material used for the first electron injection layer 61 is easily diffused into the hole injection layer 41, so that the electron injection material may effectively prevent the transportation of holes into the hole injection layer.

In addition, since the hole transporting layer 43 is formed between the first electron injection layer 61 and the light-emitting functional layer, it is possible to prevent the first electron injection layer 61 from being in direct contact with the light-emitting functional layer 5. Therefore, it is possible to suppress deterioration in the light-emitting efficiency caused by the diffusion of the electron injection material used for the first electron injection layer 61 into the light-emitting functional layer 5.

In addition, since the first electron injection layer 61 is in direct contact with the hole injection layer 41, the electron injection material used for the first electron injection layer 61 is more easily diffused into the hole injection layer 41. As a result, the electron injection material may not be easily diffused into the light-emitting functional layer 5, so that it is possible to suppress deterioration in the light-emitting efficiency caused by the diffusion of the electron injection material into the light-emitting functional layer.

In addition, since the hole injection layer 41 has ion conductivity, the electron injection material used for the first electron injection layer 61 is more easily diffused into the hole injection layer 41.

Accordingly, since the electron injection material may not be easily diffused into the light-emitting functional layer 5, it is possible to suppress deterioration in the light-emitting efficiency.

In addition, since the hole injection layer 41 may be formed by using a liquid phase process, the invention may be easily adapted to manufacturing a large sized display panel.

Second Embodiment

Overview of Display Apparatus

FIG. 2 is a perspective diagram illustrating an aspect of a display apparatus according to an embodiment and corresponds to FIG. 1.

First, overview of a display apparatus as the display apparatus according to the second embodiment of the invention is described. In addition, the same components as those of the first embodiment are indicated by the same reference numerals, and the description thereof is omitted.

The display apparatus 110 according to the embodiment includes a display panel 29 capable of displaying a full color image. More specifically, as illustrated in the enlarged diagram of the display area V in the upper right portion of FIG. 4, the display apparatus 110 includes a display panel 29 where red (R), green (G), and blue (B) pixels are periodically formed. The other configurations are the same as those of the display apparatus 100 according to the first embodiment.

Details of Light Emitting Device

Figure 4:
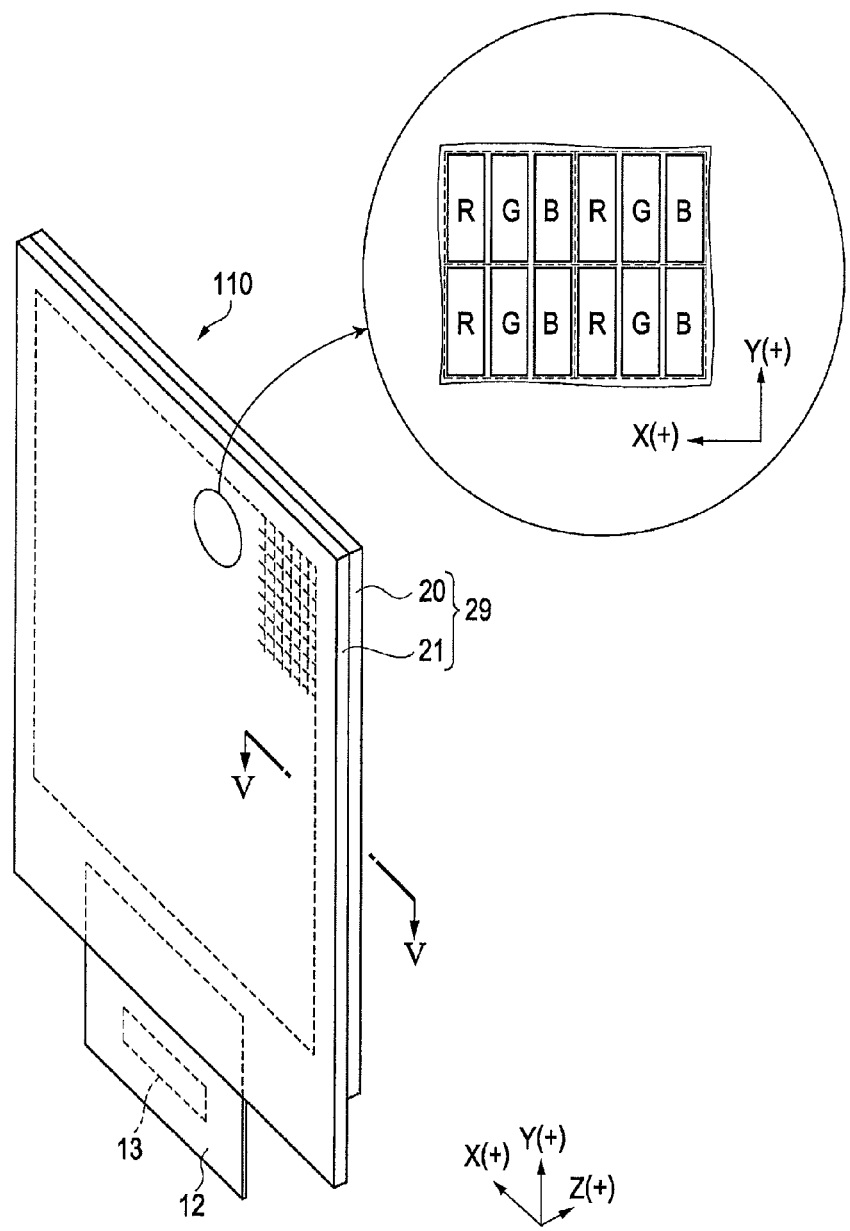
FIG. 4 is a perspective diagram illustrating a display apparatus according to a second embodiment.
Figure 5:
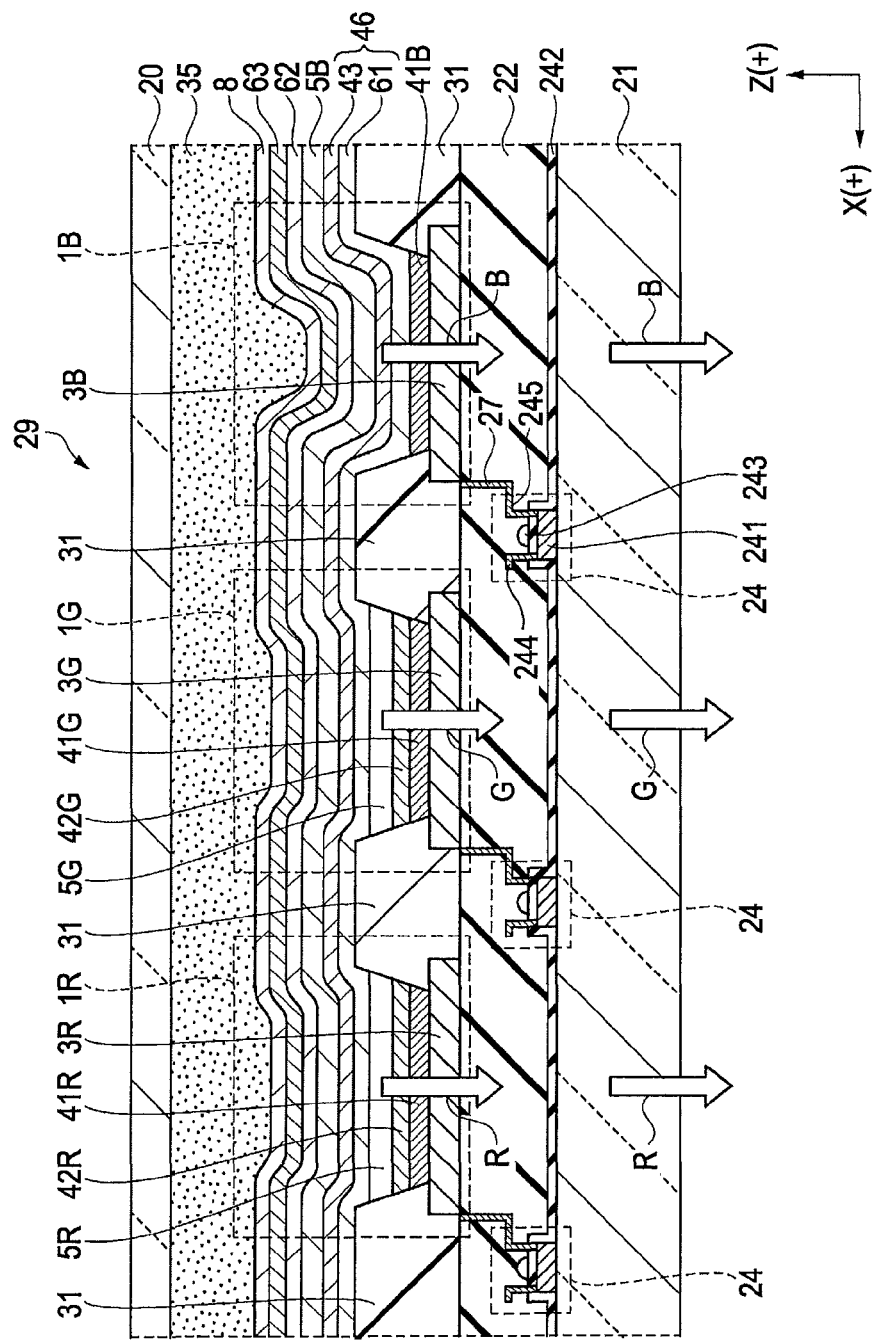
FIG. 5 is a side cross-sectional diagram illustrating a display panel.

FIG. 5 is a side cross-sectional diagram taken along line V-V of FIG. 4 and corresponds to FIG. 3.

Hereinafter, the description will be made mainly by concentrating on the difference from the display panel 19 according to the first embodiment.

The red (R), green (G), and blue (B) pixels are periodically formed in the display area V of the display panel 29 in the X axis direction. In addition, each color pixel is referred to as a subpixel, and a pixel set including three consecutive RGB subpixels is referred to as a color pixel.

In FIG. 5, the pixel illustrated in the rightmost side (X axis (−) side) is a blue pixel which emits B light and includes the light-emitting device 1B. Herein, although the light-emitting device 1B has the same configuration as that of the light-emitting device 1 of the first embodiment, it is referred to as the light-emitting device 1B in order to distinguish from pixels of other color light.

The green pixel emitting G light in the vicinity of the blue pixel and the red pixel emitting R light in the vicinity of the green pixel include the light-emitting device 1G and the light-emitting device 1R which have lamination structures different from that of the light-emitting device 1B, respectively. Other configurations are the same as those of the display panel 19 of the first embodiment.

Hereinafter, each light-emitting device will be described in detail.

In each of the light-emitting devices 1R, 1G, and 1B, a first layer, a second layer, and a third layer are interposed between each of the anodes 3R, 3G, and 3B and the cathode 8 in this order from the cathode 8 side.

The first layer is a layer having a function of emitting the first color light. Hereinafter, a layer having a function of emitting color light is referred to as a light-emitting functional layer. In the embodiment, the first color is blue, and the first layer is the blue light-emitting functional layer 5B. In addition, the blue light-emitting functional layer 5B is the same as the light-emitting functional layer 5 according to the first embodiment.

The second layer is the carrier selection layer 46. The carrier selection layer is a layer having a function of selecting a flow of carriers through the function of the third layer. Similarly to the first embodiment, the carrier selection layer is configured as a laminated structure where the first electron injection layer 61 and the hole transporting layer 43 are laminated in this order from the anode (3R, 3G, 3B) side.

In the light-emitting devices 1R and 1G the third layers are layers having a function of emitting the second color light and are the red light-emitting functional layer 5R and the green light-emitting functional layer 5G. In other words, in the embodiment, the second colors of the light-emitting devices 1R and 1G are red and green, respectively.

In addition, in the light-emitting device 1B, the third layer becomes the hole injection layer 41B. In addition, the hole injection layer 41B is the same as the hole injection layer 41 according to the first embodiment.

The light-emitting device 1R is configured by laminating the anode 3R, the hole injection layer 41R, the intermediate layer 42R, the red light-emitting functional layer 5R as the third layer, the carrier selection layer 46 as the second layer, the blue light-emitting functional layer 5B as the first layer, the electron transporting layer 62, the second electron injection layer 63, and the cathode 8 on the planarization layer 22 in this order.

In addition, the light-emitting device 1G is configured by laminating the anode 3G the hole injection layer 41G the intermediate layer 42G, the green light-emitting functional layer 5G as the third layer, the carrier selection layer 46 as the second layer, the blue light-emitting functional layer 5B as the first layer, the electron transporting layer 62, the second electron injection layer 63, and the cathode 8 on the planarization layer 22 in this order.

In the embodiment, in each of the light-emitting devices 1R, 1G, and 1B, each of the anodes 3R, 3G; and 3B, each of the hole injection layers 41R, 41G, and 41B, each of the intermediate layers 42R and 42G; and each of the light-emitting functional layers 5R and 5G are separately installed through the partition of the partition wall 31; and the first electron injection layer 61, the hole transporting layer 43, the blue light-emitting functional layer 5B, the electron transporting layer 62, the second electron injection layer 63, and the cathode 8 are integrally installed.

According to the configuration, in each of the light-emitting devices 1R, 1G, and 1B, each of the anodes 3R, 3G, and 3B constitutes a pixel electrode (individual electrode), and the cathode 8 of each of the light-emitting devices 1R, 1G, and 1B constitutes a common electrode. In addition, in each of the light-emitting devices 1R, 1G, and 1B, each of the anodes 3R, 3G, and 3B is electrically connected to the drain electrode 245 of each driving transistor 24 through the conductive portion (interconnection line) 27.

In this manner, in the display panel 29 including the light-emitting devices 1R, 1G, and 1B, the luminance of each of the light-emitting devices 1R, 1G, and 1B is controlled by using the driving transistor 24, that is, by controlling the voltage applied to each of the light-emitting devices 1R, 1G, and 1B, so that full color display of the display apparatus 110 may be performed.

The light-emitting device according to the invention is applied to the display panel 29 having this configuration. Hereinafter, the light-emitting devices 1R and 1G are sequentially described.

Light-Emitting Device 1R

The light-emitting device (red light-emitting device) 1R is configured by allowing a laminated structure, where the hole injection layer 41R, the intermediate layer 42R, the red light-emitting functional layer 5R, the carrier selection layer 46, the blue light-emitting functional layer 5B, the electron transporting layer 62, and the second electron injection layer 63 are laminated in this order from the anode 3R side, to be interposed between the anode 3R and the cathode 8.

In the light-emitting device 1R, the carrier selection layer 46 is configured as a laminated structure where the first electron injection layer 61 and the hole transporting layer 43 are laminated in this order from the anode 3R side. In addition, in the light-emitting device 1R, the anode 3R and the cathode 8 constitute an individual electrode and a common electrode, respectively. The anode 3R has a function as an electrode of injecting the holes into the hole injection layer 41R, and the cathode 8 has a function as an electrode of injecting the electrons through the second electron injection layer 63 into the electron transporting layer 62.

In the light-emitting device 1R having this configuration, the intermediate layer 42R and the red light-emitting functional layer 5R are unique components. In other words, the anode 3R, the hole injection layer 41R, the carrier selection layer 46, the blue light-emitting functional layer 5B, the electron transporting layer 62, the second electron injection layer 63, and the cathode 8 are the same as the corresponding components of the first embodiment.

Hereinafter, the components unique to the light-emitting device 1R will be described.

Intermediate Layer 42R

The intermediate layer 42R has a function of transporting the holes, which are injected from the hole injection layer 41R, to the red light-emitting functional layer 5R. In addition, in some cases, the intermediate layer 42R may have a function of blocking the electrons which are to be transmitted from the red light-emitting functional layer 5R to the intermediate layer 42R.

Although the constituent material of the intermediate layer 42R is not particularly limited, for example, an amine compound such as a triphenyl amine-based polymer expressed by the following general formula (16) is very appropriately used so that the intermediate layer 42R may be formed by using a liquid phase process in the intermediate layer 42R formation process described later.

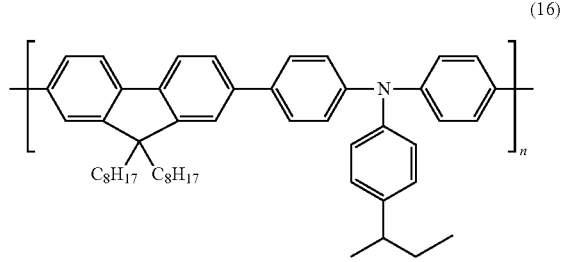

(16)

Although the average thickness of the intermediate layer 42R is not particularly limited, the average thickness is preferably equal to or larger than about 5 nm and equal to or smaller than about 100 nm, more preferably equal to or larger than about 10 nm and equal to or smaller than about 50 nm.

In addition, the intermediate layer 42R may be omitted according to a combination of a constituent material type, thickness, and the like of the anode 3R, the hole injection layer 41R, the red light-emitting functional layer 5R, the first electron injection layer 61, the hole transporting layer 43, the blue light-emitting functional layer 5B, the electron transporting layer 62, the second electron injection layer 63, and the cathode 8 included in the light-emitting device 1R.

Red Light Emitting Functional Layer 5R

The red light-emitting functional layer 5R is configured to include a red light-emitting material which emits red light.

In the light-emitting device 1R, the red light-emitting functional layer 5R constitutes a third layer which is disposed between the anode 3R and the carrier selection layer (second layer) 46. The red light-emitting functional layer 5R has a function of emitting light of the second color (red) in the light-emitting device 1R.

Although the constituent material of the red light-emitting functional layer 5R is not particularly limited, a material which may be dissolved or dispersed is preferred so that the red light-emitting functional layer 5R may be formed by using a liquid phase process in the red light-emitting functional layer 5R formation process described later. Therefore, a high-molecular-weight red light-emitting material and a low-molecular-weight red light-emitting material which may be dissolved or dispersed in a solvent or a dispersion medium are very appropriately used as the constituent material of the red light-emitting functional layer 5R. For example, a high-molecular-weight red light-emitting material expressed by the following general formulas (17) and (18) may be used.

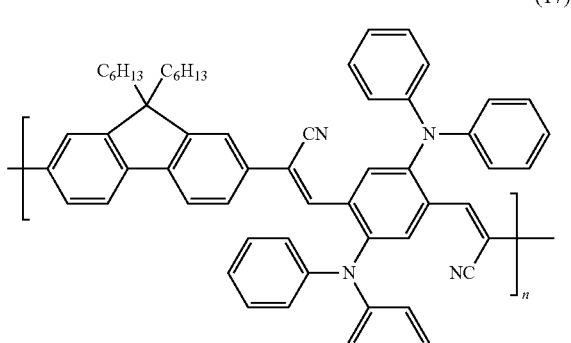

(17)

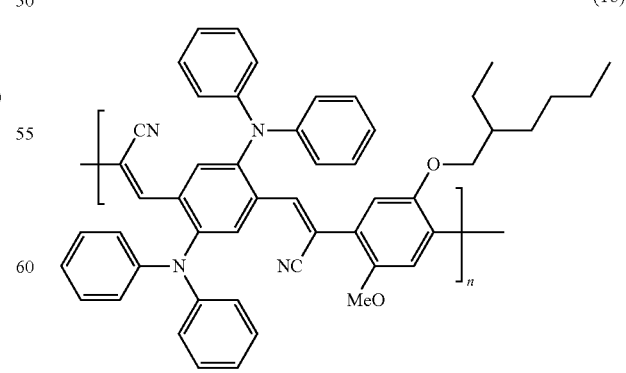

(18)

In addition, the light-emitting device 1R including the red light-emitting functional layer 5R formed through a liquid phase process has a light-emitting life time characteristic which is sufficient to a practical level.

Although the average thickness of the red light-emitting functional layer 5R is not particularly limited, the average thickness is preferably equal to or larger than about 10 nm and equal to or smaller than about 150 nm, more preferably equal to or larger than about 20 nm and equal to or smaller than about 100 nm.

Carrier Selection Layer 46

The carrier selection layer (second layer) 46 is configured as a laminated structure where the first electron injection layer 61 and the hole transporting layer 43 are laminated in this order from the anode 3R side.

In the light-emitting device 1R, the carrier selection layer 46 perform a carrier injection operation of smoothly injecting the electrons, which are flowed from the blue light-emitting functional layer 5B to the carrier selection layer 46, into the red light-emitting functional layer 5R. Therefore, in the light-emitting device 1R, the light emission of the blue light-emitting functional layer 5B is greatly suppressed, so that the red light-emitting functional layer 5R selectively or dominantly emits light.

Light-Emitting Device 1G

The light-emitting device (green light-emitting device) 1G is configured by allowing a laminated structure, where the hole injection layer 41G, the intermediate layer 42G, the green light-emitting functional layer 5G, the carrier selection layer 46, the blue light-emitting functional layer 5B, the electron transporting layer 62, and the second electron injection layer 63 are laminated in this order from the anode 3G side, to be interposed between the anode 3G and the cathode 8.

In the light-emitting device 1G, the carrier selection layer 46 is configured as a laminated structure where the first electron injection layer 61 and the hole transporting layer 43 are laminated in this order from the anode 3G side. In addition, in the light-emitting device 1G, the anode 3G and the cathode 8 constitute an individual electrode and a common electrode, respectively. The anode 3G has a function as an electrode of injecting the holes into the hole injection layer 41G, and the cathode 8 has a function as an electrode of injecting the electrons through the second electron injection layer 63 into the electron transporting layer 62.

The light-emitting device 1G has the same configuration as that of the aforementioned light-emitting device 1R except that the green light-emitting functional layer 5G is included instead of the red light-emitting functional layer 5R. In other words, the anode 3R, the hole injection layer 41R, the carrier selection layer 46, the blue light-emitting functional layer 5B, the electron transporting layer 62, the second electron injection layer 63, and the cathode 8 are the same as the corresponding components of the first embodiment.

Hereinafter, the components unique to the light-emitting device 1R will be described.

Green Light-Emitting Functional Layer 5G

The green light-emitting functional layer 5G is configured to include a green light-emitting material which emits green light.

In the light-emitting device 1G, the green light-emitting functional layer 5G constitutes a third layer which is disposed between the anode 3G and the carrier selection layer (second layer) 46. The green light-emitting functional layer 5G has a function of emitting light of the second color (green) in the light-emitting device 1G Although the constituent material of the green light-emitting functional layer 5G is not particularly limited, a material which may be dissolved or dispersed is preferred so that the green light-emitting functional layer 5G may be formed by using a liquid phase process in the green light-emitting functional layer 5G formation process. Therefore, a high-molecular-weight green light-emitting material and a low-molecular-weight green light-emitting material which may be dissolved or dispersed in a solvent or a dispersion medium are very appropriately used as the constituent material of the green light-emitting functional layer 5G. For example, a high-molecular-weight green light-emitting material expressed by the following general formulas (19) and (20) may be used.

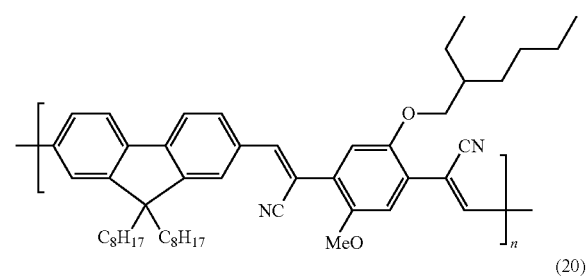

In addition, the light-emitting device 1G including the green light-emitting functional layer 5G formed through a liquid phase process has a light-emitting life time characteristic which is sufficient to a practical level.

Although the average thickness of the green light-emitting functional layer 5G, is not particularly limited, the average thickness is preferably equal to or larger than about 10 nm and equal to or smaller than about 150 nm, more preferably equal to or larger than about 20 nm and equal to or smaller than about 100 nm.

In addition, in the light-emitting device 1G having the configuration, an arbitrary layer may be disposed between the layers of the anode 3G, the hole injection layer 41G, the intermediate layer 42G the green light-emitting functional layer 5G, the first electron injection layer 61, the hole transporting layer 43, the blue light-emitting functional layer 5B, the electron transporting layer 62, the second electron injection layer 63 and the cathode 8.

Supplementary Description of Light Emitting Device 1B

In the light-emitting device 1B, the carrier selection layer 46 performs a carrier blocking operation of blocking the electrons flowed from the blue light-emitting functional layer 5B to the carrier selection layer 46 and retaining the electrons in the blue light-emitting functional layer 5B. Therefore, in the light-emitting device 1B, the blue light-emitting functional layer 5B efficiently emits light. In order to accurately perform the carrier blocking operation, it is preferable that the hole transporting layer 43 of the light-emitting device 1B have a carrier blocking function. For example, an amine-based compound is used as the aforementioned constituent material of the hole transporting layer 43 of the light-emitting device 1R, so that the hole transporting layer 43 has the electron blocking function.

In addition, in the light-emitting device 1B having the configuration, an arbitrary layer may be disposed between the layers of the anode 3B, the hole injection layer 41B, the first electron injection layer 61, the hole transporting layer 43, the blue light-emitting functional layer 5B, the electron transporting layer 62, the second electron injection layer 63, and the cathode 8.

Method of Manufacturing Display Panel

FIGS. 6A to 6C and FIGS. 7A to 7C are diagrams illustrating an aspect of the display panel manufacturing processes and are side cross-sectional diagrams corresponding to FIG. 5.

Herein, a method of manufacturing the aforementioned display panel 29 will be described. In addition, in the method of manufacturing the display panel 19 according to the first embodiment, only the blue pixels are formed in all the pixels in the method of manufacturing the display panel 29 according to the embodiment. In other words, the method of manufacturing where the intermediate layer 42R, the red light-emitting functional layer 5R, the intermediate layer 42G, and the green light-emitting functional layer 5G are omitted is the method of manufacturing the display panel 19 according to the first embodiment.

[1] First, a substrate 21 is prepared. After a plurality of driving transistors 24 are fainted so as to correspond to sub-pixels, a planarization layer 22 is formed so as to cover the driving transistors 24 (first process).

[1-A] First, the substrate 21 is prepared. A pixel circuit device including the driving transistors 24 is fainted on the substrate 21. In addition, for the convenience of description, the description is made by concentrating on the driving transistor 24.

[1-Aa] First, a semiconductor film including an amorphous silicon as a main constituent and having an average thickness of equal to or larger than about 30 nm and equal to or smaller than about 70 nm is formed on the substrate 21, for example, by using a plasma CVD method or the like.

[1-Ab] Next, the amorphous silicon is changed into a poly-silicon by performing a crystallization process on the semiconductor film through a laser annealing method, a solid phase growing method, or the like.

Herein, in the laser annealing method, for example, an excimer laser having a line beam of which the length dimension is 400 mm is used, and the output intensity is set to, for example, about 200 mJ/cm2.

[1-Ac] Next, the semiconductor film is patterned in an island shape, so that a semiconductor layer 241 is obtained. A gate insulating layer 242 including a silicon oxide, a silicon nitride, or the like as a main constituent and having an average thickness of equal to or larger than about 60 nm and equal to or smaller than about 150 nm is formed so as to cover the island-shaped semiconductor layer 241 by a plasma CVD method or the like using, for example, TEOS (tetraethoxysilane) or an oxygen gas, or the like as a source gas.

[1-Ad] Next, a conductive film including a metal such as aluminum, tantalum, molybdenum, titanium, or tungsten as a main constituent is formed on the gate insulating layer 242, for example, by a sputtering method or the like. After that, the conductive film is patterned, so that a gate electrode 243 is formed.

[1-Ae] Next, in this state, high-concentration phosphorus ions are implanted, so that source/drain regions are formed in a self-aligned manner with respect to the gate electrode 243. In addition, a portion where impurities are not introduced becomes a channel region.

[1-B] Next, a source electrode 244 and a drain electrode 245 electrically connected to the driving transistor 24 are formed.

[1-Ba] First, after a first planarization layer is formed so as to cover the gate electrode 243, a contact hole is formed.

[1-Bb] Next, the source electrode 244 and the drain electrode 245 are formed in the contact hole.

[1-C] Next, each of interconnection lines (relay electrodes) 27 which electrically connects the drain electrode 245 and each of the anodes 3R, 3G, and 3B are formed.

[1-Ca] First, after a second planarization layer is formed on the first planarization layer, the contact hole is formed.

[1-Cb] Next, the interconnection line 27 is formed in the contact hole.

In addition, the planarization layer 22 is configured by the first planarization layer and the second planarization layer which are formed in the process [1-B] and the process [1-C], respectively.

[2] Next, the anodes (individual electrodes) 3R, 3G, and 3B are formed on the planarization layer 22 so as to correspond to the interconnection lines 27 (second process).

The anodes 3R, 3G, and 3B may be obtained by forming thin films including the constituent materials of the anodes 3R, 3G, and 3B as main constituents on the planarization layer 22 and, after that, by patterning the thin films.

[3] Next, the partition wall (bank) 31 is formed on the planarization layer 22 so as to partition each of the anodes 3R, 3G, and 3B, that is, so as to partition the area where each of the light-emitting devices 1R, 1G, and 1B is formed (third process).

The partition wall 31 may be formed by forming an insulating film on the planarization layer 22 so as to cover each of the anodes 3R, 3G, and 3B and, after that, by patterning the insulating film by using a photolithography method or the like so as to expose each of the anodes 3R, 3G, and 3B.

Herein, the constituent material of the partition wall 31 is selected by taking into consideration heat resistance, lyophobic property, ink solvent resistance, adhesiveness with respect to the planarization layer 22 or the like.

More specifically, the constituent material of the partition wall 31 may include, for example, an organic material such as an acryl-based resin, a polyimide-based resin, and an epoxy-based resin or an inorganic material such as $SiO_2$.

FIG. 6A illustrates a state where the partition wall 31 is formed by the processes described hereinbefore.

In addition, as illustrated in FIG. 4, the shape of the opening of the partition wall 31 may be any polygon, for example, a circle, an ellipse, a hexagon, and the like as well as a rectangle.

In addition, in the case where the shape of the opening of the partition wall 31 is a polygon, it is preferable that the corner portions be rounded. Accordingly, when the hole injection layers 41R, 41G; and 41B, the intermediate layers 42R and 42G, and the light-emitting functional layers 5R and 5G are formed by using a liquid phase material described later, it is possible to securely supply the liquid phase material to every corner of the space in the inner side of the partition wall 31.

The height of the partition wall 31 is appropriately set according to the thickness of the light-emitting devices 1R, 1G, and 1B. Although it is not particularly limited, it is preferable that the height of the partition wall 31 be equal to or larger than about 0.5 μm and equal to or smaller than about 5 μm. By setting the height in this range, the partition wall 31 may have a sufficient function as a partition wall (bank).

In addition, in the case where the hole injection layers 41R, 41G, and 41B, the intermediate layers 42R and 42G, and the light-emitting functional layers 5R and 5G are formed by an ink jet method, it is preferable that a plasma process is performed on the substrate 21 where the partition wall 31 is formed. More specifically, first, a plasma process using O2 gas as a process gas is performed on the surface of the substrate 21 where the partition wall 31 is formed. By doing so, the surfaces of the anodes 3R, 3G, and 3B and the surface (including the wall surface) of the partition wall 31 are activated to have a lyophilic property. Next, a plasma process using a fluoride-based gas such as CF4 as a process gas is performed. Accordingly, a fluoride-based gas reacts with only the surface of the partition wall 31 made of a photosensitive resin as an organic material, so that the surface is allowed to have a lyophobic property. Accordingly, the partition wall 31 may have more effective function as a partition wall.

[4] Next, the hole injection layer 41R, the intermediate layer 42R, and the red light-emitting functional layer 5R are formed in an inner side of the partition wall 31 located in the area where the light-emitting device 1R is to be formed; the hole injection layer 41G, the intermediate layer 42G; and the green light-emitting functional layer 5G are formed in an inner side of the partition wall 31 located in the area where the light-emitting device 1G is to be formed; and the hole injection layer 41B is formed in an inner side of the partition wall 31 located in the area where the light-emitting device 1B is to be formed (fourth process). Hereinafter, the fourth process for each of the light-emitting devices 1R, 1G, and 1B is described in detail.

Light Emitting Device 1R

The hole injection layer 41R, the intermediate layer 42R, and the red light-emitting functional layer 5R are sequentially formed in an inner side of the partition wall 31 located in the area where the light-emitting device 1R is to be formed. The processes of forming the layers are referred to as a hole injection layer 41R formation process, an intermediate layer 42R formation process, and a red light-emitting functional layer 5R formation process, respectively. Hereinafter, the processes are described in detail.

Hole Injection Layer 41R Formation Process

First, as illustrated in FIG. 6B, the hole injection layer 41R is coated by using an ink jet method. More specifically, an ink (liquid phase material) for forming the hole injection layer 41R containing a hole injection material is ejected from a head of an ink jet printing apparatus, so that each anode 3R is coated (coating process).

Herein, the solvent (ink solvent) or the dispersion medium (ink dispersion medium) used for manufacturing the hole injection layer formation ink may include, for example, various inorganic solvents such as nitrate, sulfate, ammonia, hydrogen peroxide, water, carbon disulfide, carbon tetrachloride, and ethylene carbonate, various organic solvents such as ketone solvents such as methyl ethyl ketone (MEK), acetone, diethyl ketone, methyl isobutyl ketone (MIBK), isopropyl methyl ketone (MIPK), and cyclohexanone, alcohol solvents such as methanol, ethanol, isopropanol, ethylene glycol, diethylene glycol (DEG), and glycerol, ether solvents such as diethyl ether, diisopropyl ether, 1,2-dimethoxyethane (DME), 1,4-dioxane, tetrahydrofuran (THF), tetrahydropyran (THP), anisole, diethylene glycol dimethyl ether (diglyme), and diethylene glycol ethyl ether (carbitol), cellosolve solvents such as methyl cellosolve, ethyl cellosolve, and phenyl cellosolve, aliphatic hydrocarbon solvents such as hexane, pentane, heptane, and cyclohexane, alicyclic hydrocarbon solvents such as cyclohexane and tetralin, aromatic hydrocarbon solvents such as toluene, xylene, benzene, trimethylbenzene, and tetramethyl benzene, aromatic heterocyclic compound-based solvents such as pyridine, pyrazine, furan, pyrrole, thiophene, and methylpyrrolidone, amide solvents such as N,N-dimethylformamide (DMF) and N,N-dimethylacetamide (DMA), halogenated compound solvents such as dichloromethane, chloroform, and 1,2-dichloroethane, ester solvents such as ethyl acetate, acetate, and ethyl formate, sulfur compound solvents such as dimethyl sulfoxide (DMSO) and sulfolane, nitrile solvents such as acetonitrile, propionitrile, and acrylonitrile, and organic acid solvents such as formic acid, acetic acid, trichloroacetic acid, and trifluoroacetic acid, or mixed solvents thereof.

In addition, although the liquid phase material with which the anode 3R is coated has high fluidity (low viscosity) and expandability in horizontal direction (surface direction), since the anode 3R is surrounded by the partition wall 31 as illustrated in FIG. 6B, the expansion of the liquid phase material is prevented in an area other than a predetermined area, so that the shape of contour of the hole injection layer 41R is accurately defined.

Next, a post process is applied to the coated hole injection layer 41R (post process). More specifically, a hole injection layer formation ink (liquid phase material) with which the anode 3R is coated is dried, so that the hole injection layer 41R is formed. According to the drying, a solvent or a dispersion medium may be removed.

FIG. 6C illustrates an aspect of the hole injection layer 41R after the drying.

The drying method may include a method of leaving a material in a depressurized ambience, a method of performing thermal treatment (for example, a temperature of equal to or higher than about 40° C. and equal to or lower than about 80° C.), a method using a flow of an inert gas such as a nitrogen gas, and the like. In addition, if necessary, the substrate 21 where the hole injection layer 41R is formed is heated (baked) at a temperature of equal to or higher than about 100° C. and equal to or lower than about 300° C. By the heating, it is possible to remove the solvent or the dispersion medium which remains in the film of the hole injection layer 41R after the drying. In addition, in the case of using a hole injection material which cross link is formed by heating so as to be insoluble to the solvent, the hole injection layer 41R may become insoluble due to the heating. In addition, after the heating, in order to remove a portion of the hole injection layer 41R which is not insoluble, the surface of the substrate 21 where the hole injection layer 41R is formed may be rinsed by the solvent. Due to the rinsing, it is possible to prevent the portion of the hole injection layer 41R which is not insoluble from being mixed into the intermediate layer 42R formed on the hole injection layer 41R.

Intermediate Layer 42R Formation Process

In the intermediate layer 42R formation process, first, the hole injection layer 41R is coated with the intermediate layer 42R by the ink jet method similar to that of the hole injection layer 41R formation process. Next, the post process similar to that of the hole injection layer 41R formation process is applied to the coated intermediate layer 42R. However, the ink solvent or the ink dispersion medium used for the intermediate layer 42R formation ink and the method, conditions, and the like of the post process may be selected to be suitable for the intermediate layer 42R formation.

Figure 7A:
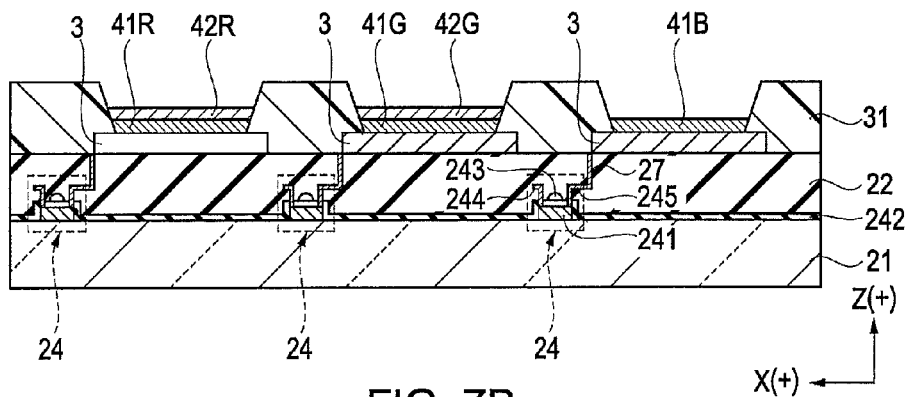
FIGS. 7A to 7C are diagrams illustrating an aspect of manufacturing processes.

FIG. 7A illustrates an aspect of the hole injection layer 41R after the drying.

Red Light Emitting Functional Layer 5R Formation Process

Figure 7B:
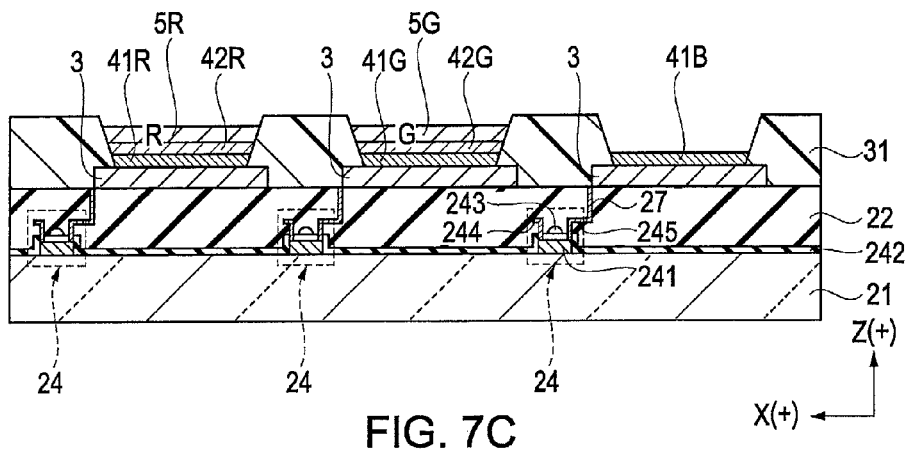

In the red light-emitting functional layer 5R formation process, first, the intermediate layer 42R is coated with the red light-emitting functional layer 5R by the ink jet method similar to that of the hole injection layer 41R formation process. Next, the post process similar to that of the hole injection layer 41R formation process is applied to the coated red light-emitting functional layer 5R. However, the ink solvent or the ink dispersion medium used for the red light-emitting functional layer 5R formation ink and the method, conditions, and the like of the post process may be selected to be suitable for the red light-emitting functional layer 5R formation. FIG. 7B illustrates an aspect of the red light-emitting functional layer 5R after the drying.

It is preferable that an ink jet method be used for the aforementioned hole injection layer 41R formation process, the aforementioned intermediate layer 42R formation process, and the aforementioned red light-emitting functional layer 5R formation process. In the ink jet method, since the ink ejection amount and ink droplet landing positions may be controlled with high precision irrespective of the size of the area of the substrate, it is possible to implement the hole injection layer 41R as a thin film, to implement a small size of pixels, and to implement a large size of the display apparatus 100 by using the aforementioned method. In addition, since the ink (liquid phase material) for farming the layers may be selectively supplied to an inner side of the partition wall 31, it is possible to reduce ink wastage.

In addition, the hole injection layer 41R formation process, the intermediate layer 42R formation process, and the red light-emitting functional layer 5R formation process are not limited to the ink jet method. For example, a gas phase process such as a sputtering method, a vacuum deposition method, and a CVD method and a liquid phase process such as a spin coating method (Pairozoru) method, a casting method, a micro gravure coating method, a gravure coating method, a bar coating method, a roll coating method, a wire bar coating method, a dip coating method, a spray coating method, a screen printing method, a flexographic printing method, an offset printing method may also be used.

Light Emitting Device 1G

The hole injection layer 41G, the intermediate layer 42G, and the green light-emitting functional layer 5G are formed in an inner side of the partition wall 31 located in the area where the light-emitting device 1G is to be formed in this order by using the same method as that of the light-emitting device 1R. However, with respect to each of the hole injection layer 41G, the intermediate layer 42G, and the green light-emitting functional layer 5G, the ink solvent or the ink dispersion medium used for the layer formation ink and the method conditions, and the like of the post process may be selected to be suitable for the layer formation.

Light Emitting Device 1B

The hole injection layer 41B is formed in an inner side of the partition wall 31 located in the area where the light-emitting device 1B is to be formed by using the same method as that of the hole injection layer 41R formation process for the light-emitting device 1R. However, the ink solvent or the ink dispersion medium used for the hole injection layer 41B formation ink the method conditions, and the like of the post process may be selected to be suitable for the hole injection layer 41B formation.

As described hereinbefore, in the case where each of the hole injection layers 41R, 41G, and 41B, the intermediate layers 42R and 42G and the light-emitting functional layers 5R and 5G is formed by using an ink jet method, although each layer may be completely Banned through a coating process and a post process, as illustrated in FIGS. 6B and 6C and FIGS. 7A and 7B, the coating process for each layer may be performed together with coating processes for different subpixels, and the post process for each layer may be performed together with post processes for different subpixels.

Figure 7C:
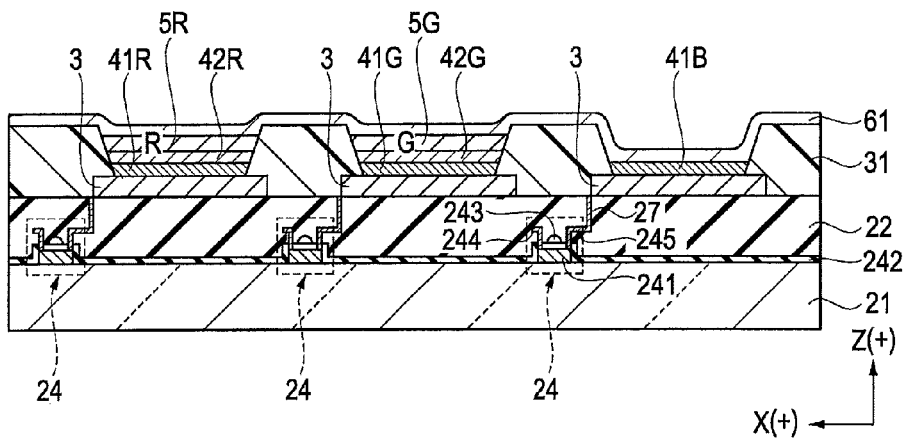

[5] Next, as illustrated in FIG. 7C, the first electron injection layer 61 is formed so as to overlap the red light-emitting functional layer 5R, the green light-emitting functional layer 5G, the hole injection layer 41B, and the partition wall 31, that is, so as to cover the entire surface of the side opposite to the surface which is contact with the planarization layer 22 of the partition wall 31 (fifth process).

Accordingly, the first electron injection layer 61 which is common to the light-emitting devices 1R, 1G, and 1B is integrally formed.

Although the first electron injection layer 61 is also formed by the gas phase process or the liquid phase process described in the aforementioned process [Light Emitting Device 1R], it is preferable that the gas phase process be used. By using the gas phase process, it is possible to securely form the first electron injection layer 61 while preventing layer dissolution between the first electron injection layer 61 and the red light-emitting functional layer 5R, the green light-emitting functional layer 5G, and the hole injection layer 41B.

[6] Next, the hole transporting layer 43 is formed so as to cover the entire surface of the first electron injection layer 61 (sixth process). Accordingly, the hole transporting layer 43 which is common to the light-emitting devices 1R, 1G, and 1B is integrally formed.

[7] Next, the blue light-emitting functional layer 5B is formed so as to cover the entire surface of the hole transporting layer 43 (seventh process). Accordingly, the blue light-emitting functional layer 5B which is common to the light-emitting devices 1R, 1G, and 1B is integrally formed.

[8] Next, the electron transporting layer 62 is formed so as to cover the entire surface of the blue light-emitting functional layer 5B (eighth process). Accordingly, the electron transporting layer 62 which is common to the light-emitting devices 1R, 1G, and 1B is integrally formed.

[9] Next, the second electron injection layer 63 is formed so as to cover the entire surface of the electron transporting layer 62 (ninth process). Accordingly, the second electron injection layer 63 which is common to the light-emitting devices 1R, 1G, and 1B is integrally formed.

[10] Next, the cathode 8 is formed so as to cover the entire surface of the second electron injection layer 63 (tenth process). Accordingly, the cathode 8 which is common to the light-emitting devices 1R, 1G and 1B is integrally formed.

In addition, although each layer formed in the aforementioned processes [6] to [10] is also formed by the gas phase process or the liquid phase process described in the aforementioned process [Light Emitting Device 1R], it is preferable that the gas phase process be used. By using the gas phase process, it is possible to securely form to-be-formed layers while preventing layer dissolution between the adjacent layers.

In addition, in the aforementioned processes [Light Emitting Device 1R] and [Light Emitting Device 1G], the light-emitting functional layers 5R and 5G are formed by using a liquid phase process such as an ink jet method, so that it is possible to easily perform coating of the light-emitting functional layers 5R and 5G which emit different colors of light and to easily implement a large size of the display apparatus 100. In addition, in the aforementioned processes [6] and [7], the hole transporting layer 43 and the blue light-emitting functional layer 5B are formed by using a gas phase process (gas phase film formation method), so that the light-emitting device 1B may have a light-emitting life time which is sufficient to a practical level. In addition, the blue light-emitting functional layer 5B common to the light-emitting devices 1R, 1G and 1B is configured to be integrally formed, so that it is not necessary to selectively form the blue light-emitting functional layer 5G with respect to the light-emitting device 1B by using a high precession mask. Therefore, it is possible to simplify the processes and to easily implement a large size of the display panel 29.

In addition, in the aforementioned processes [5] and [6], the first electron injection layer 61 and the hole transporting layer 43 common to the light-emitting devices 1R, 1G, and 1B are configured to be integrally formed, in other words, the carrier selection layer 46 including the first electron injection layer 61 and the hole transporting layer 43 is configured to be integrally formed, so that it is not necessary to selectively form the first electron injection layer 61 and the hole transporting layer 43 with respect to the light-emitting device 1B by using a high precession mask. Therefore, it is possible to simplify the processes and to easily implement a large size of the display panel 29.

In this manner, in correspondence to the driving transistors 24, a plurality of the light-emitting devices 1R, 1G, and 1B which emit red light, green light, and blue light are formed.

[11] Next, as illustrated in FIG. 5, a sealing substrate 20 is prepared, and after an epoxy-based adhesive is interposed between the cathode 8 and the sealing substrate 20, the adhesive is dried. Accordingly, the cathode 8 and the sealing substrate 20 may be in contact with each other through the epoxy layer 35 so as to cover the sealing substrate 20 and the cathode 8.

The sealing substrate 20 has a function as a protective substrate of protecting each of the light-emitting devices 1R, 1G, and 1B. The sealing substrate 20 is configured to be disposed on the cathode 8, so that it is possible to very appropriately prevent or reduce the light-emitting devices 1R, 1G, and 1B from being in contact with oxygen or moisture. Therefore, it is possible to improve reliability of the light-emitting devices 1R, 1G, and 1B or to securely obtain the effects such as prevention of change and deterioration in quality.

Through the processes described hereinbefore, the display panel 29 illustrated in FIG. 5 where the light-emitting devices 1R, 1G, and 1B are sealed by the sealing substrate 20 is completed.

As described hereinbefore, according to the display apparatus 110 (display panel 29) according to the embodiment, it is possible to obtain the following effects as well as the effects of the first embodiment.

First, since the light-emitting device 1B has the same configuration as that of the first embodiment, it is possible to obtain the same functions and effects as those of the first embodiment.

Hereinafter, functions and effects of the light-emitting devices 1R, 1G, and 1B according to the embodiment will be described by concentrating on the functions of the carrier selection layer 46.

In the embodiment, the carrier selection layer (second layer) 46 is configured as a laminated structure where the first electron injection layer 61 and the hole transporting layer 43 are laminated in this order from the anode (3R, 3G, 3B) side.

The carrier selection layer 46 having the configuration is a layer of selectively controlling the amount of electrons, which are injected from the blue light-emitting functional layer 5B into the carrier selection layer 46, according to the layer (third layer) which is in contact with the anode (3R, 3G, 3B) side of the carrier selection layer 46. In other words, the carrier selection layer (second layer) 46 is a layer having a function of selecting a flow of carrier through the function of the third layer.

More specifically, similarly to the light-emitting devices 1R and 1G, in the case where the layers which are in direct contact with the anode (3R, 3G) sides of the carrier selection layer 46 are the red light-emitting functional layer 5R and the green light-emitting functional layer 5G respectively, that is, in the case where the light-emitting functional layers having a function of emitting the second color light are in contact with the anode side interfaces of the carrier selection layer, the carrier selection layer 46 smoothly injects the electrons, which are flowed from the blue light-emitting functional layer 5B to the carrier selection layer 46, into the red light-emitting functional layer 5R and the green light-emitting functional layer 5G (carrier injection operation). Therefore, in the blue light-emitting functional layer 5B of the light-emitting device 1R, since the recombination of the holes and the electrons is accurately suppressed or prevented, the blue light-emitting functional layer 5B of the light-emitting device 1R does not emit blue light. Even if the blue light-emitting functional layer 5B emits the blue light, the emission is accurately suppressed. On the contrary, in the red light-emitting functional layer 5R, the electrons are supplied (injected) from the cathode 8 side through the blue light-emitting functional layer 5B, and at the same time, the holes are supplied (injected) from the anode 3R side. Next, in the red light-emitting functional layer 5R, the holes and the electrons are recombined, and the excitons are generated through the recombination. When the excitons return to the ground state, energy is fluoresced as light emission, so that the red light-emitting functional layer 5R emits red light. As a result, the light-emitting device 1R emits red light. Similarly, in the light-emitting device 1G, the emission of the blue light-emitting functional layer 5B is greatly suppressed, so that the green light-emitting functional layer 5G selectively or dominantly emits light. As a result, the light-emitting device 1G emits green light.

On the other hand, similarly to the light-emitting device 1B, in the case where the layer which is in contact with the anode 3B side of the carrier selection layer 46 is the hole injection layer 41B, that is, in the case where the hole injection layer is in contact with the anode side interface of the carrier selection layer, the carrier selection layer 46 blocks the electrons flowed from the blue light-emitting functional layer 5B to the carrier selection layer 46 and retains the electrons in the blue light-emitting functional layer 5B (carrier blocking operation). Therefore, in the blue light-emitting functional layer 5B, the holes supplied (injected) from the anode 3B side and the electrons supplied (injected) from the cathode 8 side are easily recombined. The excitons are generated through the recombination. When the excitons return to the ground state, energy is fluoresced as light emission, so that the blue light-emitting functional layer 5B efficiently emits light. As a result, the light-emitting device 1B emits blue light at high efficiency.

In this manner, the carrier selection layer 46 may perform the carrier injection operation or the carrier blocking operation according to the type of the third layer which is in contact with the carrier selection layer (second layer) 46.

The reason that the behavior of the electrons in the carrier selection layers 46 of the light-emitting devices 1R and 1G is different from the behavior of the electrons in the carrier selection layer 46 of the light-emitting device 1B will be described by exemplifying the case where the hole injection layer 41B is an ion conductive hole injection material.

First, similarly to the light-emitting devices 1R and 1G, in the case where the layers which are in contact with the anode (3R, 3G) sides of the carrier selection layer 46 are the red light-emitting functional layer 5R and the green light-emitting functional layer 5G respectively, the electron injection materials constituting the first electron injection layers 61 in the carrier selection layers 46 of the light-emitting devices 1R and 1G are diffused into the hole transporting layers 43 of the light-emitting devices 1R and 1G, respectively. Therefore, the electron blocking function of the hole transporting layers 43 of the light-emitting devices 1R and 1G greatly deteriorates. As a result, in each of the light-emitting devices 1R and 1G, the electrons are smoothly injected from the blue light-emitting functional layer 5B into the hole transporting layer 43. In addition, due to the function of the first electron injection layers 61 disposed between the red light-emitting functional layer 5R and the green light-emitting functional layer 5G and the hole transporting layer 43, the injection of the electrons from the hole transporting layer 43 into the red light-emitting functional layer 5R and the green light-emitting functional layer 5G is also smoothly performed. As described hereinbefore, similarly to the light-emitting devices 1R and 1G, in the case where the layers which are in contact with the anode (3R, 3G) sides of the carrier selection layer 46 are the red light-emitting functional layer 5R and the green light-emitting functional layer 5G, respectively, the carrier selection layer 46 smoothly injects the electrons, which are flowed from the blue light-emitting functional layer 5B to the carrier selection layer 46, into the red light-emitting functional layer 5R and the green light-emitting functional layer 5G (carrier injection operation). In other words, the carrier selection layer 46 performs an operation of smoothly flowing the electrons (carriers) from the blue light-emitting functional layer 5B into the red light-emitting functional layer 5R and the green light-emitting functional layer 5G On the other hand, similarly to the light-emitting device 1B, in the case where the layer which is in contact with the anode 3B of the carrier selection layer 46 is the hole injection layer 41B and the hole injection layer 41B is made of an ion conductive hole injection material, the electron injection material constituting the first electron injection layer 61 in the carrier selection layer 46 of the light-emitting device 1B is intensely diffused into the hole injection layer 41B or adsorbed to the cathode 8 side interface of the hole injection layer 41B, and the electron injection material constituting the first electron injection layer 61 of the light-emitting device 1B is not diffused into the hole transporting layer 43 of the light-emitting device 1B, so that the electron blocking function of the hole transporting layer 43 in the light-emitting device 1B does not deteriorate. As a result, in the light-emitting device 1B, the electrons flowed from the blue light-emitting functional layer 5B to the hole transporting layer 43 are blocked by the hole transporting layer 43, so that the electrons are retained in the blue light-emitting functional layer 5B. As described hereinbefore, in the case where the layer which is in contact with the anode 3B side of the carrier selection layer 46 is the hole injection layer 41B, the carrier selection layer 46 blocks the electrons flowed from the blue light-emitting functional layer 5B to the carrier selection layer 46 and retains the electrons in the blue light-emitting functional layer 5B (carrier blocking operation). In other words, the carrier selection layer 46 performs an operation of suppressing a flow of the electrons (carriers) flowed from the blue light-emitting functional layer 5B.

According to the research of the inventor, it may be understood that, in the red light-emitting device (carrier selection layer excluding red light-emitting device) having the configuration where the carrier selection layer 46 is excluded from the light-emitting device 1R and the blue light-emitting functional layer 5B and the red light-emitting functional layer 5R are laminated to be in contact with each other, if a voltage is applied between the anode 3R and the cathode 8 included in the carrier selection layer excluding red light-emitting device, the electrons which are injected from the cathode 8 side to the blue light-emitting functional layer 5B may not be smoothly injected (supplied) into the red light-emitting functional layer 5R. Therefore, in the blue light-emitting functional layer 5B, since the holes and the electrons are recombined, the blue light-emitting functional layer 5B emits blue light, so that the chromatic purity of red of the carrier selection layer excluding red light-emitting device deteriorates. In addition, it may be understood that, the carrier selection layer excluding red light-emitting device, since the electrons which are injected from the cathode 8 side to the blue light-emitting functional layer 5B are not smoothly injected (supplied) into the red light-emitting functional layer 5R, the carrier balance of the electrons and the holes in the red light-emitting functional layer 5R is broken, so that the light-emitting efficiency deteriorates. In addition, it may be understood that, in the carrier selection layer excluding red light-emitting device, since the electrons which are injected from the cathode 8 side to the blue light-emitting functional layer 5B are not smoothly injected (supplied) into the red light-emitting functional layer 5R, the energy barrier of the cathode side interface of the red light-emitting functional layer 5R with respect to carriers is increased, so that the driving voltage is increased.

In this manner, in the carrier selection layer excluding red light-emitting device, there are problems of deterioration in the chromatic purity of red, deterioration in the light-emitting efficiency, and increase in the driving voltage. However, similarly to the light-emitting device 1R, the carrier selection layer 46 is configured to be interposed between the blue light-emitting functional layer 5B and the red light-emitting functional layer 5R, the electrons which are injected from the cathode 8 side to the blue light-emitting functional layer 5B may be smoothly injected (supplied) into the red light-emitting functional layer 5R without the electrons being retained in the blue light-emitting functional layer 5B, so that all the above problems are solved.

Similarly, in the green light-emitting device (carrier selection layer excluding green light-emitting device) having the configuration where the carrier selection layer 46 is excluded from the light-emitting device 1G and the blue light-emitting functional layer 5B and the green light-emitting functional layer 5G are laminated to be in contact with each other, the electrons which are injected from the cathode 8 side to the blue light-emitting functional layer 5B may not be smoothly injected (supplied) into the green light-emitting functional layer 5G. Therefore, there are problems of deterioration in the chromatic purity of green, deterioration in the light-emitting efficiency, and increase in the driving voltage. However, similarly to the light-emitting device 1G the carrier selection layer 46 is configured to be interposed between the blue light-emitting functional layer 5B and the green light-emitting functional layer 5G, the electrons which are injected from the cathode 8 side to the blue light-emitting functional layer 5B may be smoothly injected (supplied) into the green light-emitting functional layer 5G without the electrons being retained in the blue light-emitting functional layer 5B, so that all the above problems are solved.

In addition, in the embodiment, the hole transporting layer 43 and the blue light-emitting functional layer 5B may be formed by using a gas phase process. According to the research of the inventor, it may be understood that, in the blue light-emitting device having the configuration where a liquid phase process such as an ink jet method is used for forming at least one layer of the hole transporting layer 43 and the blue light-emitting functional layer 5B in the light-emitting device 1B, there are problems of deterioration in the light-emitting life time or the light-emitting efficiency in comparison with the light-emitting device 1B.

It is considered that contamination of at least one layer of the hole transporting layer 43 and the blue light-emitting functional layer 5B is a cause of the problems. In other words, similarly to the light-emitting device 1B, in the case where the hole transporting layer 43 and the blue light-emitting functional layer 5B are formed by using a gas phase process, the formation of the next blue light-emitting functional layer 5B is consecutively performed without the cathode side interface of the hole transporting layer 43 being exposed to the non-vacuum ambience. However, if a liquid phase process is used for forming at least one layer of the hole transporting layer 43 and the blue light-emitting functional layer 5B, it is difficult to perform the film formation using the liquid phase process in the vacuum ambience. Therefore, the formation using the liquid phase process is performed in the non-vacuum ambience (for example, atmosphere or nitrogen), so that at least the cathode 8 side interface of the hole transporting layer 43 is exposed to the non-vacuum ambience. In this manner, in the case where at least one layer of the hole transporting layer 43 and the blue light-emitting functional layer 5B is formed by using a liquid phase process, it is clear that the cathode 8 side interface of the hole transporting layer 43 is easily contaminated. In addition, in the case where the hole transporting layer 43 is formed by using a liquid phase process, since a solution where the hole transporting material is dissolved or dispersed in a solvent or a dispersion medium is used for the film formation, an infinitesimal amount of the solvent remains in the hole transporting layer 43, so that the entire hole transporting layer 43 may be contaminated. Similarly, in the case where the blue light-emitting functional layer 5B is formed by using a liquid phase process, an infinitesimal amount of the solvent remains in the blue light-emitting functional layer 5B, so that the entire blue light-emitting functional layer 5B may be contaminated.

On the contrary, similarly to the light-emitting device 1B, in the case where the hole transporting layer 43 and the blue light-emitting functional layer 5B are formed by using a gas phase process, the contamination of the hole transporting layer 43 and the blue light-emitting functional layer 5B may be avoided by forming at least one layer of the hole transporting layer 43 and the blue light-emitting functional layer 5B by using a liquid phase process. Therefore, by forming at least one layer of the hole transporting layer 43 and the blue light-emitting functional layer 5B by using a liquid phase process, all the problems of deterioration in the light-emitting life time or the light-emitting efficiency of the blue light-emitting device are solved.

In the embodiment, it is preferable that the hole injection layer 41 be configured by using an ion conductive hole injection material as a main constituent, and it is preferable that the first electron injection layer 61 is configured by using an electron injection material such as an alkali metal, an alkaline earth metal, or a compound thereof as a main constituent. In this case, in the light-emitting device 1B, if the electron injection material including in the first electron injection layer 61 is diffused into the hole transporting layer 43 side, the diffusion of the electron injection material into the hole transporting layer 43 causes the problems of deterioration in the electron blockability of the hole transporting layer 43 and deterioration in the light-emitting efficiency of the blue light-emitting functional layer 5B, and the diffusion of the electron injection material into the blue light-emitting functional layer 5B causes the problems of prevention of the light emission of the blue light-emitting functional layer 5B and deterioration in the light-emitting efficiency. However, in the embodiment, in the light-emitting device 1B, since the first electron injection layer 61 and the ion conductive hole injection layer 41B are in contact with each other, the electron injection material is intensely diffused into the hole injection layer 41B or adsorbed to the cathode 8 side interface of the hole injection layer 41B. Therefore, the diffusion of the electron injection material into the hole transporting layer 43 side is accurately suppressed or prevented, so that all the aforementioned problems caused by the diffusion of the electron injection material into the hole transporting layer 43 side are solved.

Third Embodiment

Electronic Apparatus

Figure 8:
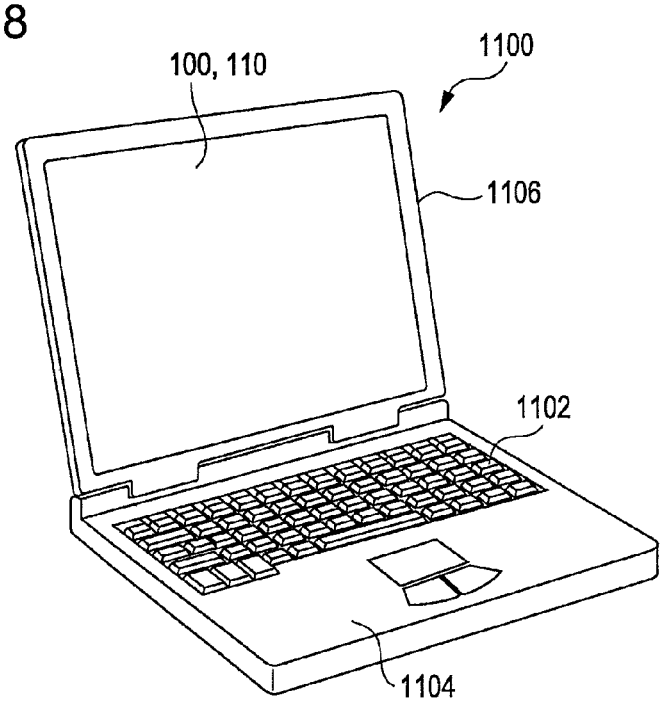
FIG. 8 is a perspective diagram illustrating a mobile type personal computer as an electronic apparatus according to a third embodiment.

FIG. 8 is a perspective diagram illustrating a configuration of a mobile type (or notebook type) personal computer as an electronic apparatus according to the invention.

The aforementioned display apparatus 100 (110) of the embodiments may be assembled in various types of the electronic apparatuses.

In FIG. 8, a personal computer 1100 is configured to include a main body unit 1104 having a keyboard 1102 and a display unit 1106 having a display portion. The display unit 1106 is rotatably supported through a hinge structure member with respect to the main body unit 1104.

In the personal computer 1100, the display portion included in the display unit 1106 is configured as the aforementioned display apparatus 100 (110).

Figure 9:
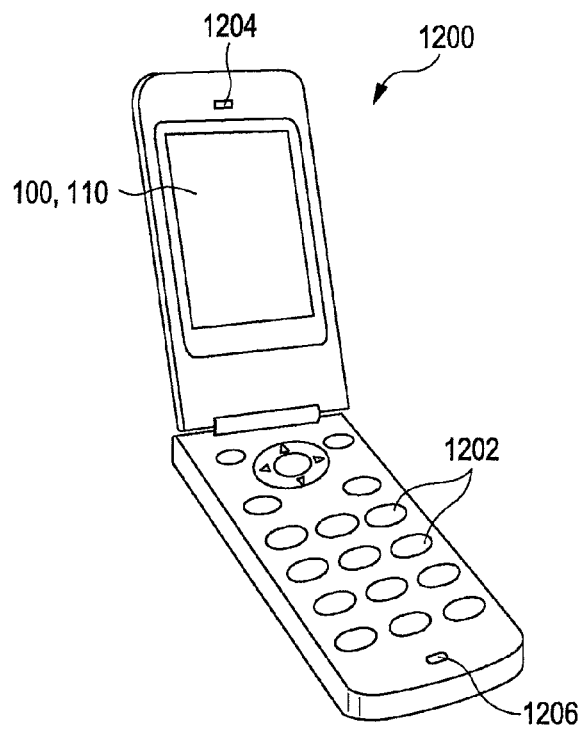
FIG. 9 is a perspective diagram illustrating a mobile phone as an electronic apparatus.

FIG. 9 is a perspective diagram illustrating a configuration of a mobile phone (including PHS) as an electronic apparatus according to the invention.

In FIG. 9, a mobile phone 1200 is configured to include a plurality of manipulation buttons 1202, an earpiece 1204, a mouthpiece 1206, and a display portion.

In the mobile phone 1200, the display portion is configured as the aforementioned display apparatus 100 (110).

Figure 10:
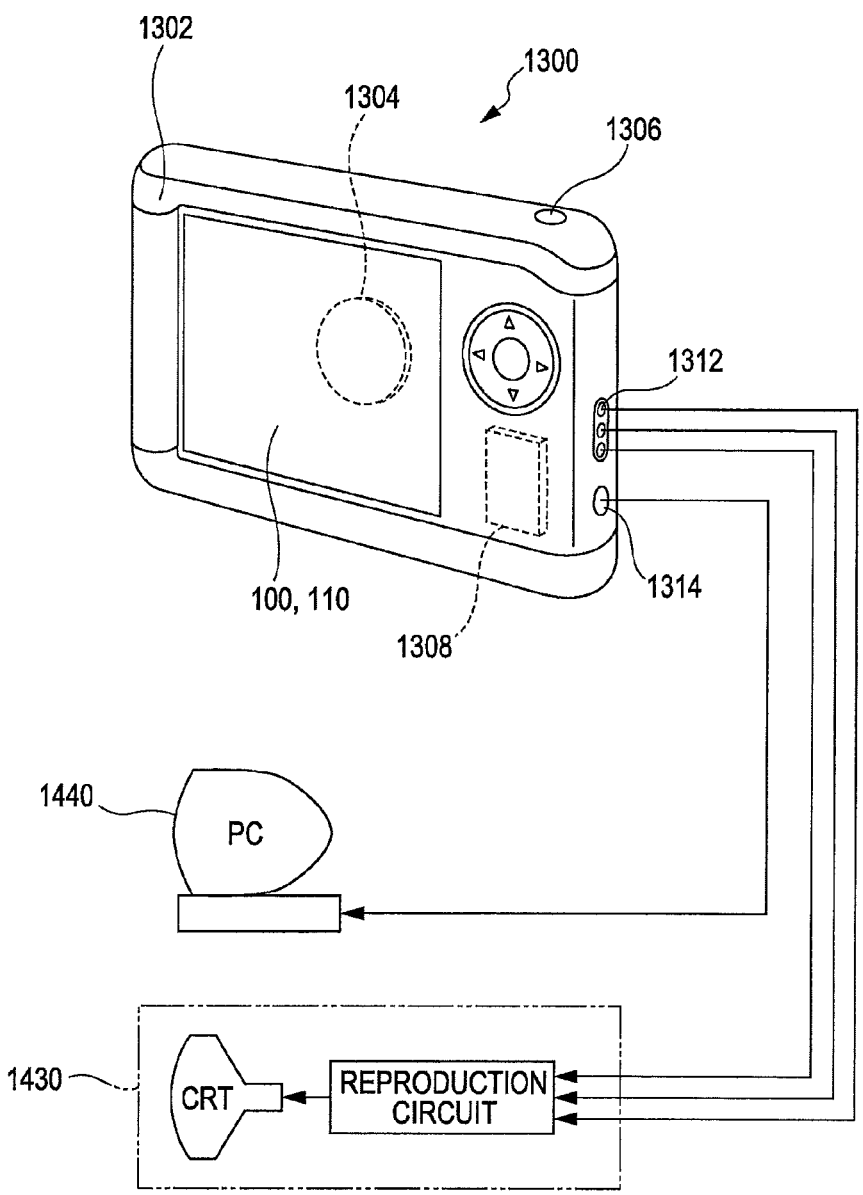
FIG. 10 is a perspective diagram illustrating a digital still camera as an electronic apparatus.

FIG. 10 is a perspective diagram illustrating a configuration of digital still camera as an electronic apparatus according to the invention. In addition, in this figure, connection to an external apparatus is also illustrated in a simplified manner.

Herein, in a general camera, a silver halide photographic film is photosensitized according to a light image of a subject. On the contrary, in the digital still camera 1300, a light image of a subject is photo-electrically converted by an imaging device such as a CCD (Charge Coupled Device), so that an imaging signal (image signal) is generated.

The display portion is installed on the rear surface of the casing (body) 1302 of the digital still camera 1300 and is configured to perform display based on the imaging signal generated by the CCD. The display portion has a function as a finder of displaying the subject as an electronic image.

In the digital still camera 1300, the display portion is configured as the aforementioned display apparatus 100 (110).

A circuit board 1308 is installed inside the casing. The circuit board 1308 includes a memory where the imaging signal may be stored therein.

In addition, a light-receiving 1304 including an optical lens (imaging optical system), CCD, and the like is installed on a front side (rear surface side in the configuration illustrated) of the casing 1302.

If a photographer pushes a shutter button 1306 while checking the subject image displayed on the display portion, the imaging signal of the CCD at the time is transmitted and stored in the memory of the circuit board 1308.

In addition, in the digital still camera 1300, a video signal output terminal 1312 and a data communication input/output terminal 1314 are disposed on the surface of the casing 1302. In addition, as illustrated, if necessary, a television monitor 1430 and a personal computer 1440 are connected to the video signal output terminal 1312 and the data communication input/output terminal 1314, respectively. In addition, the imaging signal stored in the memory of the circuit board 1308 is configured to be output to the television monitor 1430 or the personal computer 1440 according to predetermined manipulation.

In addition to the personal computer (mobile type personal computer) of FIG. 8, the mobile phone of FIG. 9, and the digital still camera of FIG. 10, for example, the electronic apparatuses according to the invention includes TVs, video cameras, view finder type monitors, direct-view type video tape recorders, laptop type personal computers, car navigation systems, pagers, electronic organizers (including communication functions), electronic dictionaries, electronic calculators, electronic game machines, word processors, workstations, videophones, TV monitors for security, electronic binoculars, POS terminals, apparatuses with a touch screen (for example, cash dispensers in banks and vending machines) medical instruments (for example, electronic thermometers, sphygmomanometers, blood glucose meters, electrocardiogram display apparatuses, ultrasonic diagnostic apparatuses, display apparatuses for endoscopes) fish finders, various measuring instruments, gauge meters (for example, gauge meters of vehicles, aircrafts, and ship), flight simulators, various monitors, and projection-type display apparatuses such as a projector. In addition, the display apparatus 100 (display panel 19) may also be used as a thin planar illumination apparatus.

Hereinbefore, although the light-emitting device, the display apparatus, and the electronic apparatus according to the invention are described based on the embodiments illustrated, the invention is not limited thereto.

For example, in the aforementioned embodiment, although description is made on the case where the display apparatus includes the red light-emitting device and the green light-emitting device as the light-emitting devices which emit light having a longer wavelength than blue light, the invention is not limited to this case. As a light-emitting device which emits light having a longer wavelength than blue light, a yellow light-emitting device or an orange light-emitting device may be included. In this case, the light-emitting device according to the invention may be adapted to the yellow light-emitting device and the orange light-emitting device.

EXAMPLES

Next, specific examples of the invention will be described.
1. Example of Manufacturing Display Apparatus (Light-Emitting Apparatus) and Light-Emitting Device Example 1

Figure 11:
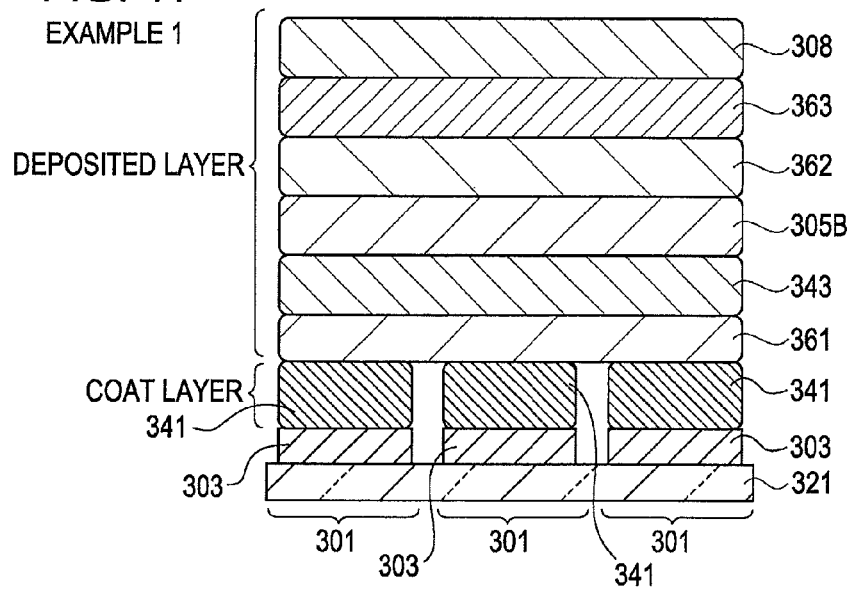
FIG. 11 is a schematic cross-sectional diagram illustrating a light-emitting device according to Example 1.

FIG. 11 is a schematic cross-sectional diagram illustrating the light-emitting apparatus according to Example 1 and corresponds to FIG. 3.

Example 1 is a specific performance result of the aforementioned first embodiment according to the invention.

<1> First, a transparent glass substrate having an average thickness of 1.0 mm is prepared as a substrate 321. Next, after an ITO film having an average thickness of 50 nm is formed on the substrate 321 by using a sputtering method, an ITO electrode (anode 303/individual electrode) is formed by patterning the ITO film by using a photolithography method.

Next, the substrate 321 where the anode 303 is formed is immersed in acetone, and 2-propanol sequentially, and after ultrasonic rinsing is performed, an oxygen plasma process is applied.

<2> Next, after an insulating layer made of an acryl-based resin is formed by using a spin coating method on the substrate 321 where the anode 303 is formed, the insulating layer is patterned by using a photolithography method so that the ITO electrode is exposed. As a result, a partition wall (bank) is formed. In addition, first, a plasma process using $O_2$ gas as a process gas is performed on the surface of the substrate 321 where the partition wall is formed. By doing so, the surface of the anode 303 and the surface (including the wall surface) of the partition wall are activated to have a lyophilic property. Subsequently, a plasma process using $CF_4$ as a process gas is performed on the surface of the substrate 321 where the partition wall is formed. Accordingly, $CF_4$ reacts with only the surface of the partition wall made of an acryl-based resin, so that the surface is allowed to have a lyophobic property.

<3> Next, an inner side of the partition wall located in the area where the light-emitting device 301 is to be formed is coated with 1.0 wt % PEDOT/PSS dispersed aqueous solution by using an ink jet method. In addition, after the coated PEDOT/PSS dispersed aqueous solution is dried, the substrate 321 is heated in the atmosphere, and ion conductive hole injection layer 341 including PEDOT/PSS and having an average thickness of 50 nm are formed on the anode 303.

<4> Next, a deposited layer containing Cs and having an average thickness of 0.2 nm formed by a vacuum deposition method using $Cs_2CO_3$ as a deposition source is formed on the hole injection layer 341 which is located in the area where the light-emitting device 301 is to be formed, and the deposited layer is used as a first electron injection layer 361.

Herein, the "film containing" Cs denotes a thin film containing at least a simple substance of Cs as a metal material constituting a Cs salt. Therefore, the metal containing layer may contain a metal salt as a deposition material. The inventor observes the following phenomena by a preliminary experiment separated performed and indirectly recognizes that the vacuum-deposited film is a film which is not made of only the Cs salt but contains a simple substance of Cs.

More specifically, it is recognized that, if the product where an Al deposited layer is laminated on the deposited layer formed by using $Cs_2CO_3$ as a deposition source is exposed to the atmosphere, the surface of Al is intensely impacted, significantly uneven portions occur on the surface. If $Cs_2CO_3$ is formed as a deposited layer, a great change does not occur in the laminated Al film. It is considered that this is because, since the deposited layer contains a simple substance of Cs, the portion of the simple substance of Cs is intensely oxidized or moisture-absorbed due to the exposure to the atmosphere.

<7> Next, a hole transporting layer 343 including α-NPD and having an average thickness of 10 nm is formed on the first electron injection layer 361 by using a vacuum deposition method.

<8> Next, a blue light-emitting functional layer 305B including a constituent material of the blue light-emitting functional layer listed hereinafter and having an average thickness of 20 nm is formed on the hole transporting layer 343 by using a vacuum deposition method.

Herein, with respect to the constituent material of the blue light-emitting functional layer 305B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer is set to be 5.0% by weight ratio to the host material.

<9> Next, an electron transporting layer 362 including tris(8-quinolinolato) aluminum (Alq3) and having an average thickness of 20 nm is formed on the blue light-emitting functional layer 305B by using a vacuum deposition method.

<10> Next, a second electron injection layer 363 including lithium fluoride (LiF) and having an average thickness of 1 nm is formed on the electron transporting layer 362 by using a vacuum deposition method.

<11> Next, a cathode 308 including Al and having an average thickness of 100 nm is formed on the second electron injection layer 363 by using a vacuum deposition method.

<12> Next, the resulting product is covered with a protection cover (sealing member) made of glass so as to cover the formed layers and fixed and sealed by an epoxy resin.

By the processes described hereinbefore, a bottom emission structure display apparatus illustrated in FIG. 11 is manufactured.

Comparative Example 1

Comparative Example 1 is configured by omitting the first electron injection layer 361 in Example 1.
2. Evaluation With respect to the display apparatus and the light-emitting device of Example 1 and Comparative Example 1, constant current is allowed to be flowed to the light-emitting device so that luminance is 1000 cd/m$^2$, and the current efficiency of light emitted from the light-emitting device is measured.

In addition, with respect to the display apparatus and the light-emitting device of each Example and each Comparative Example, constant current is allowed to be flowed to the light-emitting device so that initial luminance is 1000 cd/m$^2$, and the time (LT80) taken until the luminance becomes 80% of the initial luminance is measured.

As a result, the current efficiency of Example 1 is 1.03 times larger than the current efficiency of Comparative Example 1. In addition, the life time (LT80) of Example 1 is 1.06 times longer than the life time (LT80) of Comparative Example 1.

In this manner, the first electron injection layer 361 is inserted between the hole injection layer 341 and the hole transporting layer 343, so that the amount of holes transported to the hole injection layer is adjusted. As a result, it is recognized that the carrier balance is improved, the current efficiency is improved, and the life time is increased.

Example 2

Figure 12:
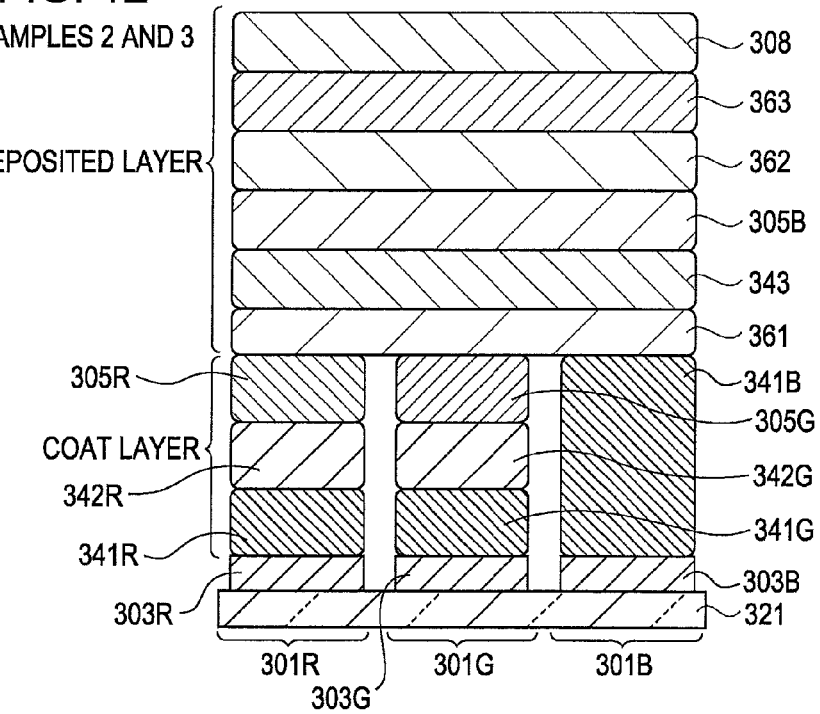
FIG. 12 is a schematic cross-sectional diagram illustrating a light-emitting device according to Example 2.

FIG. 12 is a schematic cross-sectional diagram illustrating the light-emitting apparatus according to Example 1 and corresponds to FIG. 5.

Example 2 is a specific performance result of the aforementioned second embodiment according to the invention.

<1> First, a transparent glass substrate having an average thickness of 1.0 mm is prepared as a substrate 321. Next, after an ITO film having an average thickness of 50 μm is formed on the substrate 321 by using a sputtering method, ITO electrodes (anodes 303R, 303G, and 303B/individual electrodes) are formed by patterning the ITO film by using a photolithography method.

Next, the substrate 321 where the anodes 303R, 303G, and 303B are formed is immersed in acetone, and 2-propanol sequentially, and after ultrasonic rinsing is performed, an oxygen plasma process is applied.

<2> Next, after an insulating layer made of an acryl-based resin is formed by using a spin coating method on the substrate 321 where the anodes 303R, 303G, and 303B are formed, the insulating layer is patterned by using a photolithography method so that the ITO electrode is exposed. As a result, a partition wall (bank) is formed. In addition, first, a plasma process using O$_2$ gas as a process gas is performed on the surface of the substrate 321 where the partition wall is formed. By doing so, the surfaces of the anodes 303R, 303G, and 303B and the surface (including the wall surface) of the partition wall are activated to have a lyophilic property. Subsequently, a plasma process using CF$_4$ as a process gas is performed on the surface of the substrate 321 where the partition wall is formed. Accordingly, CF$_4$ reacts with only the surface of the partition wall made of an acryl-based resin, so that the surface is allowed to have a lyophobic property.

<3A> Next, an inner side of the partition wall located in the area where the red light-emitting device 301R is to be formed the area is coated with 1.0 wt % PEDOT/PSS dispersed aqueous solution by using an ink jet method.

<3B> Next, an inner side of the partition wall located in the area where the green light-emitting device 301G is to be formed the area is coated with 1.0 wt % PEDOT/PSS dispersed aqueous solution by using an ink jet method.

<3C> Next, an inner side of the partition wall located in the area where the blue light-emitting device 301B is to be formed the area is coated with 1.0 wt % PEDOT/PSS dispersed aqueous solution by using an ink jet method.

<3D> Next, after the PEDOT/PSS dispersed aqueous solutions which are coated by the respective processes 3A, 3B, and 3C are dried, the substrate 321 is heated in the atmosphere, and ion conductive hole injection layers 341R, 341G, and 341B including PEDOT/PSS and having an average thickness of 50 nm are formed on the anodes 303R, 303G, and 303B, respectively.

<4A> Next, an inner side of the partition wall located in the area where the red light-emitting device 301R is to be formed the area is coated with 1.5 wt % tetramethyl benzene solution of the compound expressed by the aforementioned general formula (16) by using an ink jet method.

<4B> Next, an inner side of the partition wall located in the area where the green light-emitting device 301G is to be formed the area is coated with 1.5 wt % tetramethyl benzene solution of the compound expressed by the aforementioned general formula (16) by using an ink jet method.

<4C> Next, after the tetramethyl benzene solutions of the compound expressed by the aforementioned general formula (16) which is coated by the respective processes 4A and 4B are dried, the substrate 321 is heated in nitrogen ambience. In addition, the area of the substrate 321 where the red light-emitting device 301R and the green light-emitting device 301G are to be Banned is rinsed with xylene. Accordingly, intermediate layers 342R and 342G including the compound expressed by the aforementioned general formula (16) having an average thickness of 10 nm are formed on the hole injection layers 341R and 341G, respectively.

<5A> Next, an inner side of the partition wall located in the area where the red light-emitting device 301R is to be formed the area is coated with 1.2 wt % tetramethyl benzene solution of the compound expressed by the aforementioned general formula (17) by using an ink jet method.

<5B> Next, an inner side of the partition wall located in the area where the green light-emitting device 301G is to be formed the area is coated with 1.2 wt % tetramethyl benzene solution of the compound expressed by the aforementioned general formula (19) by using an ink jet method.

<5C> Next, after the tetramethyl benzene solution of the compound expressed by the aforementioned general formula (17) and the tetramethyl benzene solution of the compound expressed by the aforementioned general formula (19) which are coated by respective processes 5A and 5B are dried, the substrate 321 is heated in nitrogen ambience. Accordingly, a red light-emitting functional layer 305R including the compound expressed by the aforementioned general formula (17) having an average thickness of 60 nm and a green light-emitting functional layer 305G including the compound expressed by the aforementioned general formula (19) having an average thickness of 60 nm are formed on the intermediate layers 342R and 342G, respectively.

<6> Next, a deposited layer containing Cs and having an average thickness of 0.5 nm formed by a vacuum deposition method using $Cs_2CO_3$ as a deposition source is formed on each of the red light-emitting functional layer 305R, the green light-emitting functional layer 305G, and the hole injection layer 341B which are located in the area where the red light-emitting device 301R is to be formed the area, the area where the green light-emitting device 301G is to be formed the area, and the area where the blue light-emitting device 301B is to be formed the area, and the deposited layer is used as a first electron injection layer 361.

Herein, the "film containing" Cs denotes a thin film containing at least a simple substance of Cs as a metal material constituting a Cs salt. Therefore, the metal containing layer may contain a metal salt as a deposition material. The inventor observes the following phenomena by a preliminary experiment separated performed and indirectly recognizes that the vacuum-deposited film is a film which is not made of only the Cs salt but contains a simple substance of Cs.

More specifically, it is recognized that, if the product where an Al deposited layer is laminated on the deposited layer formed by using $Cs_2CO_3$ as a deposition source is exposed to the atmosphere, the surface of Al is intensely impacted, significantly uneven portions occur on the surface. If $Cs_2CO_3$ is formed as a deposited layer, a great change does not occur in the laminated Al film. It is considered that this is because, since the deposited layer contains a simple substance of Cs, the portion of the simple substance of Cs is intensely oxidized or moisture-absorbed due to the exposure to the atmosphere.

<7> Next, a hole transporting layer 343 including α-NPD and having an average thickness of 10 nm is formed on the first electron injection layer 361 by using a vacuum deposition method.

<8> Next, a blue light-emitting functional layer 305B including a constituent material of the blue light-emitting functional layer listed hereinafter and having an average thickness of 20 nm is formed on the hole transporting layer 343 by using a vacuum deposition method.

Herein, with respect to the constituent material of the blue light-emitting functional layer 305B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer is set to be 5.0% by weight ratio to the host material.

<9> Next, an electron transporting layer 362 including tris(8-quinolinolato) aluminum (Alq3) and having an average thickness of 20 nm is formed on the blue light-emitting functional layer 305B by using a vacuum deposition method.

<10> Next, a second electron injection layer 363 including lithium fluoride (LiF) and having an average thickness of 1 nm is formed on the electron transporting layer 362 by using a vacuum deposition method.

<11> Next, a cathode 308 including Al and having an average thickness of 100 nm is formed on the second electron injection layer 363 by using a vacuum deposition method.

<12> Next, the resulting product is covered with a protection cover (sealing member) made of glass so as to cover the formed layers and fixed and sealed by an epoxy resin.

By the processes described hereinbefore, a bottom emission structure display apparatus illustrated in FIG. 12 is manufactured.

Example 3

Example 3 is a specific performance result of the aforementioned second embodiment according to the invention.

A bottom emission structure display apparatus illustrated in FIG. 12 is manufactured in the same processes as those of Example 2 except that the aforementioned processes <5A>, <5B>, <5C>, <7>, <8>, and <9> of Example 2 are replaced with the following processes <5A'>, <5B'>, <5C'>, <7'>, <8'>, and <9'>.

<5A'> Next, an inner side of the partition wall located in the area where the red light-emitting device 301R is to be formed the area is coated with 1.2 wt % tetramethyl benzene solution of the compound expressed by the aforementioned general formula (18) by using an ink jet method.

<5B'> Next, an inner side of the partition wall located in the area where the green light-emitting device 301G is to be formed the area is coated with 1.2 wt % tetramethyl benzene solution of the compound expressed by the aforementioned general formula (20) by using an ink jet method.

<5C'> Next, after the tetramethyl benzene solution of the compound expressed by the aforementioned general formula (18) and the tetramethyl benzene solution of the compound expressed by the aforementioned general formula (20) which are coated by the respective processes 5A and 5B are dried, the substrate 321 is heated in nitrogen ambience. Accordingly, a red light-emitting functional layer 305R including the compound expressed by the aforementioned general formula (18) and having an average thickness of 50 mm and a green light-emitting functional layer 305G including the compound expressed by the aforementioned general formula (20) and having an average thickness of 50 nm are formed on the intermediate layers 342R and 342 respectively.

<7'> Next, a hole transporting layer 343 including the compound expressed by the aforementioned formula (6) and having an average thickness of 10 nm is formed on the first electron injection layer 361 by using a vacuum deposition method.

<8'> Next, a blue light-emitting functional layer 305B including a constituent material of the blue light-emitting functional layer listed hereinafter and having an average thickness of 10 nm is formed on the hole transporting layer 343 by using a vacuum deposition method.

Herein, with respect to the constituent material of the blue light-emitting functional layer 305B, the compound expressed by the aforementioned formula (10) is used as a host material, and the compound expressed by the aforementioned formula (12) is used as a guest material. In addition, a containing amount (doping concentration) of the guest material (dopant) in the blue light-emitting functional layer is set to be 5.0% by weight ratio to the host material.

<9'> Next, an electron transporting layer 362 including the compound expressed by the aforementioned formula (14) and having an average thickness of 30 nm is formed on the blue light-emitting functional layer 305B by using a vacuum deposition method.

Comparative Example 21

Figure 13:
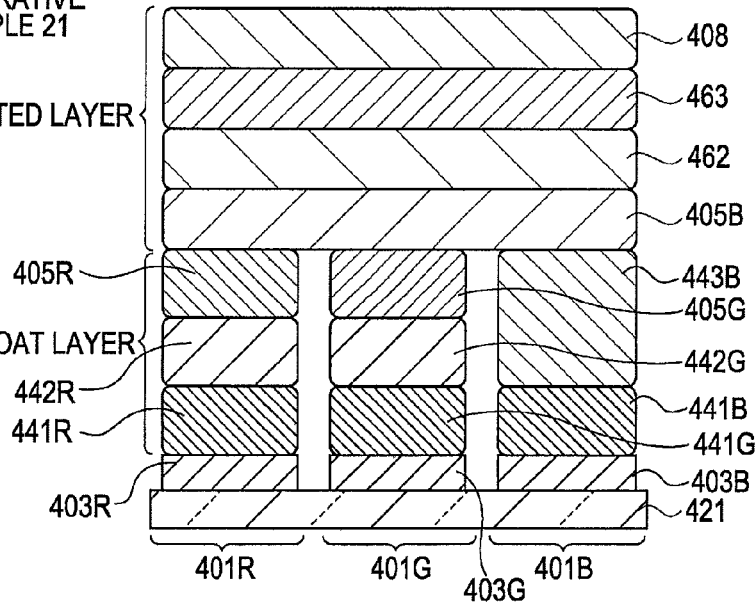
FIG. 13 is a schematic cross-sectional diagram illustrating a light-emitting device according to Comparative Example 21.

FIG. 13 is a schematic cross-sectional diagram illustrating the light-emitting apparatus according to Comparative Example 21 and corresponds to FIG. 12.

<1> First, a transparent glass substrate having an average thickness of 1.0 mm is prepared as a substrate 421. Next, after an ITO film having an average thickness of 50 nm is formed on the substrate 421 by using a sputtering method, ITO electrodes (anodes 403R, 403G, and 403B/individual electrodes) are formed by patterning the ITO film by using a photolithography method.

Next, the substrate 421 where the anodes 403R, 403G, and 403B are formed is immersed in acetone and 2-propanol sequentially, and after ultrasonic rinsing is performed, an oxygen plasma process is applied.

<2> Next, after an insulating layer made of an acryl-based resin is formed by using a spin coating method on the substrate 421 where the anodes 403R, 403G, and 403B are formed, the insulating layer is patterned by using a photolithography method so that the ITO electrodes are exposed. As a result, a partition wall is formed. In addition, a plasma process using $O_2$ gas as a process gas is performed on the surface of the substrate 421 where the partition wall is formed. By doing so, the surfaces of the anodes 403R, 403G, and 403B and the surface (including the wall surface) of the partition wall are activated to have a lyophilic property. Subsequently, a plasma process using $CF_4$ as a process gas is performed on the surface of the substrate 421 where the partition wall is formed. Accordingly, $CF_4$ reacts with only the surface of the partition wall made of an acryl-based resin, so that the surface is allowed to have a lyophobic property.

<3A> Next, an inner side of the partition wall located in the area where the red light-emitting device 401R is to be formed is coated with 1.0 wt % PEDOT/PSS dispersed aqueous solution by using an ink jet method.

<3B> Next, an inner side of the partition wall located in the area where the green light-emitting device 401G is to be formed is coated with 1.0 wt % PEDOT/PSS dispersed aqueous solution by using an ink jet method.

<3C> Next, an inner side of the partition wall located in the area where the blue light-emitting device 401B is to be formed is coated with 1.0 wt % PEDOT/PSS dispersed aqueous solution by using an ink jet method.

<3D> Next, after the PEDOT/PSS dispersed aqueous solutions which are coated by the respective processes 3A, 3B, and 3C are dried, the substrate 421 is heated in the atmosphere, and ion conductive hole injection layers 441R, 441G, and 441B including PEDOT/PSS and having an average thickness of 50 nm are formed on the anodes 403R, 403G, and 403B, respectively.

<4A> Next, an inner side of the partition wall located in the area where the red light-emitting device 401R is to be formed is coated with 1.5 wt % tetramethyl benzene solution of the compound expressed by the aforementioned general formula (16) by using an ink jet method.

<4B> Next, an inner side of the partition wall located in the area where the green light-emitting device 401G is to be formed is coated with 1.5 wt % tetramethyl benzene solution of the compound expressed by the aforementioned general formula (16) by using an ink jet method.

<4C> Next, the tetramethyl benzene solutions of the compound expressed by the aforementioned general formula (16) which are coated by the respective processes 4A and 4B are dried, the substrate 421 is heated in nitrogen ambience. In addition, the areas of the substrate 421 where the red light-emitting device 401R and the green light-emitting device 401G are to be formed are rinsed with xylene. Accordingly, intermediate layers 442R and 442G including the compound expressed by the aforementioned general formula (16) having an average thickness of 10 nm are formed on the hole injection layers 441R and 441G, respectively.

<5A> Next, an inner side of the partition wall located in the area where the red light-emitting device 401R is to be formed is coated with 1.2 wt % tetramethyl benzene solution of the compound expressed by the aforementioned general formula (17) by using an ink jet method.

<5B> Next, an inner side of the partition wall located in the area where the green light-emitting device 401G is to be formed is coated with 1.2 wt % tetramethyl benzene solution of the compound expressed by the aforementioned general formula (19) by using an ink jet method.

<5C> Next, an inner side of the partition wall located in the area where the blue light-emitting device 401B is to be formed is coated with 1.0 wt % tetralin solution of α-NPD by using an ink jet method.

<5D> Next, after the tetramethyl benzene solution of the compound expressed by the aforementioned general formula (17), the tetramethyl benzene solution of the compound expressed by the aforementioned general formula (19), and the tetralin solution of α-NPD which are coated by the respective processes 5A, 5B, and 5C are dried, the substrate 421 is heated in nitrogen ambience. Accordingly, a red light-emitting functional layer 405R including the compound expressed by the aforementioned general formula (17) having an average thickness of 60 nm and a green light-emitting functional layer 405G including the compound expressed by the aforementioned general formula (19) having an average thickness of 60 nm are formed on the intermediate layers 442R and 442G, respectively. In addition, a hole transporting layer 443B including α-NPD and having an average thickness of 10 nm is formed on the hole injection layer 441B.

<6> Next, a blue light-emitting functional layer 405B including a constituent material listed hereinafter and having an average thickness of 20 nm is formed by using a vacuum deposition method on each of the red light-emitting functional layer 405R, the green light-emitting functional layer 405G, and the hole transporting layer 443B which are located in the area where the red light-emitting device 401R is to be formed, the area where the green light-emitting device 401G is to be formed, and the area where the blue light-emitting device 401B is to be formed.

Herein, with respect to the constituent material of the blue light-emitting functional layer 405B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer 405B is set to be 5.0% by weight ratio to the host material.

<7> Next, an electron transporting layer 462 including tris(8-quinolinolato) aluminum (Alq3) and having an average thickness of 20 nm is formed on the blue light-emitting functional layer 405B by using a vacuum deposition method.

<8> Next, a second electron injection layer 463 including lithium fluoride (LiF) and having an average thickness of 1 nm is formed on the electron transporting layer 462 by using a vacuum deposition method.

<9> Next, a cathode 408 including Al and having an average thickness of 100 nm is formed on the second electron injection layer 463 by using a vacuum deposition method.

<10> Next, the resulting product is covered with a protection cover (sealing member) made of glass so as to cover the formed layers and fixed and sealed by an epoxy resin.

By the processes described hereinbefore, a bottom emission structure display apparatus illustrated in FIG. 13 is manufactured where the formation of the first electron injection layer 361 is omitted and a hole transporting layer 443B is formed instead of the formation of the hole transporting layer 343 in Example 2.

Comparative Example 22

Figure 14:
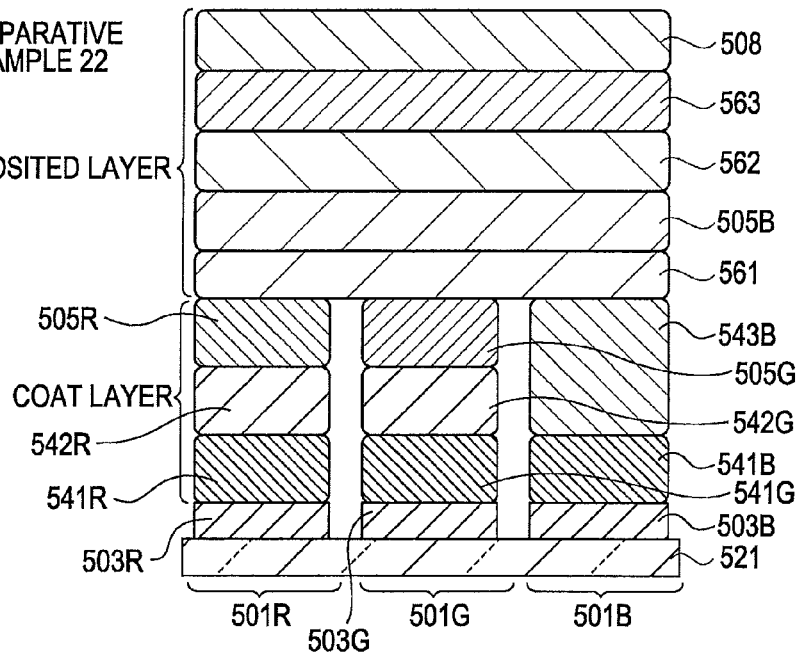
FIG. 14 is a schematic cross-sectional diagram illustrating a light-emitting device according to Comparative Example 22.

FIG. 14 is a schematic cross-sectional diagram illustrating the light-emitting apparatus according to Comparative Example 22 and corresponds to FIG. 12.

<1> First, a transparent glass substrate having an average thickness of 1.0 mm is prepared as a substrate 521. Next, after an ITO film having an average thickness of 50 nm is Ruined on the substrate 521 by using a sputtering method, ITO electrodes (anodes 503R, 503G, and 503B/individual electrodes) are formed by patterning the ITO film by using a photolithography method.

Next, the substrate 521 where the anodes 503R, 503G, and 503B are formed is immersed in acetone and 2-propanol sequentially, and after ultrasonic rinsing is performed, an oxygen plasma process is applied.

<2> Next, after an insulating layer made of an acryl-based resin is formed by using a spin coating method on the substrate 521 where the anodes 503R, 503G, and 503B are formed, the insulating layer is patterned by using a photolithography method so that the ITO electrodes are exposed. As a result, a partition wall is formed. In addition, a plasma process using $O_2$ gas as a process gas is performed on the surface of the substrate 521 where the partition wall is formed. By doing so, the surfaces of the anodes 503R, 503G, and 503B and the surface (including the wall surface) of the partition wall are activated to have a lyophilic property. Subsequently, a plasma process using $CF_4$ as a process gas is performed on the surface of the substrate 521 where the partition wall is formed. Accordingly, $CF_4$ reacts with only the surface of the partition wall made of an acryl-based resin, so that the surface is allowed to have a lyophobic property.

<3A> Next, an inner side of the partition wall located in the area where the red light-emitting device 501R is to be formed is coated with 1.0 wt % PEDOT/PSS dispersed aqueous solution by using an ink jet method.

<3B> Next, an inner side of the partition wall located in the area where the green light-emitting device 501G is to be formed is coated with 1.0 wt % PEDOT/PSS dispersed aqueous solution by using an ink jet method.

<3C> Next, an inner side of the partition wall located in the area where the blue light-emitting device 501B is to be formed is coated with 1.0 wt % PEDOT/PSS dispersed aqueous solution by using an ink jet method.

<3D> Next, after the PEDOT/PSS dispersed aqueous solutions which are coated by the respective processes 3A, 3B, and 3C are dried, the substrate 521 is heated in the atmosphere, and ion conductive hole injection layers 541R, 541G, and 541B including PEDOT/PSS and having an average thickness of 50 nm are formed on the anodes 503R, 5036, and 503B, respectively.

<4A> Next, an inner side of the partition wall located in the area where the red light-emitting device 501R is to be formed is coated with 1.5 wt % tetramethyl benzene solution of the compound expressed by the aforementioned general formula (16) by using an ink jet method.

<4B> Next, an inner side of the partition wall located in the area where the green light-emitting device 501G is to be formed is coated with 1.5 wt % tetramethyl benzene solution of the compound expressed by the aforementioned general formula (16) by using an ink jet method.

<4C> Next, after the tetramethyl benzene solutions of the compound expressed by the aforementioned general formula (16) which are coated by the respective processes 4A and 4B are dried, the substrate 521 is heated in nitrogen ambience. In addition, the areas of the substrate 521 where the red light-emitting device 501R and the green light-emitting device 501G are to be formed are rinsed with xylene. Accordingly, the intermediate layers 542R and 542G including the compound expressed by the aforementioned general formula (16) having an average thickness of 10 nm are formed on the hole injection layers 541R and 541G, respectively.

<5A> Next, an inner side of the partition wall located in the area where the red light-emitting device 501R is to be knitted is coated with 1.2 wt % tetramethyl benzene solution of the compound expressed by the aforementioned general formula (17) by using an ink jet method.

<5B> Next, an inner side of the partition wall located in the area where the green light-emitting device 501G is to be formed is coated with 1.2 wt % tetramethyl benzene solution of the compound expressed by the aforementioned general formula (19) by using an ink jet method.

<5C> Next, an inner side of the partition wall located in the area where the blue light-emitting device 501B is to be formed is coated with 1.0 wt % tetralin solution of α-NPD by using an ink jet method.

<5D> Next, after the tetramethyl benzene solution of the compound expressed by the aforementioned general formula (17), the tetramethyl benzene solution of the compound expressed by the aforementioned general formula (19), and the tetralin solution of α-NPD which are coated by the respective processes 5A, 5B, and 5C are dried, the substrate 521 is heated in nitrogen ambience. Accordingly, a red light-emitting functional layer 505R including the compound expressed by the aforementioned general formula (17) and having an average thickness of 60 nm and a green light-emitting functional layer 505G including the compound expressed by the aforementioned general formula (19) and having an average thickness of 60 nm are formed on the intermediate layers 542R and 542G, respectively. In addition, a hole transporting layer 543B including α-NPD and having an average thickness of 10 nm is formed on the hole injection layer 541B.

<6> Next, a deposited layer including Cs and having an average thickness of 0.5 nm formed by a vacuum deposition method using $Cs_2CO_3$ as a deposition source is formed on each of the red light-emitting functional layer 505R, the green light-emitting functional layer 505G, and the hole transporting layer 543B which are located in the area where the red light-emitting device 501R is to be formed, the area where the green light-emitting device 501G is to be formed, and the area where the blue light-emitting device 501B is to be formed, and the deposited layer is used as a first electron injection layer 561.

<7> Next, a blue light-emitting functional layer 505B including a constituent material listed hereinafter and having an average thickness of 20 nm is formed on the first electron injection layer 561 by using a vacuum deposition method.

Herein, with respect to the constituent material of the blue light-emitting functional layer 505B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer 505B is set to be 5.0% by weight ratio to the host material.

<8> Next, an electron transporting layer 562 including tris(8-quinolinolato) aluminum (Alq3) and having an average thickness of 20 nm is formed on the blue light-emitting functional layer 505B by using a vacuum deposition method.

<9> Next, a second electron injection layer 563 including lithium fluoride (LiF) and having an average thickness of 1 nm is formed on the electron transporting layer 562 by using a vacuum deposition method.

<10> Next, a cathode 508 including Al and having an average thickness of 100 nm is formed on the second electron injection layer 563 by using a vacuum deposition method.

<11> Next, the resulting product is covered with a protection cover (sealing member) made of glass so as to cover the formed layers and fixed and sealed by an epoxy resin.

By the processes described hereinbefore, a bottom emission structure display apparatus illustrated in FIG. 14 is manufactured where a hole transporting layer 543B is formed instead of the formation of the hole transporting layer 343 in Example 1.

Comparative Example 23

Figure 15:
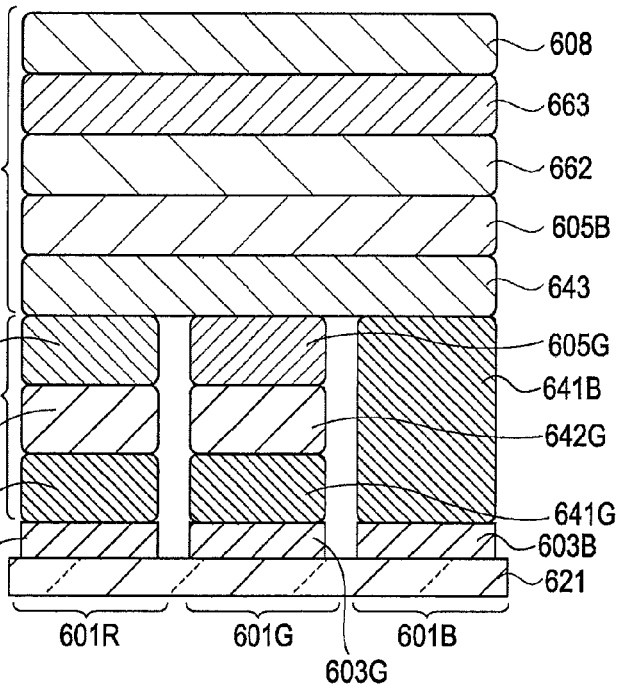
FIG. 15 is a schematic cross-sectional diagram illustrating a light-emitting device according to Comparative Example 23.

FIG. 15 is a schematic cross-sectional diagram illustrating the light-emitting apparatus according to Comparative Example 23 and corresponds to FIG. 12.

<1> First, a transparent glass substrate having an average thickness of 1.0 mm is prepared as a substrate 621. Next, after an ITO film having an average thickness of 50 nm is formed on the substrate 621 by using a sputtering method, ITO electrodes (anodes 603R, 603G, and 603B/individual electrodes) are formed by patterning the ITO film by using a photolithography method.

Next, the substrate 621 where the anodes 603R, 603G, and 603B are formed is immersed in acetone and 2-propanol sequentially, and after ultrasonic rinsing is performed, an oxygen plasma process is applied.

<2> Next, after an insulating layer made of an acryl-based resin is formed by using a spin coating method on the substrate 621 where the anodes 603R, 603G, and 603B are formed, the insulating layer is patterned by using a photolithography method so that the ITO electrodes are exposed. As a result, a partition wall is formed. In addition, a plasma process using $O_2$ gas as a process gas is performed on the surface of the substrate 621 where the partition wall is formed. By doing so, the surfaces of the anodes 603R, 603G, and 603B and the surface (including the wall surface) of the partition wall are activated to have a lyophilic property. Subsequently, a plasma process using $CF_4$ as a process gas is performed on the surface of the substrate 621 where the partition wall is formed. Accordingly, $CF_4$ reacts with only the surface of the partition wall made of an acryl-based resin, so that the surface is allowed to have a lyophobic property.

<3A> Next, an inner side of the partition wall located in the area where the red light-emitting device 601R is to be formed is coated with 1.0 wt % PEDOT/PSS dispersed aqueous solution by using an ink jet method.

<3B> Next, an inner side of the partition wall located in the area where the green light-emitting device 601G is to be formed is coated with 1.0 wt % PEDOT/PSS dispersed aqueous solution by using an ink jet method.

<3C> Next, an inner side of the partition wall located in the area where the blue light-emitting device 601B is to be formed is coated with 1.0 wt % PEDOT/PSS dispersed aqueous solution by using an ink jet method.

<3D> Next, after the PEDOT/PSS dispersed aqueous solutions which are coated by the respective processes 3A, 3B, and 3C are dried, the substrate 621 is heated in the atmosphere, and ion conductive hole injection layers 641R, 641G, and 641B including PEDOT/PSS and having an average thickness of 50 nm are formed on the anodes 603R, 603G, and 603B, respectively.

<4A> Next, an inner side of the partition wall located in the area where the red light-emitting device 601R is to be formed is coated with 1.5 wt % tetramethyl benzene solution of the compound expressed by the aforementioned general formula (16) by using an ink jet method.

<4B> Next, an inner side of the partition wall located in the area where the green light-emitting device 601G is to be formed is coated with 1.5 wt % tetramethyl benzene solution of the compound expressed by the aforementioned general formula (16) by using an ink jet method.

<4C> Next, after the tetramethyl benzene solutions of the compound expressed by the aforementioned general formula (16) which are coated by the respective processes 4A and 4B are dried, the substrate 621 is heated in nitrogen ambience. In addition, the areas of the substrate 621 where the red light-emitting device 601R and the green light-emitting device 601G are to be formed are rinsed with xylene. Accordingly, the intermediate layers 642R and 642G including the compound expressed by the aforementioned general formula (16) and having an average thickness of 10 nm are formed on the hole injection layers 641R and 641G, respectively.

<5A> Next, an inner side of the partition wall located in the area where the red light-emitting device 601R is to be formed is coated with 1.2 wt % tetramethyl benzene solution of the compound expressed by the aforementioned general formula (17) by using an ink jet method.

<5B> Next, an inner side of the partition wall located in the area where the green light-emitting device 601G is to be formed is coated with 1.2 wt % tetramethyl benzene solution of the compound expressed by the aforementioned general formula (19) by using an ink jet method.

<5C> Next, after the tetramethyl benzene solution of the compound expressed by the aforementioned general formula (17) and the tetramethyl benzene solution of the compound expressed by the aforementioned general formula (19) which are coated by the respective processes 5A and 5B are dried, the substrate 621 is heated in nitrogen ambience. Accordingly, a red light-emitting functional layer 605R including the compound expressed by the aforementioned general formula (17) and having an average thickness of 60 nm and a green light-emitting functional layer 605G including the compound expressed by the aforementioned general formula (19) and having an average thickness of 60 nm are formed on the intermediate layers 642R and 642G, respectively.

<6> Next, a hole transporting layer 643 including α-NPD and having an average thickness of 10 nm is formed by using a vacuum deposition method on each of the red light-emitting functional layer 605R, the green light-emitting functional layer 605G, and the hole injection layer 641B which are located in the area where the red light-emitting device 601R is to be formed, the area where the green light-emitting device 601G is to be formed, and the area where the blue light-emitting device 601B is to be formed.

<7> Next, a blue light-emitting functional layer 605B including a constituent material of the blue light-emitting functional layer listed hereinafter and having an average thickness of 20 nm is formed on the hole transporting layer 643 by using a vacuum deposition method.

Herein, with respect to the constituent material of the blue light-emitting functional layer 605B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer is set to be 5.0% by weight ratio to the host material.

<8> Next, an electron transporting layer 662 including tris(8-quinolinolato) aluminum (Alq3) and having an average thickness of 20 nm is formed on the blue light-emitting functional layer 605B by using a vacuum deposition method.

<9> Next, a second electron injection layer 663 including lithium fluoride (LiF) and having an average thickness of 1 nm is formed on the electron transporting layer 662 by using a vacuum deposition method.

<10> Next, a cathode 608 including Al and having an average thickness of 100 nm is formed on the second electron injection layer 663 by using a vacuum deposition method.

<11> Next, the resulting product is covered with a protection cover (sealing member) made of glass so as to cover the formed layers and fixed and sealed by an epoxy resin.

By the processes described hereinbefore, a bottom emission structure display apparatus illustrated in FIG. 15 is manufactured where the formation of the first electron injection layer 361 in Example 2 is omitted.

Comparative Example 24R

Figure 16:
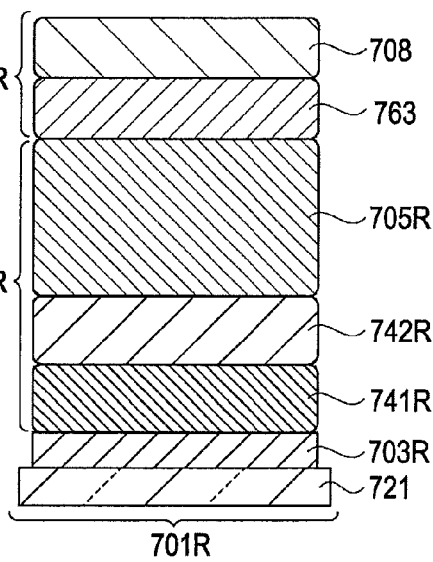
FIG. 16 is a schematic cross-sectional diagram illustrating a red light-emitting device according to Comparative Example 24R.

FIG. 16 is a schematic cross-sectional diagram illustrating the light-emitting apparatus according to Comparative Example 24R and corresponds to the red light-emitting device 301R of FIG. 12.

<1> First, a transparent glass substrate having an average thickness of 1.0 mm is prepared as a substrate 721. Next, after an ITO film having an average thickness of 50 nm is formed on the substrate 721 by using a sputtering method, an ITO electrode (anode 703R) is formed by patterning the ITO film by using a photolithography method.

Next, the substrate 721 where the anode 703R is formed is immersed in acetone and 2-propanol sequentially, and after ultrasonic rinsing is performed, an oxygen plasma process is applied.

<2> Next, after an insulating layer made of an acryl-based resin is formed by using a spin coating method on the substrate 721 where the anode 703R is formed, the insulating layer is patterned by using a photolithography method so that the ITO electrode is exposed. As a result, a partition wall (bank) is formed. In addition, a plasma process using $O_2$ gas as a process gas is performed on the surface of the substrate 721 where the partition wall is formed. By doing so, the surface of the anode 703R and the surface (including the wall surface) of the partition wall are activated to have a lyophilic property. Subsequently, a plasma process using $CF_4$ as a process gas is performed on the surface of the substrate 721 where the partition wall is formed. Accordingly, $CF_4$ reacts with only the surface of the partition wall made of an acryl-based resin, so that the surface is allowed to have a lyophobic property.

<3> Next, an inner side of the partition wall located in the area where the red light-emitting device 701R is to be formed is coated with 1.0 wt % PEDOT/PSS dispersed aqueous solution by using an ink jet method. In addition, after the coated PEDOT/PSS dispersed aqueous solution is dried, the substrate 721 is heated in the atmosphere, and an ion conductive hole injection layer 741R including PEDOT/PSS and having an average thickness of 50 nm is formed on the anode 703R.

<4> Next, an inner side of the partition wall located in the area where the red light-emitting device 701R is to be formed is coated with 1.5 wt % tetramethyl benzene solution of the compound expressed by the aforementioned general formula (16) by using an ink jet method. In addition, after the coated tetramethyl benzene solution of the compound expressed by the aforementioned general formula (16) is dried, the substrate 721 is heated in nitrogen ambience. Subsequently, the area of the substrate 721 where the red light-emitting device 701R is to be formed is rinsed with xylene. Accordingly, an intermediate layer 742R including the compound expressed by the aforementioned general formula (16) and having an average thickness of 10 nm is formed on the hole injection layer 741R.

<5> Next, an inner side of the partition wall located in the area where the red light-emitting device 701R is to be formed is coated with 1.2 wt % tetramethyl benzene solution of the compound expressed by the aforementioned general formula (17) by using an ink jet method. In addition, after the coated tetramethyl benzene solution of the compound expressed by the aforementioned general formula (17) is dried, the substrate 721 is heated in nitrogen ambience. Accordingly, a red light-emitting functional layer 705R including the compound expressed by the aforementioned general formula (17) and having an average thickness of 80 nm is formed on the intermediate layer 742R.

<6> Next, a deposited layer including Cs and having an average thickness of 1 nm formed by a vacuum deposition method using $Cs_2CO_3$ as a deposition source is formed on the red light-emitting functional layer 705R, and the deposited layer is used as a second electron injection layer 763.

<7> Next, a cathode 708 including Al and having an average thickness of 100 nm is formed on the second electron injection layer 763 by using a vacuum deposition method.

<8> Next, the resulting product is covered with a protection cover (sealing member) made of glass so as to cover the formed layers and fixed and sealed by an epoxy resin.

By the processes described hereinbefore, a bottom emission structure red light-emitting device 701R illustrated in FIG. 16 is manufactured. The red light-emitting device 701R is used for standardizing the characteristics of the red light-emitting device 301R of Example 2, the red light-emitting device 401R of Comparative Example 1, the red light-emitting device 501R of Comparative Example 2, and the red light-emitting device 601R of Comparative Example 3.

Comparative Example 24G

Figure 17:
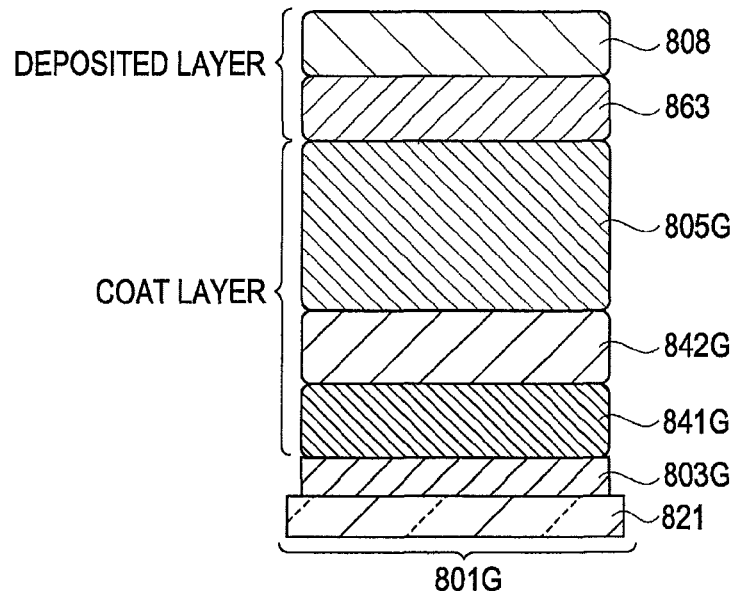
FIG. 17 is a schematic cross-sectional diagram illustrating a green light-emitting device according to Comparative Example 24G.

FIG. 17 is a schematic cross-sectional diagram illustrating the light-emitting apparatus according to Comparative Example 24G and corresponds to the green light-emitting device 301G of FIG. 12.

<1> First, a transparent glass substrate having an average thickness of 1.0 mm is prepared as a substrate 821. Next, after an ITO film having an average thickness of 50 nm is formed the substrate 821 by using a sputtering method, an ITO electrode (anode 803G) is formed by patterning the ITO film by using a photolithography method.

Next, the substrate 821 where the anode 803G is formed is immersed in acetone, and 2-propanol sequentially, and after ultrasonic rinsing is performed, an oxygen plasma process is applied.

<2> Next, after an insulating layer made of an acryl-based resin is formed by using a spin coating method on the substrate 821 where the anode 803G is formed, the insulating layer is patterned by using a photolithography method so that the ITO electrode is exposed. As a result, a partition wall (bank) is formed. In addition, a plasma process using $O_2$ gas as a process gas is performed on the surface of the substrate 821 where the partition wall is formed. By doing so, the surface of the anode 803G and the surface (including the wall surface) of the partition wall are activated to have a lyophilic property. Subsequently, a plasma process using $CF_4$ as a process gas is performed on the surface of the substrate 821 where the partition wall is formed. Accordingly, $CF_4$ reacts with only the surface of the partition wall made of an acryl-based resin, so that the surface is allowed to have a lyophobic property.

<3> Next, an inner side of the partition wall located in the area where the green light-emitting device 801G is to be formed is coated with 1.0 wt % PEDOT/PSS dispersed aqueous solution by using an ink jet method. In addition, after the coated PEDOT/PSS dispersed aqueous solution is dried, the substrate 821 is heated in the atmosphere, and ion conductive hole injection layer 841G including PEDOT/PSS and having an average thickness of 50 nm are formed on the anode 803G.

<4> Next, an inner side of the partition wall located in the area where the green light-emitting device 801G is to be formed is coated with 1.5 wt % tetramethyl benzene solution of the compound expressed by the aforementioned general formula (16) by using an ink jet method. In addition, after the coated tetramethyl benzene solution of the compound expressed by the aforementioned general formula (16) is dried, the substrate 821 is heated in nitrogen ambience. Subsequently, the area of the substrate 821 where the green light-emitting device 801G is to be formed is rinsed with xylene. Accordingly, an intermediate layer 842G including the compound expressed by the aforementioned general formula (16) and having an average thickness of 10 nm is formed on the hole injection layer 841G.

<5> Next, an inner side of the partition wall located in the area where the green light-emitting device 801G is to be formed is coated with 1.2 wt % tetramethyl benzene solution of the compound expressed by the aforementioned general formula (19) by using an ink jet method. In addition, after the coated tetramethyl benzene solution of the compound expressed by the aforementioned general formula (19) is dried, the substrate 821 is heated in nitrogen ambience. Accordingly, a green light-emitting functional layer 805G including the compound expressed by the aforementioned general formula (19) and having an average thickness of 80 nm is formed on the intermediate layer 842G.

<6> Next, a deposited layer including Cs and having an average thickness of 1 nm formed by a vacuum deposition method using $Cs_2CO_3$ as a deposition source is formed on the green light-emitting functional layer 805G and the deposited layer is used as a second electron injection layer 863.

<7> Next, a cathode 808 including Al and having an average thickness of 100 nm is formed on the second electron injection layer 863 by using a vacuum deposition method.

<8> Next, the resulting product is covered with a protection cover (sealing member) made of glass so as to cover the formed layers and fixed and sealed by an epoxy resin.

By the processes described hereinbefore, a bottom emission structure green light-emitting device 801G illustrated in FIG. 17 is manufactured. The green light-emitting device 801G is used for standardizing the characteristics of the green light-emitting device 301G of Example 2, the green light-emitting device 401G of Comparative Example 21, the green light-emitting device 501G of Comparative Example 22, and the green light-emitting device 601G of Comparative Example 23.

Comparative Example 24B

Figure 18:
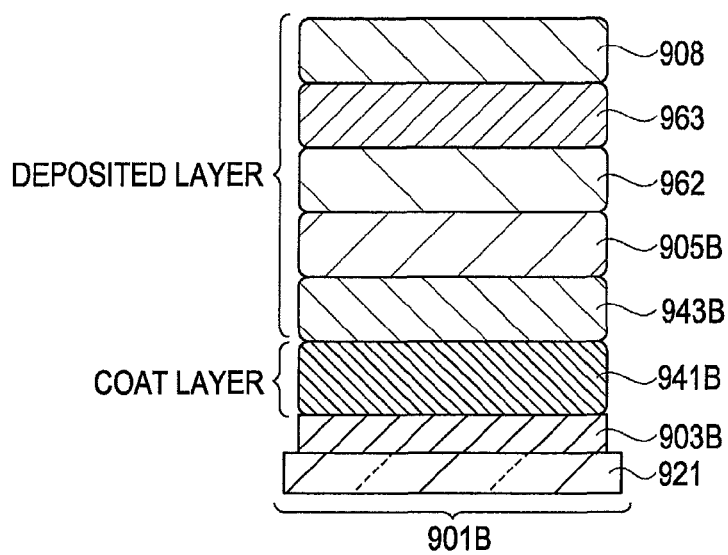
FIG. 18 is a schematic cross-sectional diagram illustrating a blue light-emitting device according to Comparative Example 24B.

FIG. 18 is a schematic cross-sectional diagram illustrating the light-emitting apparatus according to Comparative Example 24B and corresponds to the blue light-emitting device 301B of FIG. 12.

<1> First, a transparent glass substrate having an average thickness of 1.0 mm is prepared as a substrate 921. Next, after an ITO film having an average thickness of 50 nm is formed on the substrate 921 by a sputtering method, an ITO electrode (anode 903B) is formed by patterning the ITO film by using a photolithography method.

Next, the substrate 921 where the anode 903B is formed is immersed in acetone, and 2-propanol sequentially, and after ultrasonic rinsing is performed, an oxygen plasma process is applied.

<2> Next, after an insulating layer made of an acryl-based resin is formed by using a spin coating method on the substrate 921 where the anode 903B is formed, the insulating layer is patterned by using a photolithography method so that the ITO electrode is exposed. As a result, a partition wall (bank) is formed. In addition, a plasma process using $O_2$ gas as a process gas is performed on the surface of the substrate 921 where the partition wall is formed. By doing so, the surface of the anode 903B and the surface (including the wall surface) of the partition wall are activated to have a lyophilic property. Subsequently, a plasma process using $CF_4$ as a process gas is performed on the surface of the substrate 921 where the partition wall is formed. Accordingly, $CF_4$ reacts with only the surface of the partition wall made of an acryl-based resin, so that the surface is allowed to have a lyophobic property.

<3> Next, an inner side of the partition wall located in the area where the blue light-emitting device 901B is to be formed is coated with 1.0 wt % PEDOT/PSS dispersed aqueous solution by using an ink jet method. In addition, after the coated PEDOT/PSS dispersed aqueous solution is dried, the substrate 921 is heated in the atmosphere, and ion conductive hole injection layer 941B including PEDOT/PSS and having an average thickness of 50 nm are formed on the anode 903B.

<4> Next, a hole transporting layer 943B including α-NPD and having an average thickness of 10 nm is formed on the hole injection layer 941B by using a vacuum deposition method.

<5> Next, a blue light-emitting functional layer 905B including a constituent material of the blue light-emitting functional layer listed hereinafter and having an average thickness of 20 nm is formed on the hole transporting layer 943B by using a vacuum deposition method.

Herein, with respect to the constituent material of the blue light-emitting functional layer 905B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer is set to be 5.0% by weight ratio to the host material.

<6> Next, an electron transporting layer 962 including tris(8-quinolinolato) aluminum (Alq3) and having an average thickness of 20 nm is formed on the blue light-emitting functional layer 905B by using a vacuum deposition method.

<7> Next, a second electron injection layer 963 including lithium fluoride (LiF) and having an average thickness of 1 nm is formed on the electron transporting layer 962 by using a vacuum deposition method.

<8> Next, a cathode 908 including Al and having an average thickness of 100 nm is formed on the second electron injection layer 963 by using a vacuum deposition method.

<9> Next, the resulting product is covered with a protection cover (sealing member) made of glass so as to cover the formed layers and fixed and sealed by an epoxy resin.

By the processes described hereinbefore, a bottom emission structure blue light-emitting device 901B illustrated in FIG. 18 is manufactured. The blue light-emitting device 901B is used for standardizing the characteristics of the blue light-emitting device 301B of Example 2, the blue light-emitting device 401B of Comparative Example 21, the blue light-emitting device 501B of Comparative Example 22, and the blue light-emitting device 601B of Comparative Example 23.

Comparative Example 25B

Figure 19:
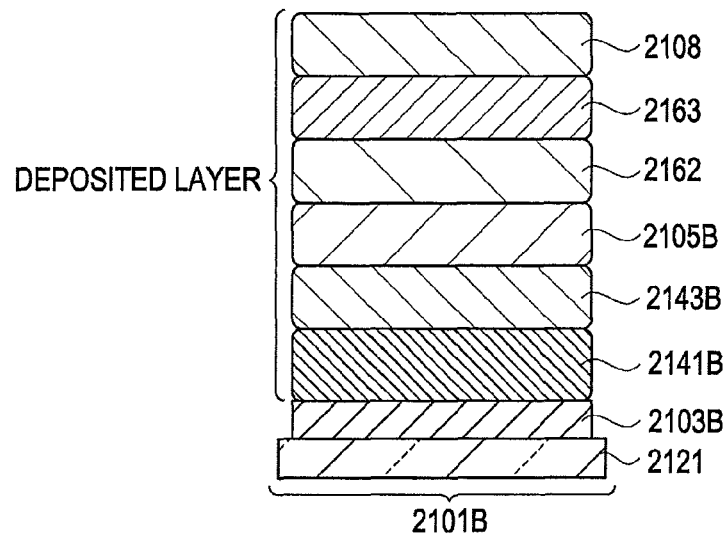
FIG. 19 is a schematic cross-sectional diagram illustrating a blue light-emitting device according to Comparative Example 25B.

FIG. 19 is a schematic cross-sectional diagram illustrating the light-emitting apparatus according to Comparative Example 25B and corresponds to the blue light-emitting device 301B of FIG. 12.

<1> First, a transparent glass substrate having an average thickness of 1.0 mm is prepared as a substrate 2121. Next, an ITO electrode (anode 2103B) having an average thickness of 50 nm is formed on the substrate 2121 by using a sputtering method.

Next, the substrate 2121 where the anode 2103B is formed is immersed in acetone, and 2-propanol sequentially, and after ultrasonic rinsing is performed, an oxygen plasma process is applied.

<2> Next, a hole injection layer 2141B including the compound expressed by the following formula (21) and having an average thickness of 50 nm is formed on the anode 2103B by using a vacuum deposition method.

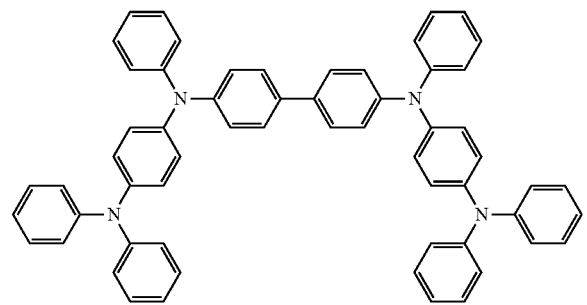

(21)

<3> Next, a hole transporting layer 2143B including α-NPD and having an average thickness of 10 nm is formed on the hole injection layer 2141B by using a vacuum deposition method.

<4> Next, a blue light-emitting functional layer 2105B including a constituent material listed hereinafter and having an average thickness of 20 nm is formed on the hole transporting layer 2143B by using a vacuum deposition method.

Herein, with respect to the constituent material of the blue light-emitting functional layer 2105B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer is set to be 5.0% by weight ratio to the host material.

<5> Next, an electron transporting layer 2162 including tris(8-quinolinolato) aluminum (Alq3) and having an average thickness of 20 nm is formed on the blue light-emitting functional layer 2105B by using a vacuum deposition method.

<6> Next, a second electron injection layer 2163 including lithium fluoride (LiF) and having an average thickness of 1 nm is formed on the electron transporting layer 2162 by using a vacuum deposition method.

<7> Next, a cathode 2108 including Al and having an average thickness of 100 nm is formed on the electron injection layer by using a vacuum deposition method.

<8> Next, the resulting product is covered with a protection cover (sealing member) made of glass so as to cover the formed layers and fixed and sealed by an epoxy resin.

By the processes described hereinbefore, a bottom emission structure blue light-emitting device 2101B illustrated in FIG. 19 is manufactured where each layer on the anode 2103B is configured as a deposited layer, an ion conductive material is not used for the hole injection layer 2141B, and the first electron injection layer is not included.

Comparative Example 26B

Figure 20:
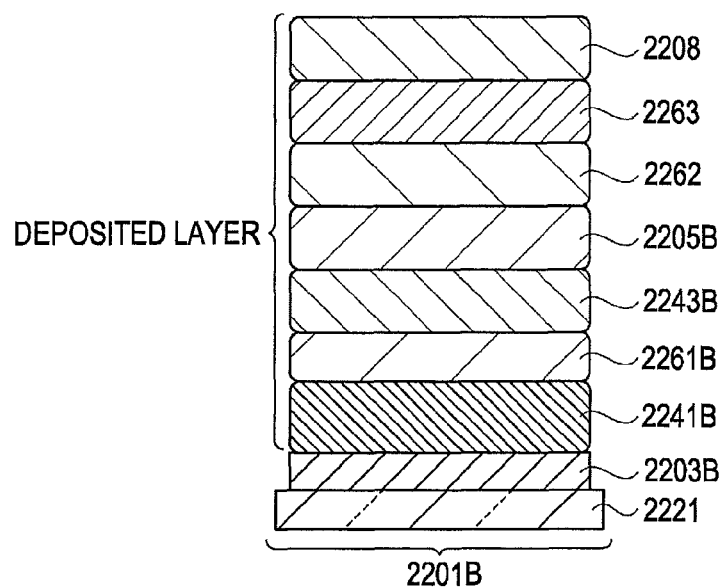
FIG. 20 is a schematic cross-sectional diagram illustrating a blue light-emitting device according to Comparative Example 26B.

FIG. 20 is a schematic cross-sectional diagram illustrating the light-emitting apparatus according to Comparative Example 26B and corresponds to the blue light-emitting device 301B of FIG. 12.

<1> First, a transparent glass substrate having an average thickness of 1.0 mm is prepared as a substrate 2221. Next, an ITO electrode (anode 2203B) having an average thickness of 50 nm is formed on the substrate 2221 by using a sputtering method.

Next, the substrate 2221 where the anode 2203B is formed is immersed in acetone, and 2-propanol sequentially, and after ultrasonic rinsing is performed, an oxygen plasma process is applied.

<2> Next, a hole injection layer 2241B including the compound expressed by the aforementioned (21) and having an average thickness of 50 nm is formed on the anode 2203B by using a vacuum deposition method.

<3> Next, a deposited layer including Cs and having an average thickness of 0.5 nm formed by a vacuum deposition method using $Cs_2CO_3$ as a deposition source is formed on the anode 2241B, and the deposited layer is used as a first electron injection layer 2261B.

<4> Next, a hole transporting layer 2243B including α-NPD and having an average thickness of 10 nm is formed on the first electron injection layer 2261B by using a vacuum deposition method.

<5> Next, a blue light-emitting functional layer 2205B including a constituent material of the blue light-emitting functional layer listed hereinafter and having an average thickness of 20 nm is formed on the hole transporting layer 2243B by using a vacuum deposition method.

Herein, with respect to the constituent material of the blue light-emitting functional layer 2205B, the compound expressed by the aforementioned formula (8) is used as a host material, and the compound expressed by the aforementioned formula (11) is used as a guest material. In addition, a containing amount (doping concentration) of the guest material (dopant) in the blue light-emitting functional layer is set to be 5.0% by weight ratio to the host material.

<6> Next, an electron transporting layer 2262 including tris(8-quinolinolato) aluminum (Alq3) and having an average thickness of 20 nm is formed on the blue light-emitting functional layer 2205B by using a vacuum deposition method.

<7> Next, a second electron injection layer 2263 including lithium fluoride (LiF) and having an average thickness of 1 nm is formed on the electron transporting layer 2262 by using a vacuum deposition method.

<8> Next, a cathode 2208 including Al and having an average thickness of 100 nm is formed on the electron injection layer by using a vacuum deposition method.

<9> Next, the resulting product is covered with a protection cover (sealing member) made of glass so as to cover the formed layers and fixed and sealed by an epoxy resin.

By the processes described hereinbefore, a blue light-emitting device illustrated in FIG. 20 is manufactured where each layer is configured as a deposited layer. More specifically, a bottom emission structure blue light-emitting device 2201B is manufactured where each layer on the anode 2203B is configured as a deposited layer, an ion conductive material is not used for the hole injection layer 2241B, and the first electron injection layer 2261B is included.

Comparative Example 27R

The description is made with reference to FIG. 16.

A bottom emission structure red light-emitting device 701R illustrated in FIG. 16 is manufactured in the same processes as those of Comparative Example 24R except that the aforementioned process <5> of Comparative Example 24R is replaced with the following process <5'>. The red light-emitting device 701R of Comparative Example 27R is used for standardizing the characteristic of the red light-emitting device 301R of Example 2.

<5'> Next, an inner side of the partition wall located in the area where the red light-emitting device 701R is to be formed is coated with 1.2 wt % tetramethyl benzene solution of the compound expressed by the aforementioned general formula (18) by using an ink jet method. In addition, after the coated tetramethyl benzene solution of the compound expressed by the aforementioned general formula (18) is dried, the substrate 721 is heated in nitrogen ambience. Accordingly, a red light-emitting functional layer 705R including the compound expressed by the aforementioned general formula (18) and having an average thickness of 80 nm is formed on the intermediate layer 742R.

Comparative Example 27G

The description is made with reference to FIG. 17.

A bottom emission structure green light-emitting device 801G illustrated in FIG. 17 is manufactured in the same processes as those of Comparative Example 24G except that the aforementioned process <5> of Comparative Example 24G is replaced with the following process <5'>. The green light-emitting device 801G of Comparative Example 27G is used for standardizing the characteristic of the green light-emitting device 301G of Example 2.

<5'> Next, an inner side of the partition wall located in the area where the green light-emitting device 801G is to be formed is coated with 1.2 wt % tetramethyl benzene solution of the compound expressed by the aforementioned general formula (20) by using an ink jet method. In addition, after the coated tetramethyl benzene solution of the compound expressed by the aforementioned general formula (20) is dried, the substrate 821 is heated in nitrogen ambience. Accordingly, a green light-emitting functional layer 805G including the compound expressed by the aforementioned general formula (20) and having an average thickness of 80 nm is formed on the intermediate layer 842G Comparative Example 27B The description is made with reference to FIG. 18.

A bottom emission structure blue light-emitting device 901B illustrated in FIG. 18 is manufactured in the same processes as those of Comparative Example 24B except that the aforementioned processes <4>, <5>, and <6> of Comparative Example 24B are replaced with the following processes <4'>, <5'>, and <6'>. The blue light-emitting device 901B of Comparative Example 27B is used for standardizing the characteristic of the blue light-emitting device 301B of Example 2.

<4'> Next, a hole transporting layer 943B including the compound expressed by the aforementioned formula (6) and having an average thickness of 10 nm is formed on the hole injection layer 941B by using a vacuum deposition method.

<5'> Next, a blue light-emitting functional layer 905B including a constituent material listed hereinafter and having an average thickness of 10 nm is formed on the hole transporting layer 943B by using a vacuum deposition method.

Herein, with respect to the constituent material of the blue light-emitting functional layer 905B, the compound expressed by the aforementioned formula (10) is used as a host material, and the compound expressed by the aforementioned formula (12) is used as a guest material. In addition, a containing amount (doping concentration) of the guest material (dopant) in the blue light-emitting functional layer is set to be 5.0% by weight ratio to the host material.

<6'> Next, an electron transporting layer 962 including the compound expressed by the aforementioned formula (14) and having an average thickness of 30 nm is formed on the blue light-emitting functional layer 905B by using a vacuum deposition method.

4. Evaluation

With respect to the display apparatus and the light-emitting device of each Example and each Comparative Example, constant current is allowed to be flowed to the light-emitting device so that luminance is 10 cd/m$^2$, and at this time, the color of light emitted from the light-emitting device is observed visually.

Herein, the reason that the value of low luminance of 10 cd/m$^2$ is selected is that, in the light-emitting device of each Example according to the invention and the light-emitting device of each Comparative Example, although a desired color of emitted light may be obtained, for example, at a high luminance side (high current density side), the color of emitted light is changed as it goes to the low luminance side (low current density side), so that the desired color of emitted light may not be obtained at the low luminance side (low current density side). On the contrary, if a desired color of emitted light may be obtained at the low luminance side (low current density side), the desired color of emitted light may also be obtained at the high luminance side (high current density side) without problems. In addition, herein, the phrase "desired color of emitted light may be obtained" denotes that red light, green light, and blue light may be obtained from the red light-emitting device, the green light-emitting device, and the blue light-emitting device, respectively.

In addition, with respect to the display apparatus and the light-emitting device of each Example and each Comparative Example, constant current is allowed to be flowed to the light-emitting device so that luminance is 1000 cd/m$^2$, and the voltage applied to the light-emitting device and the current efficiency of the light emitted from the light-emitting device are measured.

In addition, with respect to the display apparatus and the light-emitting device of each Example and each Comparative Example, constant current is allowed to be flowed to the light-emitting device so that initial luminance is 1000 cd/m$^2$, and the time (LT80) taken until the luminance becomes 80% of the initial luminance is measured.

Next, with respect to Example 2, Comparative Examples 21, 22, and 23, standardized values are obtained by using the measured values of Comparative Examples 24R, 24G, and 24B as reference values. In addition, with respect to Example 3, standardized values are obtained by using the measured values of Comparative Examples 27R, 27G, and 27B as reference values.

These results are listed in Tables 1 and 2.

TABLE 1

| Device Structure | | Example 2 | Comparative Example 21 | Comparative Example 22 | Comparative Example 23 |
|---|---|---|---|---|---|
| Color | R | Red | Pink | Red | Blue |
| (10 cd/m$^2$) | G | Green | Bluish Green | Green | Blue |
| | B | Blue | Blue | Light Blue | Blue |
| Standardized | R | 0.89 | 0.80 | 0.85 | *5 |
| Current | G | 0.89 | 0.91 | 0.78 | *6 |
| Efficiency | B | 1.00 | 0.82 | 0.05 | 1.00 |
| (1000 cd/m$^2$) | | | | | |
| Standardized | R | 1.08 | 1.25 | 1.06 | *5 |
| Voltage | G | 1.15 | 1.27 | 1.12 | *6 |
| (1000 cd/m$^2$) | B | 1.00 | 1.01 | 1.36 | 1.00 |
| Standardized | R | 0.72 | 0.13 | 0.91 | *5 |
| Life Time | G | 0.74 | 0.38 | 0.66 | *6 |
| (LT80) | B | 1.00 | 0.51 | 0.01 | 1.00 |

*1: The numerical data of Red are standardized by using values of the case of Comparative Example 24R.
*2: The numerical data of Green are standardized by using values of the case of Comparative Example 24G.
*3: The numerical data of Blue are standardized by using values of the case of Comparative Example 24B.
*4: Bold characters indicate items having insufficient characteristics.
The determination of insufficiency is based on the following criteria.
With respect to color, the case where R pixel is red, G pixel is green, and B pixel is blue.
The case where standardized current efficiency is smaller than 0.70
The case where standardized voltage is equal to or larger than 1.20.
The case where standardized life time is shorter than 0.60.
*5: Basically, since the device which is to emit red light emits blue light, the listing of numerical values is not necessary.
*6: Basically, since the device which is to emit green light emits blue light, the listing of numerical values is not necessary.

TABLE 2

| Device Structure | | Example 3 |
|---|---|---|
| Color | R | Red |
| (10 cd/m$^2$) | G | Green |
| | B | Blue |
| Standardized Current | R | 0.93 |
| Efficiency | G | 0.94 |
| (1000 cd/m$^2$) | B | 1.00 |
| Standardized Voltage | R | 1.02 |
| (1000 cd/m$^2$) | G | 1.07 |
| | B | 1.00 |
| Standardized Life | R | 0.65 |
| Time | G | 0.69 |
| (LT80) | B | 1.00 |

*1: The numerical data of Red are standardized by using values of the case of Comparative Example 27R.
*2: The numerical data of Green are standardized by using values of the case of Comparative Example 27G.
*3: The numerical data of Blue are standardized by using values of the case of Comparative Example 27B.

As is clear from Tables 1 and 2, in the light-emitting devices included in each of the display apparatuses according to the embodiments, the first electron injection layer 361 and the hole transporting layer 343 as the carrier selection layer are configured to be interposed between the red light-emitting functional layer 305R and the blue light-emitting functional layer 305B in the red light-emitting device 301R, between the green light-emitting functional layer 305G and the blue light-emitting functional layer 305B in the green light-emitting device 301G and between the hole injection layer 341B and the blue light-emitting functional layer 305B in the blue light-emitting device 301B, so that the red light-emitting functional layer 305R, the green light-emitting functional layer 305G, and the blue light-emitting functional layer 305B selectively emit light in the red light-emitting device 301R, the green light-emitting device 301G; and the blue light-emitting device 301B, respectively. As a result, in the light-emitting devices 301R, 301G, and 301B of red, green, and blue, it is possible to obtain red light, green light, and blue light emitted with high chromatic purity. In addition, in all the light-emitting devices 301R, 301G, and 301B of red, green, and blue, it is possible to obtain high standardized current efficiency of equal to or larger than 0.89 in Example 2 and high standardized current efficiency of equal to or larger than 0.93 in Example 3, so that each of the light-emitting devices has excellent light-emitting efficiency. In addition, in all the light-emitting devices 301R, 301G, and 301B of red, green, and blue, it is possible to obtain excellent standardized life time of equal to or longer than 0.72 in Example 2 and excellent standardized life time of equal to or longer than 0.65 in Example 3, so that long life time may be implemented. In addition, the standardized voltages of the light-emitting devices 301R and 301G of red and green is suppressed to be equal to or smaller than 1.15 in Example 2 and equal to or smaller than 1.07 in Example 3, so that it is possible to obtain excellent characteristics in terms of the driving voltage.

In the display apparatus according to Comparative Example 21, the insertion of the first electron injection layer 361 and the hole transporting layer 343 in Example 2 and Example 3 is omitted. Therefore, in the red light-emitting device 401R and the green light-emitting device 4016, the electrons are not smoothly injected from the blue light-emitting functional layer 405B into the red light-emitting functional layer 405R and the green light-emitting functional layer 405G, so that besides the red light and the green light, the blue light is emitted. Accordingly, in the red light-emitting device 401R and the green light-emitting device 401G, the chromatic purity of red and green greatly deteriorates. This is because, in the red light-emitting device 401R and the green light-emitting device 401G according to Comparative Example 1, the election injection-ability from the blue light-emitting functional layer 405B into the red light-emitting functional layer 405R or the green light-emitting functional layer 405G is insufficient, so that the blue light-emitting functional layer 405B as well as the red light-emitting functional layer 405R or the green light-emitting functional layer 405G simultaneously emits light.

In addition, the standardized life time (LT80) of the red light-emitting device 401R and the green light-emitting device 401G according to Comparative Example 21 shows low values of 0.13 and 0.38. It is considered that this is because, in the red light-emitting device 401R and the green light-emitting device 401G according to Comparative Example 1, the election injection-ability from the blue light-emitting functional layer 405B into the red light-emitting functional layer 405R or the green light-emitting functional layer 405G is insufficient, so that the deterioration caused by the electrons of the cathode 408 side interface of the red light-emitting functional layer 405R or the green light-emitting functional layer 405G is increased.

In addition, the standardized life time of the blue light-emitting device 401B according to Comparative Example 21 has a low value of 0.51. This is because the hole transporting layer 443B of the blue light-emitting device 401B according to Comparative Example 21 is formed by using an ink jet method. In other words, if a gas phase process such as a vacuum deposition method is used, the formation of the next blue light-emitting functional layer 405B can be consecutively performed without the cathode 408 side interface of the hole transporting layer 443B being exposed to the non-vacuum ambience. However, if a liquid phase process such an ink jet method is used, it is difficult to perform the formation of the hole transporting layer 443B in the vacuum ambience. Therefore, the formation of the hole transporting layer 443B is performed in the non-vacuum ambience (for example, atmosphere or nitrogen), so that at least the cathode 408 side interface of the hole transporting layer 443B is exposed to the non-vacuum ambience. In this manner, in the case where the hole transporting layer 443B is formed by using a liquid phase process, the cathode 408 side interface of the hole transporting layer 443B may be easily contaminated, so that the life time of the blue light-emitting device 401B is shortened. In addition, in the case where the hole transporting layer 443B is formed by using a liquid phase process, since a solution where the hole transporting material is dissolved in a solvent is used for the film formation, an infinitesimal amount of the solvent remains in the hole transporting layer 443B, so that the entire hole transporting layer 443B may be contaminated. Therefore, it is considered that the life time of the blue light-emitting device 401B is configured to be short.

In addition, the standardized voltages of the red light-emitting device 401R and the green light-emitting device 401G according to Comparative Example 21 show high values of 1.25 and 1.27. This is because, in the red light-emitting device 401R and the green light-emitting device 401G according to Comparative Example 21, the election injection-ability from the blue light-emitting functional layer 405B into the red light-emitting functional layer 405R or the green light-emitting functional layer 405G is insufficient, so that the energy barrier of the cathode 408 side interfaces of the red light-emitting functional layer 405R and the green light-emitting device 405G with respect to the electrons becomes high. Therefore, it is considered that the driving voltage is increased by 20% or more.

In addition, in the display apparatus according to Comparative Example 22, the insertion of the hole transporting layer 343 in Example 2 and Example 3 is omitted. However, in the red light-emitting device 501R and the green light-emitting device 501G, since the first electron injection layer 561 is interposed between the blue light-emitting functional layer 505B and the red light-emitting functional layer 505R and between the blue light-emitting functional layer 505B and the green light-emitting functional layer 505G, the electrons may be smoothly injected from the blue light-emitting functional layer 505B into the red light-emitting functional layer 505R and the green light-emitting functional layer 505G, so that only the red light-emitting functional layer 505R and only the green light-emitting functional layer 505G selectively emit light in the red light-emitting device 501R and the green light-emitting device 501G, respectively, so that it is possible to suppress the light emission of the blue light-emitting functional layer 505B. However, since the blue light-emitting device 501B, has a structure where the electron injection layer 561 is in contact with the blue light-emitting functional layer 505B, the electron injection layer 561 prevents the blue light-emitting functional layer 505B from emitting light, so that the standardized current efficiency and the standardized life time have extremely low values. Therefore, the result is far from the characteristics of the practical level. In addition, since the current efficiency becomes extremely low, the driving voltage is also greatly increased by 1.36.

In addition, in the display apparatus according to Comparative Example 23, the insertion of the first electron injection layer 361 in Example 2 and Example 3 is omitted.

Therefore, in the red light-emitting device 601R, the electron injection from the blue light-emitting functional layer 605B into the hole transporting layer 643 and the electron injection from the hole transporting layer 643 into the red light-emitting functional layer 605R are not smoothly performed. Accordingly, the red light-emitting functional layer 605R barely emits light, and the blue light-emitting functional layer 605B emits light strongly.

Similarly, in the green light-emitting device 601G of the display apparatus according to Comparative Example 23, the electron injection from the blue light-emitting functional layer 605B into the hole transporting layer 643 and the electron injection from the hole transporting layer 643 into the green light-emitting functional layer 605G are not smoothly performed. Accordingly, the green light-emitting functional layer 605G barely emits light, and the blue light-emitting functional layer 605B emits light strongly.

In other words, in the display apparatus according to Comparative Example 23, all of the red light-emitting device 601R, the green light-emitting device 601G, and the blue light-emitting device 601B emit blue light.

The summary of the results of Examples and Comparative Examples described hereinbefore is as follows. First, in the red light-emitting device and the green light-emitting device, a desired color of emitted light and the standardized life time of the practical level of equal to or larger than 0.60 may be obtained in Example 2, Example 3, and Comparative Example 22.

However, the current efficiency of the blue light-emitting device 501B according to Comparative Example 22 is extremely low, and the life time thereof is also extremely short, so that Comparative Example 22 may not approach the practical level as a display apparatus.

Next, in the blue light-emitting device, a desired color of emitted light and the standardized life time of the practical level of equal to or larger than 0.60 may be obtained in Example 2, Example 3, and Comparative Example 23. However, since the red light-emitting device 601R and the green light-emitting device 601G according to Comparative Example 23 emit blue light, Comparative Example 23 may not approach the practical level as a display apparatus.

As described hereinbefore, only the Examples 2 and 3 approach the practical level as a display apparatus.

In addition, the reason that a desired color may be obtained in all the red light-emitting device 301R, the green light-emitting device 301G, and the blue light-emitting device 301B according to Examples 2 and 3 of the invention is that the laminated structure of the first electron injection layer 361 and the hole transporting layer 343 function as a carrier selection layer. In addition, the reason that the standardized life time of the practical level of equal to or longer than 0.60 may be obtained in the red light-emitting device 301R and the green light-emitting device 301G according to Examples 2 and 3 of the invention is that the laminated structure of the first electron injection layer 361 and the hole transporting layer 343 function as a carrier selection layer. In addition, the reason that the standardized life time of the practical level of equal to or longer than 0.60 may be obtained in the blue light-emitting device 301B according to each Example of the invention is that the laminated structure of the first electron injection layer 361 and the hole transporting layer 343 function as a carrier selection layer and the hole transporting layer 343 and the blue light-emitting functional layer 305B are formed by using a vacuum deposition method.

As understood from the comparison between the blue light-emitting devices according to Comparative Example 21 and Comparative Example 23, in the blue light-emitting device 601B including the hole transporting layer 643 formed by using a vacuum deposition method according to Comparative Example 23, it is possible to obtain a life time which is about twice as long as that of the blue light-emitting device 401B including the hole transporting layer 443B formed by using an ink jet method according to Comparative Example 21, and the light-emitting life time of the blue light-emitting device 601B according to Comparative Example 23 approaches the practical level. In addition, it may be understood from the comparison between the blue light-emitting devices according to Example 2 and Comparative Example 23 that the light-emitting life time of the blue light-emitting device 301B according to Example 2 is equivalent to the light-emitting life time of the blue light-emitting device 601B according to Comparative Example 23, which approaches the practical level. This is because the hole transporting layer 343 and the blue light-emitting functional layer 305B according to Example 2 is formed by using a vacuum deposition method similarly to the hole transporting layer 643 and the blue light-emitting functional layer 605B according to Comparative Example 23.

Similarly, it may be understood from the comparison between the blue light-emitting devices according to Example 3 and Comparative Example 27B that the light-emitting life time of the blue light-emitting device 301B according to Example 3 is equivalent to the light-emitting life time of the blue light-emitting device 901B according to Comparative Example 27B, which approaches the practical level. This is because the hole transporting layer 343 and the blue light-emitting functional layer 305B according to Example 3 are formed by using a vacuum deposition method similarly to the hole transporting layer 943 and the blue light-emitting functional layer 905B according to Comparative Example 27B.

In addition, the standardized values of the current efficiency of the blue light-emitting device 601B according to Comparative Example 23 and the current efficiency of the blue light-emitting device 301B according to Example 2 by using the current efficiency of the blue light-emitting device 601B according to Comparative Example 23 are obtained from the measured values measured according to the aforementioned current efficiency measurement method. In addition, the standardized values of the current efficiency of the blue light-emitting device 2101B according to Comparative Example 25B and the current efficiency of the blue light-emitting device 2201B according to Comparative Example 26B by using the current efficiency of the blue light-emitting device 2101B according to Comparative Example 25B are obtained.

These results are listed in Tables 3 and 4.

TABLE 3

| Presence of First Electron Injection Layer | Absence (Comparative Example 23) | Presence (Example 2) |
|---|---|---|
| Standardized Current Efficiency (1000 cd/m²) | 1.00 | 1.01 |

*Standardization is performed by using a value of the case where the first electron injection layer is absent (Comparative Example 23).

TABLE 4

| Presence of First Electron Injection Layer | Absence (Comparative Example 25B) | Presence (Comparative Example 26B) |
|---|---|---|
| Standardized Current Efficiency (1000 cd/m²) | 1.00 | 0.09 |

*Standardization is performed by using a value of the case where the first electron injection layer is absent (Comparative Example 25B).

Herein, Table 3 shows how the presence of the first electron injection layer 361 influences the current efficiency of the blue light-emitting devices 601B and 301B in the case where the hole injection layers 641B and 341B included in the blue light-emitting devices 601B and 301B are made of an ion conductive hole injection material. On the contrary, Table 4 shows how the presence of the first electron injection layer 2261B influences the current efficiency of the blue light-emitting devices 2101B and 2201B in the case where the hole injection layers 2141B and 2241B included in the blue light-emitting devices 2101B and 2201B is not made of an ion conductive hole injection material.

As is clear from Table 3, in the case where the hole injection layers 641B and 341B are made of an ion conductive hole injection material, the current efficiency of the blue light-emitting device 301B which includes the first electron injection layer 361 and the current efficiency of the blue light-emitting device 601B which does not include the first electron injection layer 361 are not greatly changed. On the contrary, as is clear from Table 4, in the case where the hole injection layers 2141B and 2241B are not made of an ion conductive hole injection material, the current efficiency of the blue light-emitting device 2201B which includes the first electron injection layer 2261B and the current efficiency of the blue light-emitting device 2101B which does not include the first electron injection layer 2261B are greatly decreased.

In other words, even in the same laminated structure of the hole injection layer/the electron injection layer/the hole transporting layer/the blue light-emitting functional layer/the electron transporting layer, if the hole injection layer is not made of an ion conductive hole injection material, due to the presence of the first electron injection layer 2261B, the blue light emission of the blue light-emitting device 2201B is considerably prevented.

This denotes that, in the case where the hole injection layer 2241B is not made of an ion conductive hole transporting material, the electron injection material included in the first electron injection layer 2261B is diffused into the hole transporting layer 2243B or the blue light-emitting functional layer 2205B, so that the blue light emission of the blue light-emitting functional layer 2205B is prevented.

On the contrary, in the case where the hole injection layer 341B is made of an ion conductive hole transporting material, the electron injection material included in the first electron injection layer 361 is mainly diffused into the hole injection layer 341B or adsorbed to the cathode 308 side interface of the hole injection layer 341B, so that the diffusion into the hole transporting layer 343 or the blue light-emitting functional layer 305B is greatly suppressed.

In other words, in Examples 2 and 3, in order to allow the blue light-emitting device 301B, which includes the carrier selection layer configured as a laminated structure of the first electron injection layer 361 and the hole transporting layer 343, to emit light with high current efficiency (light-emitting efficiency), an ion conductive hole injection material is necessarily used for the hole injection layer 341B.

In addition, the invention is not limited to the aforementioned embodiments, various changes or modifications of the aforementioned embodiments are available. Hereinafter, modified examples are described.

Modified Example 1

The description is made with reference to FIG. 5.

In the second embodiment, the case is described where the light-emitting device according to the invention is applied to the light-emitting devices 1R, 1G, and 1B and the third layers of the light-emitting devices 1R and 1G are the red light-emitting functional layer 5R and the green light-emitting functional layer 5G, respectively, and the first layers of the light-emitting devices 1R and 1G are the blue light-emitting functional layer 5B. However, the application range of the invention is not limited to the aforementioned case, the third layers and the first layers of the light-emitting devices 1R and 1G may be the light-emitting functional layers which emit different colors of light. For example, the third layers of the light-emitting devices 1R and 1G may emit yellow light and orange light, respectively, and the first layers may emit green light. In this case, the light-emitting device 1R includes a yellow light-emitting functional layer instead of the red light-emitting functional layer 5R, and the light-emitting device 1G includes an orange light-emitting functional layer instead of the green light-emitting functional layer 5G. In addition, each of the light-emitting devices 1R and 1G includes a green light-emitting functional layer instead of the blue light-emitting functional layer 5B.

However, similarly to the second embodiment, it is preferable that the red light-emitting functional layer 5R and the green light-emitting functional layer 5G be applied to the third layers of the light-emitting devices 1R and 1G and the blue light-emitting functional layer 5B be applied to the first layer.

Modified Example 2

In the aforementioned embodiments, the description is made in a case where the display apparatus 100 is applied to a bottom emission structure display panel where light is emitted from the substrate 21 side. However, the invention is not limited thereto, and the display apparatus 100 may also be applied to a top emission structure display panel where light is emitted from the sealing substrate 20 side. Accordingly, it is possible to improve a color reproduction range of the display apparatus 100 (110).

Modified Example 3

In the aforementioned embodiments, when the light beams R, and B of the display apparatus 100 are transmitted from the substrate 21 side, the color filters (color conversion layers) corresponding to the light beams are installed. However, the invention may have a structure where color filters corresponding to subpixels of R, G, and B are installed on the surface which is in contact with the substrate 21 or in the substrate 21. Accordingly, it is possible to improve a color reproduction range of the display apparatus 100 (110).

The entire disclosure of Japanese Patent Application No. 2010-274314, filed Dec. 9, 2010 is expressly incorporated by reference herein.

What is claimed is:

1. A display panel comprising:
a first light-emitting device; and
a second light-emitting device,
the first light-emitting device comprising:
  a first anode;
  a cathode;
  a first light-emitting functional layer disposed between the first anode and the cathode, the first light-emitting functional layer having a function of emitting a first color light;
  a electron injection layer disposed between the first anode and the first light-emitting functional layer; and
  a first hole injection layer disposed between the first anode and the electron injection layer,
  wherein the electron injection layer and the first hole injection layer are directly connected to each other;
the second light-emitting device comprising:
  a second anode;
  the cathode;
  a second light-emitting functional layer disposed between the first anode and the cathode, the second light-emitting functional layer having a function of emitting a second color light;
  the electron injection layer disposed between the second anode and the second light-emitting functional layer; and
  a second hole injection layer disposed between the second anode and the electron injection layer,
  wherein the electron injection layer and the second hole injection layer are directly connected to each other.

2. The display panel according to claim 1, wherein the electron injection layer is made of an alkali metal, an alkaline earth metal, or a compound thereof.

3. An electronic apparatus comprising the display panel according to claim 2.

4. The display panel according to claim 1, further comprising a first hole transporting layer disposed between the electron injection layer and the first light-emitting functional layer.

5. An electronic apparatus comprising the display panel according to claim 4.

6. The display panel according to claim 1, further comprising a second hole transporting layer disposed between the second hole injection layer and the second light-emitting functional layer.

7. An electronic apparatus comprising the display panel according to claim 6.

8. The display panel according to claim 1, wherein the first hole injection layer has ion conductivity.

9. An electronic apparatus comprising the display panel according to claim 8.

10. The display panel according to claim 1, wherein the second hole injection layer has ion conductivity.

11. An electronic apparatus comprising the display panel according to claim 10.

12. The display panel according to claim 1, wherein the hole injection layer is formed by using a liquid phase process.

13. An electronic apparatus comprising the display panel according to claim 12.

14. An electronic apparatus comprising the display panel according to claim 1.

* * * * *